United States Patent
Sternberg et al.

(10) Patent No.: US 6,606,583 B1
(45) Date of Patent: Aug. 12, 2003

(54) REAL-TIME ERROR-SUPPRESSION METHOD AND APPARATUS THEREFOR

(76) Inventors: Ben K. Sternberg, 971 W. Giaconda Way, Tucson, AZ (US) 85704; Steven L. Dvorak, 9330 E. Vallarta Dr., Tucson, AZ (US) 85749

(*) Notice: Subject to any disclaimer, the term of this patent is extended or adjusted under 35 U.S.C. 154(b) by 0 days.

(21) Appl. No.: 09/400,220

(22) Filed: Sep. 21, 1999

Related U.S. Application Data

(60) Provisional application No. 60/101,225, filed on Sep. 21, 1998.

(51) Int. Cl.$^7$ .................... H04B 15/00; G06F 15/00; G01R 35/00
(52) U.S. Cl. .................. 702/191; 702/106; 702/109; 324/616
(58) Field of Search ................ 702/57, 64, 69–72, 702/77, 85, 90, 91, 104, 106, 107, 109, 112, 189–191, 194–197; 324/616, 628, 601, 76.11, 76.22, 76.41, 76.43

(56) References Cited

U.S. PATENT DOCUMENTS

| | | | |
|---|---|---|---|
| 3,660,620 A | 5/1972 | Schimpf | 521/459 |
| 3,818,331 A | 6/1974 | Schlosser | 324/616 |
| 3,818,332 A | 6/1974 | Schlosser | 324/616 |
| 3,920,935 A | 11/1975 | Vierling et al. | 324/616 |
| 4,394,659 A | 7/1983 | Gellekink | 342/151 |
| 4,675,880 A | 6/1987 | Davarian | 375/261 |
| 4,791,577 A * | 12/1988 | Winter | 324/76.21 |
| 5,274,577 A * | 12/1993 | Hinrichs | 702/104 |
| 5,278,777 A * | 1/1994 | Cummins | 702/195 |
| 5,313,166 A * | 5/1994 | Eul et al. | 324/601 |
| 5,402,073 A | 3/1995 | Ross | 324/559 |
| 5,521,851 A * | 5/1996 | Wei et al. | 702/195 |
| 5,548,222 A | 8/1996 | Jensen et al. | 324/628 |
| 5,576,659 A | 11/1996 | Kennington et al. | 330/52 |
| 5,578,932 A * | 11/1996 | Adamian | 324/601 |
| 5,734,268 A * | 3/1998 | Bockelman | 324/601 |
| 5,943,380 A * | 8/1999 | Marchesani et al. | 375/332 |
| 5,974,100 A | 10/1999 | Carsello et al. | 375/346 |
| 6,348,804 B1 | 2/2002 | Evers | 324/650 |

* cited by examiner

Primary Examiner—Marc S. Hoff
Assistant Examiner—Manuel L. Barbee
(74) Attorney, Agent, or Firm—Lowell W. Gresham; Meschkow & Gresham, PLC

(57) ABSTRACT

A thorough error suppression signal measurement system (20) having a transmitter (300) for propagating a transmission signal to a first probe 100, through a device under test (26), and into a second probe (200), and for propagating reference signals to the probes (100,200). The probes (100, 200) extract normalization signals from the reference signals, exchange specific ones of the normalization signals, and combine the normalization signals with data signals derived from the transmission signal to form receiver signals. The probes (100,200) propagate the receiver signals to a receiver (400), where the signals are gain-ranged, digitized, normalized, and compensated for phase-noise.

46 Claims, 11 Drawing Sheets

REAL-TIME ERROR-SUPPRESSION METHOD AND APPARATUS THEREFOR

RELATED INVENTION

The present invention claims priority under 35 U.S.C. §119(e) to: "An Accurate, Real-Time, Total-Error-Suppression Technique (ARTTEST Method) and Its Application to High-Accuracy, Network-Analyzer Calibration and Measurements," Provisional U.S. Patent Application Ser. Number 60/101,225, filed Sep. 21, 1998, which is incorporated by reference herein.

TECHNICAL FIELD OF THE INVENTION

The present invention relates to the field of signal measurement. More specifically, the present invention relates to the field of integral and simultaneous signal measurement and measurement device calibration.

BACKGROUND OF THE INVENTION

For accurate instrumentation, it is desirable to fully understand the characteristics of the devices used. With any given one of these devices, i.e., a "device-under-test" or DUT, the specific characteristics of that DUT are not fully understood. As a simplistic example, a given "47 kΩ" resistor would rarely have a value of exactly 47,000Ω. To properly understand the operation of a circuit containing such a resistor, a knowledge of the actual resistance (e.g., 46,985.42Ω) would be helpful. It should be understood that a DUT may encompass a wide range of electrical components, equipment, and systems. A typical DUT may be a filter, an amplifier, a transmitter, a receiver, or any component, group of components, circuit, module, device, system, etc.

The drift of components, filters, amplifiers, and other signal-conditioning circuitry typically limits the accuracy of electronic measurements. A measurement system may advertise a large dynamic range and very-high resolution. However, the full dynamic range and resolution may not be realizable because of errors inherent in the system. Current measurement systems have not been demonstrated to have verifiable, full-scale uncertainties of better than 0.1 percent over all types of errors.

Real-world measurement instruments tend not to be perfect. This imperfection will affect the accuracy of the resulting measurements. This accuracy is dependent upon measurement errors. Such errors may be classed as static (systematic) errors and dynamic errors.

Static errors are repeatable, time-invariant system errors. That is, static errors do not vary over time. Static errors result from the nonideal aspects of a system. These errors are repeatable as long as no changes are made to the system. Static errors include directivity errors, source-mismatch errors, load-mismatch errors, reflection and transmission tracking errors, isolation or cross-talk errors, etc.

Static errors may be reduced through the use of precision components and circuits. However, no matter how precisely a circuit is designed, there will still be some level of static error present. Since static errors are repeatable, they can be suppressed using various static error suppression techniques, such as twelve-term error modeling, known to those skilled in the art. Twelve-term error modeling, typically employed with standard network analyzers, can account for directivity errors, source-mismatch errors, load-mismatch errors, tracking errors, and isolation errors.

Before error modeling may be employed, the error coefficients of the requisite equations must be calculated by making a set of measurements on a set of known loads meeting precise standards. A sufficient number of precise standards must be used in order to determine the various error coefficients in the error model. A common static-error calibration technique is the Short, Open, Load, and Through (SOLT) technique. The SOLT calibration technique yields better than 0.1 percent accuracy for static errors. However, dynamic errors limit the actual accuracy to less than this. An alternative static-error calibration technique, also well-known to those skilled in the art, is the Through, Reflection, and Load (TRL) technique. The TRL calibration technique yields significantly better static-error accuracy than the SOLT technique at the cost of calibration complexity. There are a number of other well-known static-error calibration techniques that may be used to advantage in specific instances.

However, removing a significant amount of static error achieves little if other types of errors are not also addressed. Dynamic errors are time-varying errors. That is, dynamic errors change over time, often in an unpredictable manner. Such errors may be attributable to a number of different sources. For example, component-drift, physical-device (e.g., cables, connectors, etc.) errors, phase-noise errors, random noise, etc.

Measurement systems exhibit several types of dynamic errors. Phase-noise errors and random errors, while inherently dynamic (i.e., time-variant) are special cases independently discussed hereinafter.

Component-drift errors may be either long-term or short-term. Long-term component-drift errors, however, are typically due to aging of the components, with resultant variations in component specifications.

One type of short-term component-drift error, source drift error, is usually attributable to thermal or mechanical variations within the system, and may include both amplitude and phase fluctuations of the output wave.

Another type of short-term component-drift error, receiver drift error, is associated with a data receiver. This may be due to drift in components such as amplifiers, filters, and analog-to-digital converters. Receiver-drift error may also appear as time-varying gain and phase drift in the received signals.

Thermal variations may also lead to physical expansion of passive components within the system. At high frequencies, such expansion may lead to appreciable phase errors. In applications where the DUT is located at a considerable distance from a transmitter and/or receiver, there may be a number of time-varying errors associated with the connections between the DUT and the transmitter and receiver. These may include amplitude and phase-drift errors in the amplifiers or errors associated with the modulation and demodulation circuitry. Systems in which such errors become significant include systems utilizing propagation media other than traditional cables (e.g., the atmosphere, space, the earth, railroad tracks, power transmission lines, the oceans, etc.).

Dynamic physical errors result from physical changes in the test setup. One example of a physical error is connector repeatability. As one connects and disconnects the DUT, there will be reflection and transmission errors associated with any nonrepeatability of the connectors. The severity of the connector repeatability error is related to the type of connector, the condition of the connector, and the care with which the user makes the connection.

Another type of dynamic physical errors are cable-flexure errors. Cable-flexure errors appear as one moves the cables to connect or disconnect a DUT or perform a calibration. Time-variant phase errors associated with the relaxation of the cable can occur for a period of time after the cable has been flexed.

Phase noise (jitter) is directly related to the frequency stability of a signal source. In a perfect sinusoidal oscillator, all the energy would lie at a single frequency. Since oscillators are not perfect, however, the energy will be spread slightly in frequency. This results in a pedestal effect. This effect, referred to as phase noise, is more severe at higher frequencies. Phase noise is a performance-limiting factor in applications where a weak signal must be detected in the presence of a stronger, interfering signal.

Random or white noise is common in measurement systems. Random noise includes thermal noise, shot noise, and electromagnetic interference. Random noise may appear as random data errors. Traditional and well-known techniques of random error suppression utilize some form of oversampling to determine the correct data and suppress the random errors.

Calibration frequency is also a problem in conventional signal measurement systems. Typically, high-accuracy measurement systems employing manual calibration are calibrated periodically. The interval between calibrations may be hourly, daily, weekly, monthly, quarterly, or even yearly. This technique produces a steadily decreasing accuracy that progresses over the inter-calibration interval. Additionally, drift errors occurring during the inter-calibration interval are uncompensated. Such drift errors tend to accumulate. Therefore, measurements taken shortly before calibration may be suspect. Exactly how suspect such measurements may be depends upon the length of the inter-calibration interval and the amount of drift involved.

Many state-of-the-art measurement systems employ automatic-calibration techniques. Some automatic-calibration systems calibrate at specified intervals. Such systems suffer the same decreasing accuracy as manual-calibration systems.

Other automatic-calibration systems calibrate at the beginning and end of each measurement cycle. The use of frequent nonsimultaneous calibration procedures does increase overall accuracy, but may also greatly increase the cost of measurements and prevents measurements while the frequent calibration procedures are taking place.

All calibration procedures discussed above are nonsimultaneous. That is, the calibration procedures do not occur simultaneously with measurement. Nonsimultaneous calibration procedures are incapable of correcting or compensating for dynamic errors, such as component drift, occurring during measurement..

Current technology demands increasingly small operational errors. High accuracy is therefore a growing need of instrumentation users. Measurement systems utilizing simultaneous calibration are useful for applications requiring high-accuracy measurements. That is, systems are needed that calibrate themselves and measure data simultaneously. Such systems are said to employ dynamic error suppression. That is, such systems are able to compensate for dynamic (time-variant) errors by continuously calibrating themselves while simultaneously performing the requisite measurements.

As current technology drives operational frequencies higher and higher, phase noise (i.e., signal jitter) increases in importance. A definite need exists, therefore, for systems employing phase-noise error suppression. That is, for systems employing some means of compensating for signal jitter. This is especially important in polyphase-constellation communications systems where phase noise may cause misinterpretation of the signal phase point (i.e., the data) at any given instant.

Measurement systems for state-of-the-art technology also desirably compensate for random errors.

SUMMARY OF THE INVENTION

Accordingly, it is an advantage of the present invention that a real-time error-suppression technique is provided.

It is another advantage of the present invention that an apparatus for real-time error-suppression is provided.

It is another advantage of the present invention that a technique is provided to effect thorough error suppression, i.e., static error suppression, dynamic error suppression, phase-noise error suppression, and random error suppression.

It is another advantage of the present invention that simultaneous calibration is provided to allow dynamic error suppression.

It is another advantage of the present invention that signal normalization is provided to effect thorough error suppression.

It is another advantage of the present invention that simultaneous measurement of both data and normalization signals is provided to allow thorough error suppression.

It is another advantage of the present invention that a phase-noise reference signal is provided to effect phase noise suppression.

It is another advantage of the present invention that frequency offsetting is provided to effect discrete signal normalization.

It is another advantage of the present invention that the normalization signals are created from the data signal.

It is another advantage of the present invention that a bidirectional link is provided between input and output transmission signals to effect system calibration.

The above and other advantages of the present invention are carried out in one form by a signal measurement method incorporating real-time error suppression, which method includes combining a first signal and a second signal offset in frequency from the first signal to produce a third signal, propagating the third signal over a signal path capable of inducing errors to produce a fourth signal, separating the fourth signal into a fifth signal and a sixth signal, comparing the sixth signal against the second signal to determine a correction factor, and applying the correction factor to the fifth signal to extract a replica of the first signal therefrom.

The above and other advantages of the present invention are carried out in another form by a signal measurement system incorporating real-time error suppression, which system incorporates a signal source generating a first signal, a first mixer offsetting the first signal to produce a second signal, a second mixer offsetting the first signal to produce a third signal, a combiner combining the second and third signals to produce a fourth signal, a propagation medium propagating the fourth signal over a potentially corruptive signal path to produce an analog fifth signal, an analog-to-digital converter converting the analog fifth signal into a digital sixth signal, and a processor containing a separation routine separating the sixth signal into seventh and eighth signals, a comparison routine comparing the eighth signal against the third signal to determine a correction factor, and a correction routine applying the correction factor to the seventh signal to extract a replica of the second signal therefrom.

The above and other advantages of the present invention are carried out in another form by a signal measurement method for a device-under-test having a first port and a second port, which method incorporates coupling a first probe to the first port, coupling a second probe to the second port, producing a first signal, extracting a second signal from the first signal, propagating the second signal into the first port, deriving a third signal from the second signal within the device-under-test, propagating the third signal from the second port, deriving a fourth signal from the second signal, deriving a fifth signal from the first signal, deriving a sixth signal from the third signal, deriving a seventh signal from the first signal, reciprocally propagating the fifth and seventh signals from the first and second probes to the second and first probes, respectively, over a common signal path, combining the fourth and seventh signals to produce an eighth signal, and combining the sixth and fifth signals to produce a ninth signal.

The above and other advantages of the present invention are carried out in another form by a signal measurement system incorporating a device-under-test having a first port and a second port, a first probe coupled to the first port, a second probe coupled to the second port, a signal source generating a first signal, an input circuit extracting a second signal from the first signal and propagating the second signal into the first port, an output circuit deriving a third signal from the second signal and propagating the third signal from the second port, a first mixer producing a fourth signal from the second signal, a second mixer producing a fifth signal from the first signal, a third mixer producing a sixth signal from the third signal, a fourth mixer producing a seventh signal from the first signal, a trans-probe propagation medium reciprocally propagating the fifth and seventh signals from the first and second probes to the second and first probes, respectively, over a common signal path, a first combiner combining the fourth and seventh signals into an eighth signal, and a second combiner combining the sixth and fifth signals into a ninth signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

An approach to signal measurement described herein is referred to below as a Thorough Error Suppression (TES) technique. TES applies a combination of techniques to a variety of significant and diverse errors typically encountered in signal-measurement systems. In one preferred embodiment, the TES technique combines static error suppression (SES), dynamic error suppression (DES), phase-noise error suppression (PNS), and random error suppression (RES).

The TES technique is generally applicable to a wide variety of measurement problems and can lead to measurements of greater accuracy than are possible using conventional techniques. The TES technique can be applied in many fields in which high accuracy measurement is limited by conventional measurement technology. These fields include communications, radar, detection, monitoring, imaging, etc.

Figure 1:
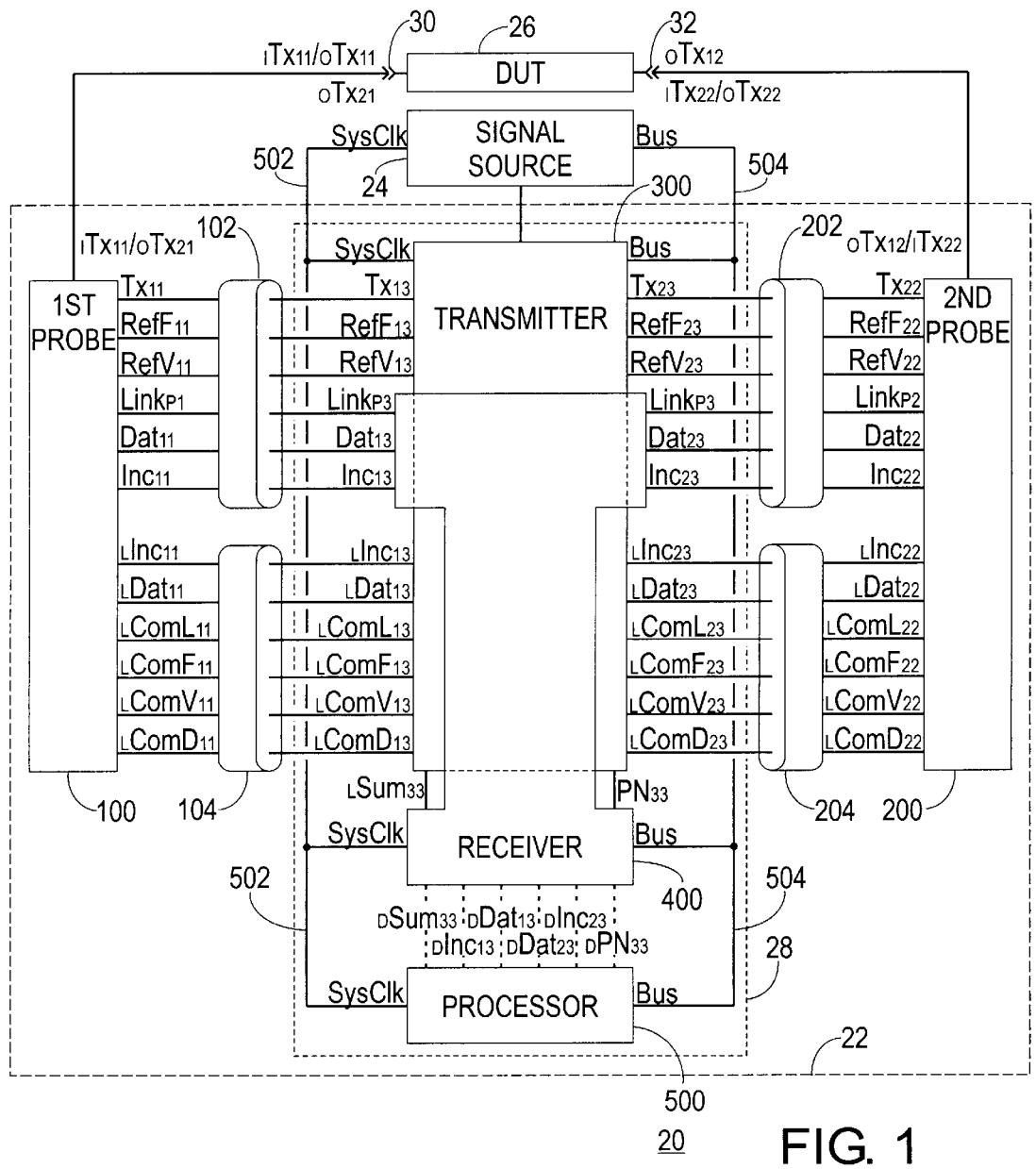
FIG. 1 shows a block diagram of a signal measurement system realized as a network analyzer in accordance with a preferred embodiment of the present invention.

FIG. 1 shows a block diagram of a signal measurement system 20 realized as a TES network analyzer 22 in accordance with one preferred embodiment of the present invention. TES network analyzer 22 has been chosen as an exemplary embodiment of signal measurement system 20 because TES network analyzer 22 incorporates a significant majority of the elements of the TES technique. Those skilled in the art will appreciate that many, apparatuses other than a network analyzer may use some or all of the techniques discussed herein. The use of TES network analyzer 22 is an exemplary application, therefore, it neither indicates an application preference nor constitutes an application restriction in the use of either signal measurement system 20 or the TES technique.

The elements of signal measurement system 20 are shown in FIG. 1. System 20 incorporates a signal source 24, network analyzer 22, and a device-under-test (DUT) 26. Network analyzer 22 itself incorporates an analysis unit 28, a first probe 100, and a second probe 200. First and second probes 100 and 200 are configured to be coupled to a first port 30 and a second port 32 of DUT 26, respectively.

Analysis unit 28 contains a transmitter 300 configured to transmit various signals to first and second probes 100 and 200, hence to DUT 26, a receiver 400 configured to receive and process signals from first and second probes 100 and 200, and a processor 500 configured to analyze those received signals. Transmitter 300 is coupled to first and second probes 100 and 200 by high-frequency propagation media 102 and 202, and by low-frequency propagation media 104 and 204, respectively. High-frequency propagation media 102 and 202 merely convey higher frequency signals than do low-frequency propagation media 104 and 204, respectively. Those skilled in the art will appreciate that nothing requires high-frequency propagation media 102 and 202 to be different from low-frequency propagation media 104 and 204. The use of similar or substantially identical propagation media does not depart from the spirit of the present invention.

This discussion assigns reference numbers to components according to the following scheme. Reference numbers below 100 are assigned to components that are not a part of network analyzer 22. Reference numbers in the 100s are assigned to components that are a part of or directly associated with first probe 100. Reference numbers in the 200s are assigned to components that are a part of or directly associated with second probe 200. Reference numbers in the 300s are assigned to components that are a part of or directly associated with transmitter 300. Reference numbers in the 400s are assigned to components that are a part of or directly associated with receiver 400. Reference numbers in the 500s are assigned to components that are a part of or directly associated with processor 500. Reference numbers in the 600s are assigned to components that are a part of or directly associated with a reciprocal amplification circuit 600 in an optional embodiment of the present invention. Reference numbers in the 700s are assigned to components that are a part of or directly associated with a circular-mixer circuit 700 in an optional embodiment of the present invention. Reference numbers in the 800s are assigned to components that are a part of or directly associated with a mix/demix circuit 800 in an optional embodiment of the present invention. Reference numbers in the 900s are assigned to components that are a part of or directly associated with an intermodulation distortion checking and removal circuit 900 in an optional embodiment of the present invention.

In the preferred embodiment, the TES technique combines static, dynamic, phase-noise, and random error suppression. In the exemplary network-analyzer application, the design goal for TES network analyzer 22 was to achieve at least a 0.1 percent (−60 dB) measurement accuracy for DUT 26 with insertion and return losses varying over a dynamic range of 60 dB (i.e., a range of up to 120 dB). The main limiting factor in the achievable accuracy for TES network analyzer 22 resides in the absolute accuracy of the standards that are employed during static calibration. If a Short, Open, Load, and Through (SOLT) calibration technique is used, this accuracy would be approximately 0.1 percent. When a more accurate static calibration technique is being employed, such as the Through, Reflection, and Load (TRL) technique, or when only relative measurements are desired, the TES technique may be applied to achieve a measurement accuracy exceeding 0.1 percent.

TES network analyzer 22 uses signal-normalization techniques to achieve both static and dynamic error suppression for all components through which both data and normalization signals pass. TES network analyzer 22 is designed so that both data and normalization signals flow through all paths, e.g., transmitter 300, receiver 400, and link paths (to be discussed), with the exception of specific paths in first and second probes 100 and 200, the path through DUT 26, and errors caused by connector repeatability. This allows signal normalization techniques to be used to suppress static and dynamic errors in system 20.

The components in the above-mentioned specific paths in first and second probes 100 and 200 can be temperature stabilized so that they do not contribute to the system drift error. Furthermore, the static errors associated with the components in probes 100 and 200 are removed via 12-term calibration (discussed hereinafter). Since only the transmission signal sees DUT 26, the desired DUT characteristics are still present after normalization.

In order to minimize the nonremovable, time-varying errors associated with connector repeatability, it is desirable to use high-quality connectors, properly maintain the connectors, and to use a consistent, correct connection technique. When high-quality connectors are used appropriately in standard network analyzer measurements, connector-repeatability errors are reduced to below the level of residual systematic errors after correction.

The use of signal normalization for static and dynamic error suppression is illustrated by the following examples. Assume that two sinusoidal signals reside at different frequencies that are closely spaced relative to the component bandwidth. In a first case, with an assumption of no drift during the time of measurement, the two signals are simultaneously passed through a linear component whose properties vary between one measurement and the next. Both of these signals will then contain the same time-dependent component transfer function. If the composite time-domain signal is sampled by an A/D converter, processed using a numerical fast Fourier transform (FFT), and the resulting frequency-domain signals are extracted from the appropriate frequency bins, then the time-dependent transfer function can be removed via signal normalization, i.e., by computing the ratio of the two complex-valued, frequency-domain signals. Note that the normalization also removes the associated static errors.

In a second, more complex case, with an assumption of drift (i.e., amplitude or phase variations that occur in the component transfer function) during the time of measurement, the signals are again passed through the linear component. Drift appears as amplitude and phase modulation of the signals. As long as the rate of drift is not too large, the resultant signal spreading will not interfere with the neighboring signals. In such cases, both signals are affected the same by the amplitude and phase modulation, so static and dynamic error suppression can once again be accomplished by signal normalization. Signal normalization is executed in software in processor 500.

Since the incident, reflected, and transmitted signals are all to be measured in order to characterize a 2-port DUT in terms of its scattering-parameter matrices (S-matrices), TES network analyzer 22 includes a number of different normalization signals. Because TES network analyzer 22 has three primary components (first probe 100, second probe 200 and analysis unit 28) with a large number of signals distributed therein, this discussion utilizes a simple schema for signal nomenclature:

$$_M XX_{IJ}$$

where XX is the primary signal descriptor, e.g.,

| | |
|---|---|
| ComF$_{11}$ | port-1 fixed-common signal; and |
| Inc$_{23}$ | port-2 composite incident signal; | where prefix subscript M is a secondary signal descriptor, e.g.,

| | |
|---|---|
| $_R$Dat$_{11}$ | port-1 reflected (raw) data signal; |
| $_O$Dat$_{11}$ | port-1 offset data signal; and |
| $_M$Dat$_{13}$ | port-1 measured data signal; and | where suffix subscript I is the signal reference and suffix subscript J is the signal location, and where the values of I and/or J may be:

1=first probe 100;
2=second probe 200;
3=analysis unit 28 or signal source 24;
P=first or second probe 100 or 200; and
J=P or analysis unit 28; e.g.,

| | |
|---|---|
| $_L$ComV$_{11}$ | port-1 variable-common local oscillator signal in first probe 100; |
| $_L$ComV$_{13}$ | port-1 variable-common local-oscillator signal in analysis unit 28; |
| Link$_{1j}$ | port-1 link signal in probe 100, probe 200, and/or analysis unit 28; and |
| Link$_{PJ}$ | port-1 or port-2 link signal in probe 100, probe 200, and/or analysis unit 28. |

Signal source 24 generates or otherwise provides source signal $_S$Tx$_{33}$. Source signal $_S$Tx$_{33}$ is then processed by transmitter 300 within analysis unit 28 to produce either a port-1 transmission signal Tx$_{13}$ or a port-2 transmission signal Tx$_{23}$. Signal Tx$_{13}$ or Tx$_{23}$ is then transmitted from transmitter 300 to first or second probe 100 or 200 through high-frequency propagation media 102 or 202, respectively, where it arrives as a transmission signal Tx$_{11}$ or Tx$_{22}$.

Assuming forward signal measurement (i.e., the signal to be measured passes from first probe 100, into first port 30, through DUT 26, out of second port 32, and into second probe 200), then first probe 100 derives a forward DUT input signal $_1$Tx$_{11}$ from port-1 transmission signal Tx$_{11}$ and injects input signal $_I$Tx$_{11}$ into first port 30 of DUT 26. Within DUT 26, input signal $_I$Tx$_{11}$ is altered in a manner responsive to a transfer function of DUT 26 to become a forward DUT transmitted output signal $_O$Tx$_{12}$. Second probe 200 then extracts and terminates signal $_O$Tx$_{12}$. Similarly, any portion of signal $_I$Tx$_{11}$ that is reflected by or through DUT 26 returns to first probe 100 as forward DUT reflected output signal $_O$Tx$_{11}$. First probe 100 extracts and terminates signal $_O$Tx$_{11}$.

Port-2 transmission signal Tx$_{2j}$, not being required, is never generated by transmitter 300. The path that would otherwise carry port-2 transmission signal Tx$_{2j}$ is terminated within transmitter 300 and second probe 200.

Those skilled in the art will appreciate that a like process for reverse signal measurement (i.e., the signal to be measured passes from second probe 200, into second port 32, through DUT 26, out of first port 30, and into first probe 100) derives a reverse DUT input signal $_I$Tx$_{22}$ from port-2 transmission signal Tx$_{22}$, injects input signal $_I$Tx$_{22}$ into second port 32, alters input signal $_I$Tx$_{22}$ in a manner responsive to a reverse transfer function of DUT 26 to become a reverse DUT output signal $_O$Tx$_{21}$, and extracts and terminates output signal $_O$TX$_{21}$. Port-1 transmission signal Tx$_{1j}$ is, in this case, never generated by transmitter 300. The path that would otherwise carry port-1 transmission signal Tx$_{1j}$ is terminated within transmitter 300 and first probe 100. Unless specifically indicated otherwise, forward signal measurement is assumed throughout this discussion.

Port-1 composite data and incident signals Dat$_{11}$ and Inc$_{11}$ are derived from forward DUT input signal $_I$Tx$_{11}$ within first probe 100, with Dat$_{11}$ being derived from $_1$Tx$_{11}$ through transmitted output $_O$Tx$_{11}$, propagated through high-frequency propagation medium 102 to become composite data and incident signals Dat$_{13}$ and Inc$_{13}$, and received by receiver 400 for processing. Similarly, a port-2 composite data signal Dat$_{22}$ is derived from forward DUT transmitted output signal $_O$Tx$_{12}$ within second probe 200, propagated through high-frequency propagation medium 202 to become a composite data signal Dat$_{23}$, and received by receiver 400 for processing.

FIGS. 2, 3, 4, and 5 show simplified schematic diagrams of transmitter 300, first probe 100, second probe 200, and receiver 400 and processor 500 of TES network analyzer 22 of FIG. 1, respectively, in accordance with a preferred embodiment of the present invention. The following discussion refers to FIGS. 1 through 5.

Port-1 composite data signal Dat$_{11}$ contains reflected output signal $_O$Tx$_{11}$, i.e., the reflected (reverse) component of forward DUT input signal $_I$Tx$_{11}$, at first port 30 of DUT 26 (i.e., in first probe 100 proximate first port 30 of DUT 26). Port-2 composite data signal Dat$_{22}$ contains the transmitted (forward) component of forward DUT transmitted output signal $_O$Tx$_{12}$ at second port 32. Similarly, port-1 composite incident signal Inc,, contains the transmitted (forward) component of forward DUT input signal $_I$Tx$_{11}$ at first port 30. Signals Dat$_{11}$, Dat$_{22}$, and Inc$_{11}$ are composite signals. That is, each signal is formed by combining at least two signals at different frequencies.

Transmitter 300 develops several signals for transmission to first and second probes 100 and 200. Signal source 24 generates source signal $_S$Tx$_{33}$ at a given frequency and phase. Those skilled in the art will appreciate that source signal $_S$Tx$_{33}$ may be one of a variety of waveforms at any frequency. However, for exemplary purposes, source signal $_S$Tx$_{33}$ is assumed to be a swept-sinusoidal signal having, at any predetermined moment in time, a predetermined frequency $f_S$ (not shown) having a predetermined phase $\Phi_s$ (not shown). Predetermined frequency $f_S$ and phase $\Phi_s$ provide references against which other frequencies and phases within signal measurement system 20 are compared.

In the exemplary embodiment, signal source 24 provides a stable, high-frequency, swept CW signal $_S$Tx$_{33}$ to transmitter 300. For millimeter-wave applications, a relatively low frequency source may be used followed by frequency multiplication in the probe to avoid the excessive cable losses that occur at high frequencies. Signal source 24 is frequency locked to a system clock 502 and its frequency and output power are controlled by processor 500 via a system data and control bus 504 (e.g., a general-purpose information bus (GPIB)). The signal source may be, for example, a synthesizer which is synchronized (locked) to a 10 MHz clock. The 10 MHz clock also controls the triggering and sampling of the analog-to-digital converters (described hereinafter). When signal source 24 and receiver 400 are synchronized in this manner, the received signal will appear at substantially the same frequency as the transmitted signal, and there will be no leakage of the received signal into adjacent frequency measurement systems. This is particularly advantageous with the TES technique of the present invention.

Those skilled in the art will appreciate that it is also possible to apply the TES technique to systems with unsynchronized source signals. In such cases, it may be necessary to window the received signals in order to reduce leakage of the received frequency in adjacent frequencies. There may also be some loss in overall system accuracy.

Predetermined frequency $f_S$ of signal source 24 is expressed as $$f_S = f_{IF} + f_{BF} + \Delta_{LO}, \quad (1)$$

where $f_{IF}$ denotes the frequency of an intermediate-frequency (IF) down-conversion source signal $_SIF_{33}$ (discussed hereinafter), $f_{BF}$ denotes the frequency of a baseband down-conversion source signal $_SBF_{33}$ (discussed hereinafter), and $\Delta_{LO}$ denotes the approximate frequency for each of the local-oscillator signals (discussed hereinafter) associated with the frequency-offset mixers in probes 100 and 200. That is, $$f_{LPathP} = \Delta_{LO} - \delta_{LPathP}. \quad (2)$$

In the above expression, $f_{LPathP}$ denotes that we are referring to the frequency of a local-oscillator signal associated with one of the frequency-offset mixers in one of the signal-flow paths in the port-P probe 100 or 200. For example, $f_{LPathP} = f_{LIncI1}$ for a local-oscillator signal $L_{Inc11}$ for the port-1 incident frequency-offset mixer (discussed hereinafter), while $f_{LPathP} = f_{LComV22}$ for local-oscillator signal $_LComV_{22}$ for the port-2 variable-common frequency-offset mixer (discussed hereinafter), etc. The parameter $\delta_{LPathP}$ denotes the difference frequency associated with one of the frequency-offset mixers. As is discussed hereinafter, the various offset signals are employed during signal normalization to remove the time-varying system errors.

Figure 2:
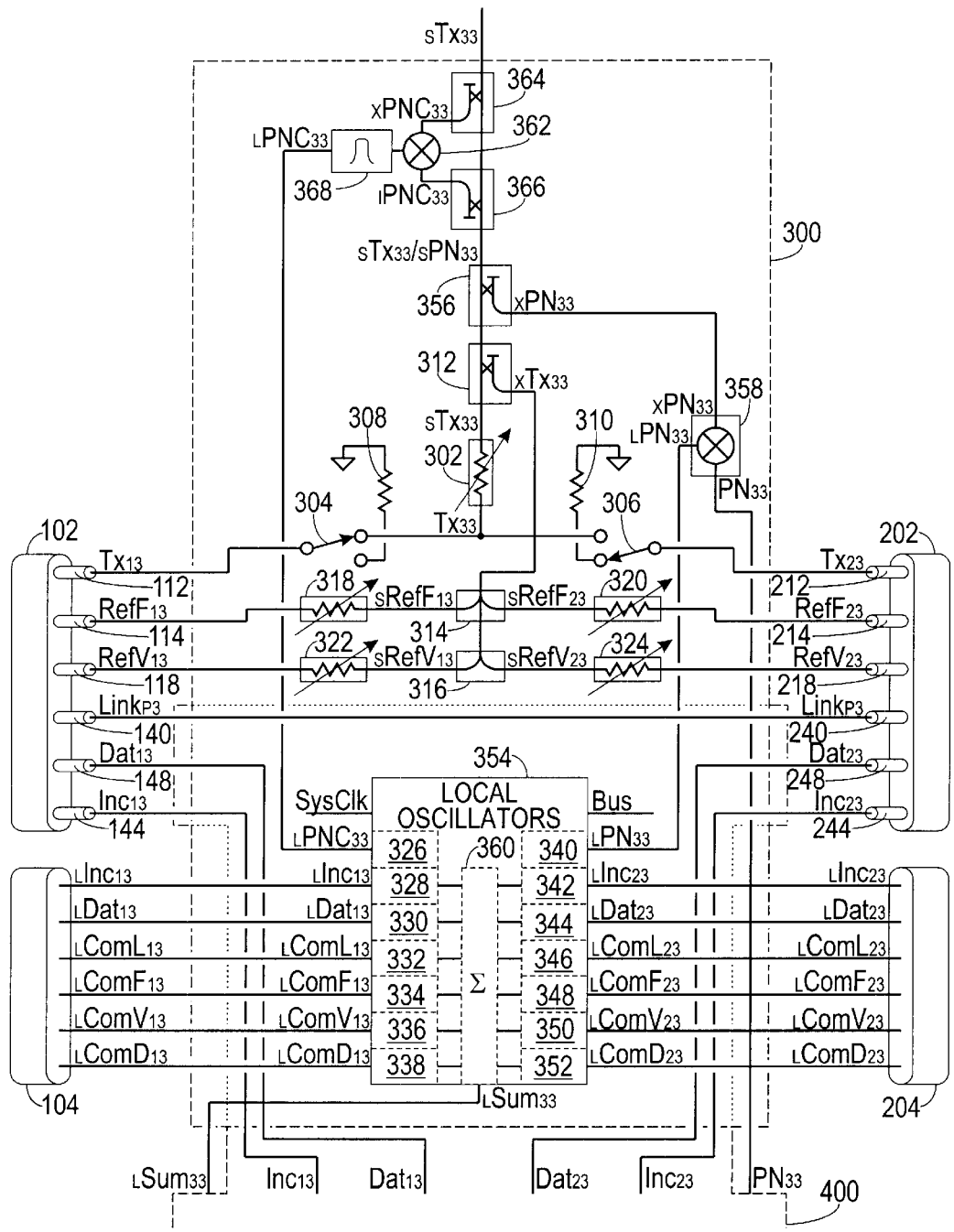
FIG. 2 shows a simplified schematic diagram of a transmitter of the network analyzer of FIG. 1 in accordance with a preferred embodiment of the present invention.
Figure 3:
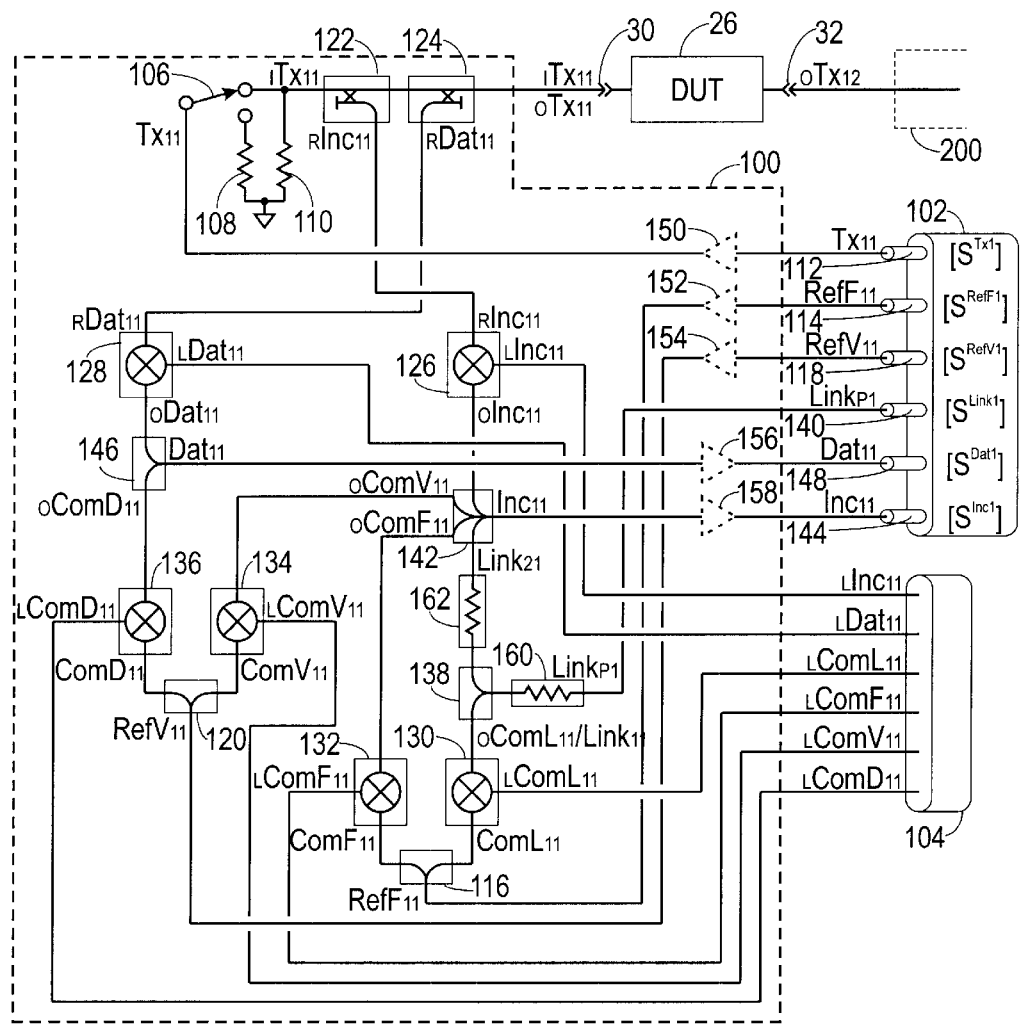
FIG. 3 shows a simplified schematic diagram of a first probe of the network analyzer of FIG. 1 in accordance with a preferred embodiment of the present invention.
Figure 4:
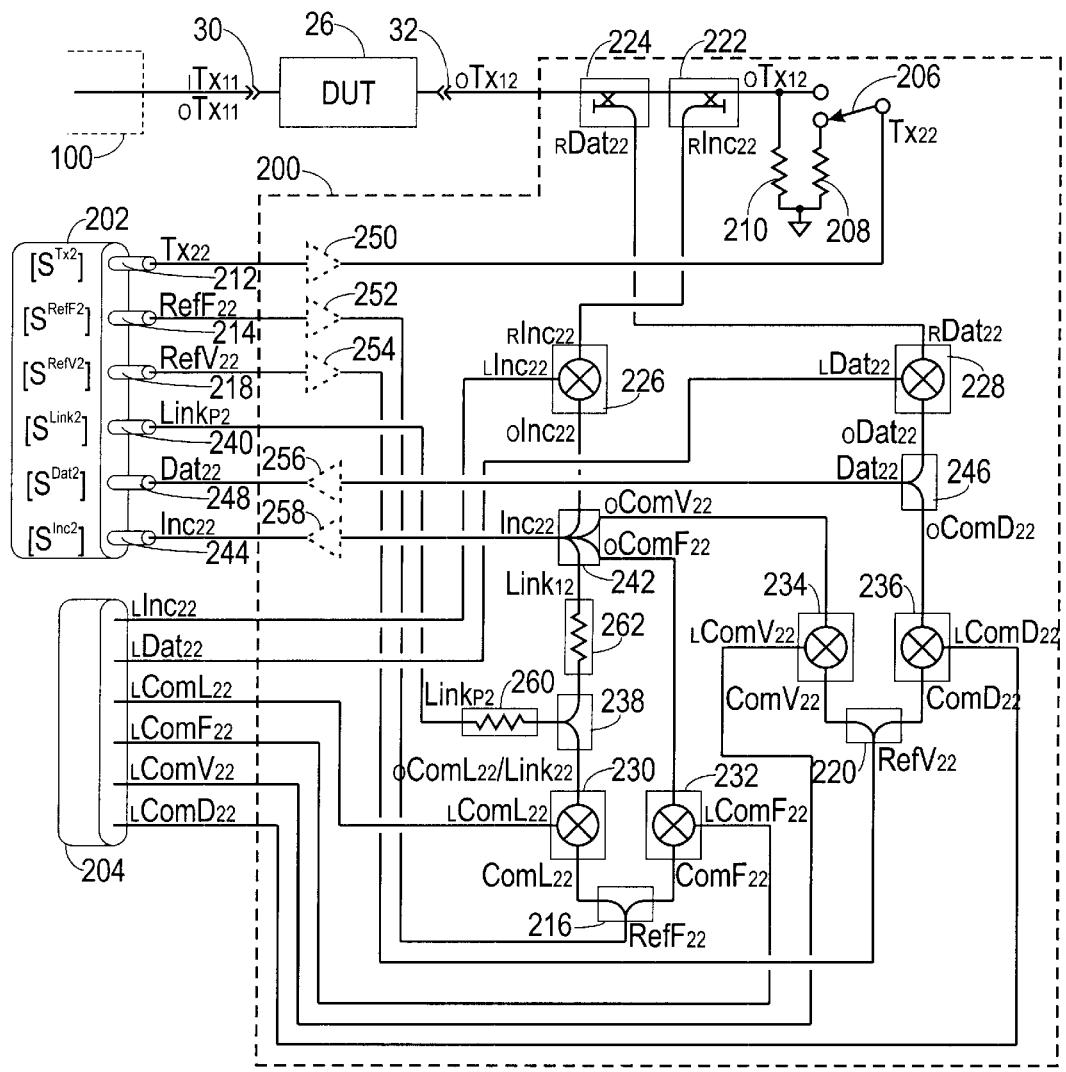
FIG. 4 shows a simplified schematic diagram of a second probe of the network analyzer of FIG. 1 in accordance with a preferred embodiment of the present invention.

Referring to FIGS. 2, 3, and 4, source signal $_STx_{33}$ is passed to transmitter 300. Source signal $_STx_{33}$ is level controlled by transmission signal attenuator 302 (FIG. 2) to produce a transmission signal $Tx_{33}$. Transmission signal $Tx_{33}$ is then passed to port-1 and port-2 transmission switches 304 and 306 (FIG. 2), respectively. Switches 304 and 306 work in conjunction with switches 106 (FIG. 3) and 206 (FIG. 4) and loads 308 and 310 (FIG. 2), 108 and 110 (FIG. 3), and 208 and 210 (FIG. 4) to determine the direction and loading of the signal through DUT 26.

For forward signal measurements, switches 304, 106, 306, and 206 are set to forward positions (the positions shown in FIGS. 2, 3, and 4). Transmission signal $Tx_{33}$ originates in transmitter 300 (FIG. 2). Transmission signal $Tx_{33}$ then passes through switch 304 to become port-1 transmission signal $Tx_{13}$. Signal $Tx_{13}$ is propagated over a port-1 transmission (Tx1) signal path 112 through high-frequency propagation medium 102 to become signal $Tx_{11}$ in first probe 100 (FIG. 3). Signal $Tx_{11}$ then passes through switch 106 to become forward DUT input signal $_ITx_{11}$. Signal $_ITx_{11}$ is propagated through DUT 26 to become forward DUT transmitted output signal $_OTx_{12}$ in second probe 200 (FIG. 4) and is reflected by or through DUT 26 to become reflected output signal $_OTx_{11}$ in first probe 100. In the exemplary embodiment, input and output signals $_ITx_{11}$ and $_OTx_{12}$ (i.e., the signal through DUT 26) are terminated by 50Ω loads 110 and 210 (since input signal $_ITx_{11}$ is extracted from signal $Tx_{11}$ propagated over a 50Ω cable effectively in parallel with 50Ω load 110, input signal $_ITx_{11}$ is loaded by 25Ω). Port-2 transmission signal $Tx_{23}$ is not generated, so switches 306 (FIG. 2) and 206 (FIG. 4) couple a port-2 transmission (Tx2) signal path 212 within high-frequency propagation medium 202 to dummy 50Ω loads 310 (FIG. 2) and 208 (FIG. 4). Those skilled in the art will appreciate that 50Ω impedances are exemplary only, and that other impedances may be used to meet the needs of specific circuits. The use of other impedances does not depart from the spirit of the present invention.

In second probe 200 (FIG. 4), 50Ω load 210 and switch 206, set to the forward position (as shown), provide a repeatable (static) load match for DUT 26, and isolate the time-varying effects of unused Tx2 signal path 212. If switch 206 were set to a reverse position (opposite the position shown), or if switch 206 and load 210 were not present, then the errors caused by a time-varying return loss in Tx2 signal path 212, carrying only a single signal, would not be removable using signal normalization techniques. For example, a portion of DUT output signal $_OTx_{12}$ may be reflected by the time-varying impedance mismatch of Tx2 signal path 212. Part of this reflected signal may pass back through couplers 222 and 224 and DUT 26, where it may then be detected by a data coupler 124 (FIG. 3). Any time-varying cable return loss might thereby cause an error in the measured return loss of DUT 26. Such errors would be most severe when measuring low-return-loss DUTs.

Those skilled in the art will appreciate that other techniques may be used to remove these effects, including but not limited to the use of isolators, amplifiers, pads, etc. The use of other techniques does not depart from the spirit and intent of the present invention.

In first probe 100 (FIG. 3), switch 106 is set to the forward position (as shown) so that signal $Tx_{11}$ (i.e., signal $_ITx_{11}$) may reach DUT 26. In the exemplary embodiment, Tx1 signal path 112 has an impedance of 50 Ω. Since 50Ω load 110 is in parallel with Tx1 signal path 112, the net impedance is 25Ω. Switch 106 and 50Ω load 10 therefore contribute an insertion loss of 3.5 dB. It is possible to avoid this insertion loss if a wideband transformer is used to match the 50Ω impedance of Tx1 signal path 112.

Those skilled in the art will appreciate that switches 106 and 206 and loads 108, 110, 208, and 210 may be removed from Tx1 and Tx2 signal paths 112 and 212 if the time-varying load match is treated as an unknown parameter in the signal flow graph. The use of this and/or other techniques does not depart from the spirit of the present invention.

For reverse signal measurements, switches 304, 106, 306, and 206 are set to the reverse positions (opposite the positions shown in FIGS. 2, 3, and 4). Transmission signal $Tx_{33}$ (FIG. 2) passes through switch 306 to become port-2 transmission signal $Tx_{23}$. Signal $Tx_{23}$ is propagated over Tx2 signal path 212 through high-frequency propagation medium 202 to become signal $Tx_{22}$ in second probe 200 (FIG. 4). Signal $Tx_{22}$ then passes through switch 206 to become a reverse DUT input signal $_ITx_{22}$ (not shown). Signal $_ITx_{22}$ is propagated through DUT 26 in the reverse direction (i.e., from second port 32 to first port 30) to become a reverse DUT output signal $_OTx_{21}$ (not shown) in first probe 100 (FIG. 3). Reverse input and output signals $_ITx_{22}$ and $_OTx_{21}$ (i.e., the reverse signal through DUT 26) are terminated by 500 loads 210 and 110. Port-1 transmission signal $Tx_{13}$ is not generated, so switches 304 (FIG.. 2) and 106 (FIG. 3) couple Tx1 signal path 112 within high-frequency propagation medium 102 to dummy 50Ω loads 308 (FIG. 2) and 108 (FIG. 3). Again, unless specifically stated otherwise, forward signal measurement is presumed throughout this discussion.

Those skilled in the art will appreciate that the above transmission-signal scenarios are but a few of many techniques by which the measurement signal may be generated and propagated, and the use of other techniques does not depart from the spirit of the present invention.

In addition to transmission signals $Tx_{13}$ or $Tx_{23}$, transmitter 300 (FIG. 2) produces fixed-reference and variable-reference signals. A directional coupler 312 extracts an extracted source signal $_xTx_{33}$ from source signal $_sTx_{33}$. A first splitter 314 splits extracted source signal $_xTx_{33}$ into port-1 and port-2 fixed-reference source signals $_sRefF_{13}$ and $_sRefr_{23}$, and a second splitter 316 splits extracted source signal $_xTx_{33}$ into port-1 and port-2 variable-reference source signals $_sRef_{13}$ and $_sRefV_{23}$, respectively. Reference source signals $_sRefF_{13}$, $_sRefF_{23}$, $_sRefV_{13}$, and $_sRefV_{23}$ are level controlled by variable attenuators 318, 320, 322, and 324, respectively, to become reference signals $RefF_{13}$, $RefF_{23}$, $RefV_{13}$, and $RefV_{23}$.

From transmitter 300 (FIG. 2), port-1 fixed-reference signal $RefF_{13}$ and variable-reference signal $RefV_{13}$ are propagated over fixed-reference (RefF1) and variable-reference (RefV1) signal paths 114 and 118 through high-frequency propagation medium 102 to become signals $RefF_{11}$ and $RefV_{11}$, respectively, in first probe 100 (FIG. 3). Then, a splitter 116 splits fixed-reference signal $RefF_{11}$ into link-common and fixed-common signals $ComL_{11}$ and $ComF_{11}$, and another splitter 120 splits variable-reference signal $RefV_{11}$ into variable-common and data-common signals $ComV_{11}$ and $ComD_{11}$. Similarly, from transmitter 300 (FIG. 2), port-2 fixed-reference signal $RefF_{23}$ and variable-reference signal $RefV_{23}$ are propagated over fixed-reference (RefF2) and variable-reference (RefV2) signal paths 214 and 218 through high-frequency propagation medium 202 to become signals $RefF_{22}$ and $RefV_{22}$, respectively, in second probe 200 (FIG. 4). Then, a splitter 216 splits fixed-reference signal $RefF_{22}$ into link-common and fixed-common signals $ComL_{22}$ and $ComF_{22}$, and another splitter 220 splits variable-reference signal $RefV_{22}$ into variable-common and data-common signals $COMV_{22}$ and $ComD_{22}$. Common signals $ComL_{11}$, $ComF_{11}$, $ComV_{11}$, and $ComD_{11}$ (FIG. 3), and $ComL_{22}$, $ComF_{22}$, $ComV_{22}$, and $ComD_{22}$ (FIG. 4) are signal-normalization signals.

For forward signal measurement, directional couplers 122 and 124 (FIG. 3) extract a raw incident signal $_RInc_{11}$ and a reflected data signal $_RDat_{11}$ from forward DUT input signal $_ITx_{11}$ and reflected output signal $_oTx_{11}$, respectively. Similarly, directional coupler 224 (FIG. 4) extracts a raw transmitted data signal $_RDat_{22}$ from forward DUT output signal $_oTX_{12}$. Directional coupler 222 (FIG. 4) and raw incident signal $_RInc_{22}$ are not used in forward signal measurements.

In order to avoid potential cross-talk between the various signals and improve the isolation between the various signal-flow paths, mixing circuits (i.e., padded and filtered mixers) 126, 128, 130, 132, 134, and 136 (FIG. 3), and 228, 230, 232, 234, and 236 (FIG. 4) mix signals $_RInc_{11}$, $_RDat_{11}$, $ComL_{11}$, $ComF_{11}$, $ComV_{11}$, and $ComD_{11}$ (FIG. 3), and $_RDat_{22}$, $ComL_{22}$, $ComF_{22}$, $ComV_{22}$, and $ComD_{22}$ (FIG. 4) at substantially predetermined frequency $f_S$ (not shown) with stable, low-frequency signals $_LInc_{11}$, $_LDat_{11}$, $_LComL_{11}$, $_LComF_{11}$, $_LComV_{11}$, and $_LComD_{11}$ (FIG. 3), and $_LDat_{22}$, $_LComL_{22}$, $_LComF_{22}$, $_LComV_{22}$, and $_LComD_{22}$ (FIG. 4) to produce offset signals $_oinc_{11}$, $_oDat_{11}$, $_oCom_{11}$ ($Link_{11}$), $_oComF_{11}$, $_oComV_1$, and $_oComD_{11}$ (FIG. 3), and $_oDat_{22}$, $_oComL_{22}$ ($Link_{22}$), $_oComF_{22}$, $_oComV_{22}$, and $_oComD_{22}$ (FIG. 4), respectively, offset in frequency from predetermined frequency $f_S$. That is, each of the mixing circuits produce an output signal whose constituent frequencies are substantially a sum and a difference of predetermined frequency $f_S$ and the frequency of the particular low-frequency signal coupled to that mixing circuit. Filtration (discussed hereinafter) is used to select either the frequency-sum signal or the frequency-difference signal. In exemplary TES network analyzer 22, the frequency-difference signal is selected and the frequency-sum signal is attenuated. For example, the frequency of signal $_oInc_{11}$ is the difference of the frequency of signal $_RInc_{11}$ (substantially predetermined frequency $f_S$) less the frequency of local-oscillator signal $_LInc_{11}$.

Referring to FIG. 2, signals $_LPNC_{33}$ (discussed hereinafter), $_Lnc_{13}$, $_LDat_{13}$, $_LComL_{13}$, $_LCOMF_{13}$, $_LComV_{13}$, $_LComD_{13}$, $_LPN_{33}$ (discussed hereinafter), $_LInc_{23}$, $_LDat_{23}$, $_LComL_{23}$, $_LComF_{23}$, $_LComV_{23}$, and $_LComD_{23}$ are fixed, stable, low-frequency (e.g., approximately 100 kHz) signals from outputs 326, 328, 330, 332, 334, 336, 338, 340, 342, 344, 346, 348, 350, and 352 of a local-oscillator module 354. The frequency of each of the signals from local-oscillator module 354 is different (discussed in greater detail hereinafter) so that the frequencies of the resultant offset signals will be offset from predetermined frequency $f_S$ by different amounts. Local-oscillator signals $_LInc_{13}$, $_LDat_{13}$, $_LComL_{13}$, $_LComF_{13}$, $_LComV_{13}$, and $_LComD_{13}$ (FIG. 2) are then propagated though low-frequency propagation medium 104 to first probe 100 (FIG. 3) to become signals $_LInc_{11}$, $_LDat_{11}$, $_LComL_{11}$, $_LComF_{11}$, $_LComV_{11}$, and $_LComD_{11}$ respectively. Similarly, local-oscillator signals $_LInc_{23}$, $_LDat_{23}$, $_LComL_{23}$, $_LComF_{23}$, $_LComV_{23}$, and $_LComD_{23}$ are propagated though low-frequency propagation medium 204 to second probe 200 (FIG. 4) to become signals $_LInc_{22}$, $_LDat_{22}$, $_LComL_{22}$, $_LComF_{22}$, $_LComV_{22}$, and $_LComD_{22}$, respectively.

The outputs of local-oscillator module 354 are also summed and monitored (discussed in greater detail hereinafter). Therefore, any phase drift associated with the outputs of local-oscillator module 354 is removed from the measurements. Thus, since transmission signals $Tx_{i11}$, $RefF_{11}$, $RefV1_{11}$, $TX_{22}$, $RefF_{22}$, and $RefV_{22}$ are derived from source signal $_sTx_{33}$, and reception signals $_oInc_{11}$, $_oDat_{11}$, $_oComL_{11}$, $_oComF_{11}$, $_oComV_{11}$, and $_oComD_{11}$, $_oDat_{22}$, $_oComL_{22}$, $_oComF_{22}$, $_oComV_{22}$, and $_oComD_{22}$ are derived from the transmission signals, and since drift in source signal $_sTx_{33}$ will be normalized out, the TES technique has no need of a precision, absolute-calibration source involving great expense and circuit complexity to minimize drift, but that may nevertheless still drift over time.

Figure 5:
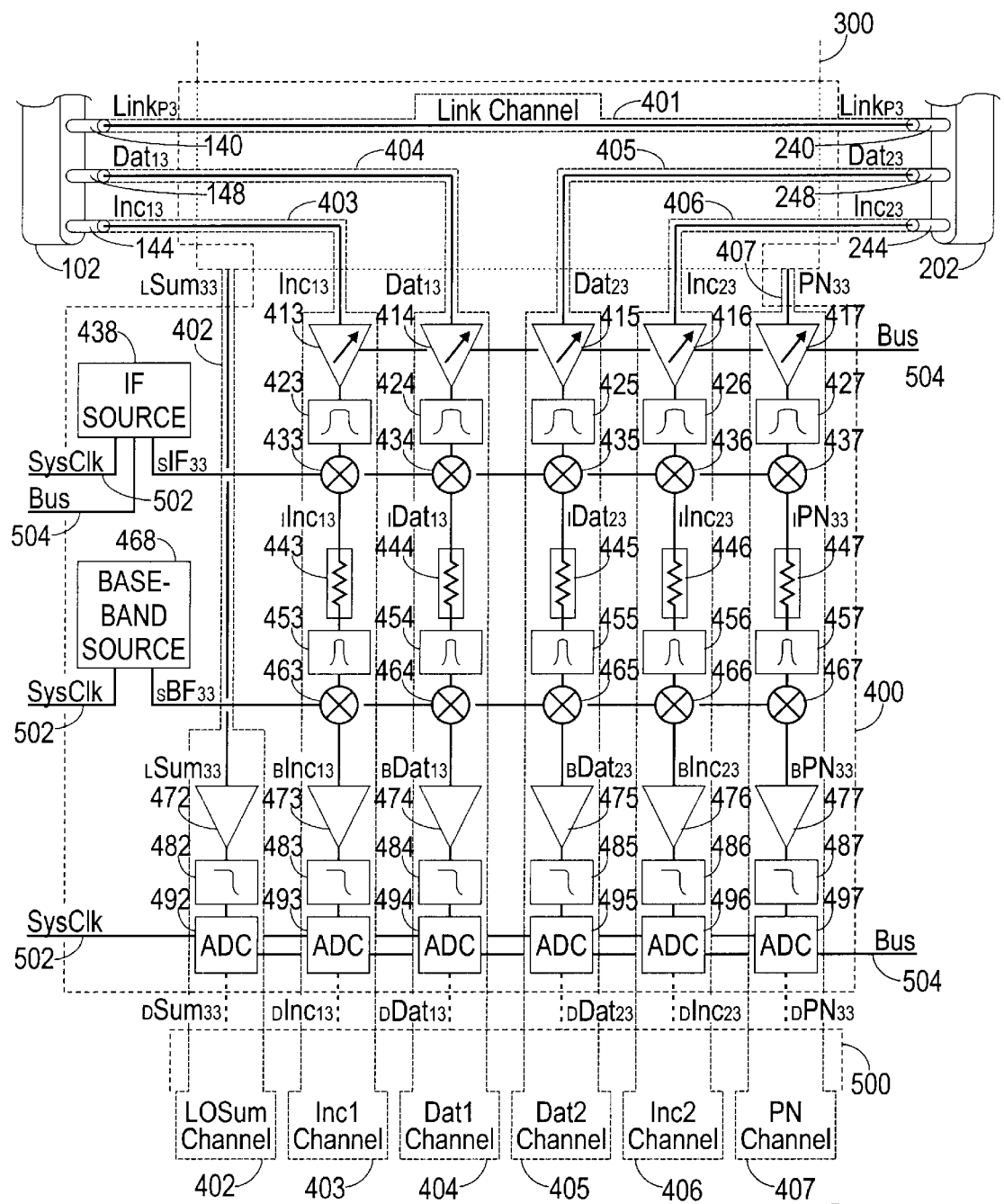
FIG. 5 shows a simplified schematic diagram of a receiver of the network analyzer of FIG. 1 in accordance with a preferred embodiment of the present invention.

Port-1 offset link-common signal $_oComL_{11}$ within first probe 100 (FIG. 2) is also port-1 link signal $Link_{11}$. Link signal $Link_{11}$ is combined into a composite link signal $Link_{P1}$ (where P=1,2) by a combiner/splitter 138. Composite link signal $Link_{P1}$ is propagated over a port-1 link (Link1) signal path 140 within high-frequency propagation medium 102 to become composite link signal $Link_{P3}$ within receiver 400 (FIG. 5). Composite link signal $Link_{P3}$ is propagated over a port-2 link (Link2) signal path 240 within high-frequency propagation medium 202 to become a composite link signal $Link_{P2}$ within second probe 200 (FIG. 4). A port-1 link signal $Link_{12}$ is then split from composite link signal $Link_{P2}$ by a combiner/splitter 238. Similarly, port-2 offset link-common signal $_oComL_{22}$ within second probe 200 (FIG. 4) is also port-2 link signal $Link_{22}$. Link signal $Link_{22}$ is combined into composite link signal $Link_{P2}$ by combiner/splitter 238. Composite link signal $Link_{P2}$ is propagated over Link2 signal path 240 to become composite link signal $Link_{P3}$ within receiver 400 (FIG. 5). Composite link signal $Link_{P3}$ is propagated over Link1 signal path 140 to become composite link signal $Link_{P1}$ within first probe 100 (FIG. 3). A port-2 link signal $Link_{2I}$ is then split from composite link signal $Link_{P1}$ by combiner/splitter 138. Thus, port-1 link signal $Link_{12}$ is present in second probe 200 and port-2 link signal $Link_{21}$ is present in first probe 100.

Within first probe 100 (FIG. 3), a combiner 142 combines offset incident signal $_OInc_{11}$, offset variable-common signal $_OComV_{11}$, offset fixed-common signal $_OComF_{11}$, and port-2 link signal $Link_{21}$ (originally port-2 offset link-common signal $_OComL_{22}$) to produce composite incident signal $Inc_{11}$. Composite incident signal $Inc_{11}$ is propagated over a port-1 incident (Inc1) signal path 144 within high-frequency propagation medium 102 to become composite incident signal $InC_{13}$ in receiver 400 (FIG. 5) Additionally, a combiner 146 combines offset data signal $_ODat_{11}$ and offset data-common signal $_OComD_{11}$ to produce composite data signal $Dat_{11}$. Composite data signal $Dat_{11}$ is propagated over a port-1 data (Dat1) signal path 148 within high-frequency propagation medium 102 to become composite data signal $Dat_{13}$ in receiver 400.

Similarly, within second probe 200 (FIG. 4), a combiner 242 combines offset variable-common signal $_OComV_{22}$, offset fixed-common signal $_OComF_{22}$, and port-1 link signal $Link_{12}$ (originally port-1 offset link-common signal $_OComL_{11}$) to produce a composite incident signal $InC_{22}$. (Offset incident signal $_OInc_{22}$ is not generated for forward signal measurements, and therefore not included in composite incident signal $Inc_{22}$.) Composite incident signal $Inc_{22}$ is propagated over a port-2 incident (Inc2) signal path 244 within high-frequency propagation medium 202 to become incident signal $Inc_{23}$ in receiver 400 (FIG. 5). Additionally, a combiner 246 combines offset data signal $_ODat_{22}$ and offset data-common signal $_OComD_{22}$ to produce composite data signal $Dat_{22}$. Composite data signal $Dat_{22}$ is propagated over a port-2 data (Dat2) signal path 248 within high-frequency propagation medium 202 to become composite data signal $Dat_{23}$ in receiver 400. Receiver 400 therefore receives composite signals $Inc_{13}$, $Dat_{13}$, $Dat_{23}$, and $Inc_{23}$ (signal $Link_{P3}$ is a special case discussed herein)

Those skilled in the art will appreciate that the combination and propagation techniques described hereinbefore for composite signals $Link_{P3}$, $Inc_{13}$, $Dat_{13}$, $Dat_{23}$, and $Inc_{23}$ are but some of the possible techniques, and that the use of other techniques does not depart from the spirit of the present invention. For example, multiple transmitter signals at distinct frequencies can be used to simultaneously measure the forward and reverse characteristics of DUT 26, thereby reducing the measurement time. In addition, a data path with minimal padding may be measured simultaneously with a data path with large padding for increased dynamic range.

In addition to the signal normalization discussed hereinbefore, the 12-term error model, well-known to those skilled in the art, is used for static error suppression of first and second probes 100 and 200. After an initial calibration procedure utilizing the SOLT or other technique, the 12-term error model for probes 100 and 200 are computed. Once the 12-term error model has been computed, processor 500 may remove static systematic errors of probes 100 and 200 from future measurements. The combination of signal normalization and 12-term error modeling successfully suppresses repeatable errors from signal measurement system 20.

Whenever multiple signals reside on a single channel, phase noise can limit the overall accuracy with which measurements may be made. The effects of phase noise are most severe at higher frequencies, or whenever small signals must simultaneously be measured in the presence of very large signals. TES network analyzer 22 provides phase-noise error suppression in two ways. First, the levels of the signals within each of composite signals $Inc_{13}$, $Dat_{13}$, $Dat_{23}$, and $Inc_{23}$ within receiver 400 (FIG. 5) are maintained within ±15 dB of one another. This is accomplished by including both fixed-reference signals $RefF_{1f}$ and $RefF_{2f}$ and variable-reference signals $RefV_{1f}$ and $RefV_{2f}$ into the design. In essence, as the level of composite data signals $Dat_{13}$ and $Dat_{23}$ change because of changes in the characteristics of DUT 26, a combination of gain ranging and variable common signal level adjustment is used to maintain the signal levels within the maximum ±15 dB range. This allows a measurement accuracy of 0.1 percent to be maintained for variation in DUT 26 over a 60 dB range, provided that the phase noise at the next-used frequency bin within processor 500 is less than −75 dBc (decibels relative to carrier).

Those skilled in the art will appreciate that the maintenance of the signals within each of composite signals $Inc_{13}$, $Dat_{13}$, $Dat_{23}$, and $Inc_{23}$ within ±15 dB is to some degree arbitrary. For example, TES network analyzer 22 could be designed to maintain the signals within each of composite signals $Inc_{13}$, $Dat_{13}$, $Dat_{23}$, and $InC_{23}$ within ±20 dB of each other. While this would allow a measurement accuracy of 0.1 percent to be maintained for variations of DUT 26 over an 80 dB dynamic range, it would also lower the maximum phase noise requirement to −80 dBc. The use of other signal levels does not depart from the spirit of the present invention.

Referring to FIG. 5, receiver 400 passes signals received from first probe 100 (FIG. 3), second probe 200 (FIG. 4), and transmitter 300 (FIG. 2) through one unique and several substantially identical channels. These channels are Link channel 401 (the unique channel, discussed hereinafter), LOSum channel 402 (discussed hereinafter), Inc1 channel 403 and Dat1 channel 404 to process port-1 composite incident and data signals $Inc_{13}$ and $Dat_{13}$, respectively, Dat2 channel 405 and Inc2 channel 406 to process port-2 composite data and incident signals $Dat_{23}$ and $Inc_{23}$, respectively, and PN channel 407 (discussed hereinafter).

Gain ranging for channels 403, 404, 405, and 406 is effected through the use of variable-gain amplifiers 413, 414, 415, and 416 for composite signals $Inc_{13}$, $Dat_{13}$, $Dat_{23}$, and $Inc_{23}$, respectively. The TES technique is suited for gain ranging because a precise knowledge of the gain of each amplifier 413, 414, 415, and 416 is unnecessary since the amplifier's time-varying transfer function is removed via signal normalization within processor 500. Thus, the benefits of improved signal-to-noise ratios are provided by gain ranging, without the necessity of having to use precision components.

Whereas the first phase-noise error suppression technique discussed hereinbefore focuses on reducing the effects of phase noise by maintaining approximately equal levels among the signals within each of composite signals $Inc_{13}$, $Dat_{13}$, $Dat_{23}$, and $Inc_{23}$, the second phase-noise error suppression technique involves actually subtracting phase noise contamination from the measured signals. This technique is desirable at high frequencies where source signal $_STx_{33}$ (FIG. 2) does not meet the exemplary −75 dBc phase noise specification, or in applications where a better measurement accuracy or larger measurement dynamic range is desired.

The phase-noise-subtraction technique is based on the fact that the signals within each of composite signals $Inc_{13}$, $Dat_{13}$, $Dat_{23}$, and $Inc_{23}$ are derived from a common source signal $_sTx_{33}$ (FIG. 2), thus exhibiting the same relative phase-noise spectra, and are all processed by receiver 400 substantially simultaneously in substantially identical channels 403, 404, 405, and 406, respectively. The technique requires that local-oscillator signals $_LInc_{11}$, $_LDat_{11}$, $_LComL_{11}$, $_LComF_{11}$, $_LComV_{11}$, and $_LComD_{11}$ (FIG. 3), and $_LInc_{22}$, $_LDat_{22}$, $_LComL_{22}$, $_LComF_{22}$, $_LComV_{22}$, and $_LComD_{22}$ (FIG. 4) contribute negligible phase noise and that the difference in time delay along each signal path is small relative to the measurement time.

A separate receiver channel, PN channel 407, is used to determine the phase-noise spectrum of source signal $_sTx_{33}$ (FIG. 2). Processor 500 then subtracts the phase-noise spectrum of source signal $_sTx_{33}$ from the phase-noise spectra of the signals within each of composite signals $Inc_{13}$, $Dat_{13}$, $Dat_{23}$, and $Inc_{22}$ in channels 403, 404, 405, and 406, respectively. A separate static calibration procedure (discussed hereinafter) is used to remove the frequency-dependent behavior from each of channels 403-407.

Within transmitter 300 (FIG. 2), a directional coupler 356 extracts an extracted source signal $_xPN_{33}$ from source signal $_sTx_{33}$. A mixer 358 mixes signal $_xPN_{33}$ with a stable, low-frequency signal $_LPN_{33}$ from an output 340 of local-oscillator module 354 to produce a phase-noise reference signal $PN_{33}$. Transmitter 300 then passes signal $PN_{33}$ to receiver 400, where it is processed in PN channel 407. PN channel 407 is substantially identical to channels 403, 404, 405, and 406.

FIG. 2 depicts $_xPN_{33}$ extraction coupler 356 as a separate entity. This is done for clarity only. Those skilled in the art will appreciate that $_xTx_{33}$ extraction coupler 312 serves substantially the same function (i.e., signals $_xTx_{33}$ and $_xPN_{33}$ are substantially identical), and that combining couplers 312 and 356 into a single coupler does not depart from the spirit of the present invention.

Figure 6:
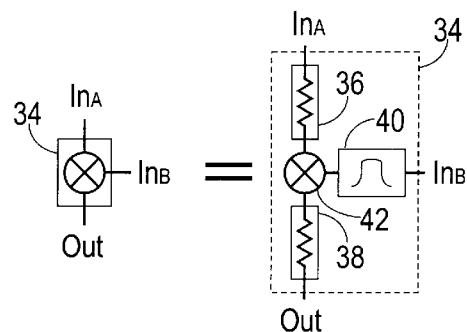
FIG. 6 shows a simplified schematic diagram of a generic mixing circuit in accordance with a preferred embodiment of the present invention.

FIG. 6 shows a simplified schematic of a generic mixing circuit 34 in accordance with a preferred embodiment of the present invention. The following discussion refers to FIG. 6.

Mixing circuit 34 (i.e., the mixer therein) produces an output signal whose frequency is either a sum or a difference of the frequencies of two input signals. Generic mixing circuit 34 has a first input signal $In_A$ having a frequency $f_A$, a second input signal $In_B$ having a frequency $f_B$, and an output signal Out having a frequency $f_O$. Output frequency $f_O$ is therefore one of a sum and a difference of input signal frequencies $f_A$ and $f_B$. That is, $f_O=f_A+f_B$ or $f_O=|f_A-f_B|$ (if high-order harmonics are ignored). If the difference frequency is chosen, output signal Out would be considered a down-conversion of input signal $In_A$. This is typical of systems where $f_O$ is a frequency much lower than $f_A$. By being lower in frequency, output signal Out is more easily propagated though various frequency-variant propagation media with fewer errors and less distortion.

If, however, $f_B$ is no greater than ten percent of $f_A$, i.e., $f_B \leq 0.1 f_A$, then, while $f_O$ does not equal $f_A$, $f_O$ is within ten percent (i.e., between 90 and 110 percent) of $f_A$, i.e., $0.9 f_A \leq f_O \leq 1.1 f_A$. Frequency $f_O$ is close enough to frequency $f_A$ so as to be affected in substantially the same manner by propagation through frequency-variant components and/or media of normal bandwidths. Carrying this argument further, if $f_B$ is no greater than five percent of $f_A$, i.e., $f_B \leq 0.05 f_A$, then $f_O$ is between 95 and 105 percent of $f_A$, i.e., $0.95 f_A \leq f_O \leq 1.05 f_A$, and still further, if $f_B$ is no greater than two percent of $f_A$, i.e., $f_B \leq 0.02 f_A$, then $f_O$ is between 98 and 102 percent of $f_A$, i.e., $0.98 f_A \leq f_O \leq 1.02 f_A$. It may readily be seen that as $f_B$ becomes an ever-smaller percentage of $f_A$, then $f_O$ approaches $f_A$, i.e., $f_O \approx f_A$. It is understood that $f_O$ never equals $f_A$, i.e., $f_O \neq f_A$.

Referring to FIGS. 2 through 6, to be offset rather than down-converted, the frequencies of local-oscillator signals $_LInc_{PJ}$, $_LDat_{PJ}$, $_LComL_{PJ}$, $_LComF_{PJ}$, $_LComV_{PJ}$, $_LComD_{PJ}$, and $_LPN_{33}$ (where P=1,2 and J=P,3) should be no greater than ten percent, preferably no greater than five percent, and more preferably no greater than two percent of predetermined frequency $f_S$. In TES network analyzer 26 of the exemplary embodiment, source signal $_sTx_{33}$ is a swept CW signal ranging in frequency from approximately 45 MHz to approximately 20 GHz, while the outputs of local-oscillator module 354 are as described in Table 1. These local-oscillator frequencies have been carefully chosen to avoid intermodulation distortion (IMD) between each of the signals produced by mixing each of the local-oscillator signals with the data, incident, reference, and link signals. A computer program was used to calculate all potential IMD products out to a specific order. Local-oscillator frequencies were rejected by the program if they produced an intermodulation component that potentially would interfere with the measured signals. Intermodulation components with 60 Hz and harmonics thereof were also calculated and rejected.

TABLE 1

| Output | Signal | Freq. (Hz) |
|---|---|---|
| 328 | $_LInc_{13}$ | 99,610 |
| 330 | $_LDat_{13}$ | 99,800 |
| 332 | $_LComL_{13}$ | 99,320 |
| 334 | $_LComF_{13}$ | 100,000 |
| 336 | $_LComV_{13}$ | 99,450 |
| 338 | $_LComD_{13}$ | 99,500 |
| 342 | $_LInc_{23}$ | 99,330 |
| 344 | $_LDat_{23}$ | 99,630 |
| 346 | $_LComL_{23}$ | 99,360 |
| 348 | $_LComF_{23}$ | 100,060 |
| 350 | $_LComV_{23}$ | 99,720 |
| 352 | $_LComD_{23}$ | 99,620 |

This produces a worst-case scenario where frequency $f_B$ is 100.06 kHz (for local-oscillator signal $_LComF_{23}$) and frequency $f_A$ is 45 MHz (for input signal $ComF_{22}$), i.e., to the nearest 0.001 percent, $f_B=0.00224 f_A$. Therefore, frequency $f_O$ (for output signal $_OComF_{22}$) is only slightly offset from $f_A$, i.e., $99.99776 f_A \leq f_O \leq 100.00224 f_A$. Frequency $f_O$ is affected in substantially the same manner as frequency $f_A$ by propagation through frequency-variant components and/or media.

Those skilled in the art will appreciate that the frequencies specified in Table 1 for the local-oscillator signals are exemplary only, and that other frequencies may be used to suit the requirements of a given circuit. The use of such other frequencies does not depart from the spirit of the present invention.

Referring again to FIGS. 2 through 5, high-frequency propagation media 102 and 202 may affect signals $Tx_{PJ}$, $RelF_{PJ}$, and $RejV_{PJ}$ during propagating from transmitter 300 to probes 100 and 200, respectively. Media 102 and 202 affect the simultaneous signals within each of composite signals $Inc_{pj}$ and $Dat_{pj}$ in substantially the same way during propagation from probes 100 and 200 to receiver 400. The signals within each of composite signals $Link_{1J}$ and $Link_{2J}$, propagating between probes 100 and 200, are similarly affected in a mutually identical manner. This equality of effect allows normalization to substantially suppress static and dynamic errors without recourse to high-precision devices and elaborate procedures.

In the exemplary embodiment, DUT 26 is coupled between first probe 100 and second probe 200, with first probe 100 connected to first port 30 and second probe 200 connected to second port 32. Conventionally, first port 30 and second port 32 are input and output ports, respectively, of DUT 26. In this way, when TES network analyzer 22 is set to measure a forward signal (i.e., a signal from first probe 100 to second probe 200 through DUT 26), the transmitted component (i.e., signal $_O\text{Tx}_{12}$) of signal $_I\text{Tx}_{11}$ passes through DUT 26 to second probe 200 in a normal input-to-output manner, with the reflected component (i.e., signal $_O\text{Tx}_{11}$) being reflected back to first probe 100.

Those skilled in the art will appreciate, however, that forward and reverse, and input and output, are relative terms, and that first and second probes 100 and 200 and first and second ports 30 and 32 may be interchanged at will without departing from the spirit of the present invention.

Transmitter 300 propagates transmission signals $\text{Tx}_{1J}$, $\text{RefF}_{1J}$, and $\text{RefV}_{1J}$ to first probe 100, and transmission signals $\text{Tx}_{2J}$, $\text{RefF}_{2J}$, and $\text{RefV}_{2J}$ to second probe 200 through high-frequency propagation media 102 and 202, respectively. First probe 100 propagates reception signals $\text{Dat}_{1J}$ and $\text{Inc}_{1J}$ and second probe 200 propagates reception signals $\text{Dat}_{1J}$ and $\text{Inc}_{1J}$ to receiver 400 through high-frequency propagation media 102 and 202, respectively. Also, first and second probes 100 and 200 reciprocally propagate signals $\text{Link}_{1J}$ and $\text{Link}_{2J}$ to second and first probes 200 and 100, respectively, through high-frequency propagation media 102 and 202. Transmitter 300 also propagates local-oscillator signals $_L\text{ComL}_{1J}$, $_L\text{ComF}_{1J}$, $_L\text{ComV}_{1J}$, $_L\text{ComD}_{1J}$, $_L\text{InC}_{1J}$, and $_L\text{Dat}_{1J}$ to first probe 100 and local-oscillator signals $_L\text{ComL}_{2J}$, $_L\text{ComF}_{2J}$, $_L\text{ComV}_{2J}$, $_L\text{ComD}_{2J}$, $_L\text{InC}_{2J}$, and $_L\text{Dat}_{2J}$ to second probe 200 through low-frequency propagation media 104 and 204, respectively.

High-frequency propagation media 102 and 202 may be bundles of flexible cables, with each cable providing one of signal paths 112, 114, 118, 140, 144, and 146 in high-frequency propagation medium 102 (FIGS. 2 and 3) and paths 212, 214, 218, 240, 244, and 246 in high-frequency propagation medium 202 (FIGS. 2 and 4). First probe 100 (FIG. 3) may be equipped with optional amplifiers 150, 152, 154, 156, and 158 on Tx1, RefF1, RefV1, Dat1, and Inc1 signal paths 112, 114, 118, 148, and 144, respectively. Similarly, second probe 200 (FIG. 4) may be equipped with optional amplifiers 250, 252, 254, 256, and 258 on Tx2, RefF2, RefV2, Dat2, and Inc2 signal paths 212, 214, 218, 248, and 244, respectively. Optional amplifiers 150, 152, 154, 156, 158, 250, 252, 254, 256, and 258 may be used when remote measurements of DUT 22 are required, and/or to model fiber optic or telemetry links. Dat1, Inc1, Dat2, and Inc2 optional amplifiers 156, 158, 256, and 258 may also be used to further isolate probes 100 and 200 from time-varying reflections associated with Dat1, Inc1, Dat2, and Inc2 signal paths 148, 144, 248, and 244, respectively.

Signal paths 112, 114, 118, 140, 148, and 144 (FIGS. 2 and 3), and 212, 214, 218, 240, 248, and 244 (FIGS. 2 and 4) in high-frequency propagation media 102 and 202 may be respectively characterized by time-varying scattering-matrices [$S^{Tx1}$], [$S^{ReFf}$], [$S^{RefV}$], [$S^{Link1}$], [$S^{Dat1}$], [$S^{Inc1}$] (FIG. 3)2, and [$S^{Tx2}$], [$S^{RefF2}$], [$S^{RefV2}$], [$S^{Link2}$], [$S^{Dat2}$], and [$S^{Inc2}$] (FIG. 4). These scattering-matrices model the system drift effects that can occur along these paths, e.g., cable flexure errors, amplifier drift errors, and level variations resulting from changes in the settings of variable attenuators 302, 318, 320, 322, and/or 324 (FIG. 2), switches 304, 306 (FIG. 3), 106, and/or 206 (FIG. 4), and/or the gain of amplifiers. 413, 414, 415, 416, and/or 417 (FIG. 5). Similar time-varying scattering-matrices are not necessary for low-frequency propagation media as cable flexure does not cause significant amplitude or phase changes at low frequencies. Furthermore, the mixer circuits are relatively insensitive to amplitude variations in the levels of the local-oscillator signals, thereby providing immunity to amplitude drift. Since the phases of the local-oscillator signals are monitored (discussed hereinafter), any phase drift in a local-oscillator signal is passed through the mixing circuit, and appears as a time-varying error in the mixed signal and is subtracted out in processor 500.

The circuitry in probes 100 and 200 serves two purposes. Directional couplers 122, 124, 222, and 224 are used to sample the incident, reflected, and transmitted signals associated with DUT 26. However, probes 100 and 200 also contain mixing circuits that allow the generation of signals $_O\text{Dat}_{PP}$, $_O\text{Inc}_{PP}$, $_O\text{ComL}_{PP}$ ($\text{Link}_{PP}$), $_O\text{ComF}_{PP}$, $_O\text{ComV}_{PP}$, and $_O\text{ComD}_{PP}$ whose frequencies are offset from predetermined frequency $f_S$. That is, if higher-order harmonics are ignored, then the frequency-offset mixers produce signals at the following sum and difference frequencies:

$$f_S + f_{LPathP} = f_{IF} + f_{BF} + 2\Delta_{LO} - \delta_{LPathP}; \text{ and} \quad (3)$$

$$f_S - f_{LPathP} = f_{IF} + f_{BF} + \delta_{LPathP}. \quad (4)$$

In the above expressions, $f_{LPathP}$ denotes that we are referring to the frequency of a local-oscillator signal associated with one of the frequency-offset mixers in one of the signal-flow paths in the port-P probe 100 or 200 (where P=1,2) The parameter $\delta_{LPathP}$ denotes the difference frequency associated with one of the frequency-offset mixers. The technique of frequency offsetting signals $_O\text{Dat}_{PP}$, $_O\text{Inc}_{PP}$, $_O\text{ComL}_{PP}$ ($\text{Link}_{PP}$), $_O\text{ComF}_{PP}$, $_O\text{ComV}_{PP}$, and $_O\text{ComD}_{PP}$ eliminates signal crosstalk, improves the isolation between the various signal paths, and allows for the flow of multiple signals through common receiver circuitry.

The following discussion refers to FIGS. 2, 3, 4, and 6. Each of mixing circuits 126, 128, 130, 132, 134, 136, 226, 228, 230, 232, 234, 236, and 358 is equivalent to generic mixing circuit 34. That is, the discussion of generic mixing circuit 34 is simultaneously a discussion of each of mixing circuits 126, 128, 130, 132, 134, 136, 226, 228, 230, 232, 234, 236, and 358. Similarly, generic-circuit first input signal $\text{In}_A$ is equivalent to any of mixing-circuit input signals $_R\text{Inc}_{11}$, $_R\text{Dat}_{11}$, $\text{ComL}_{11}$, $\text{ComF}_{11}$, $\text{ComV}_{11}$, $\text{ComD}_{11}$, $_R\text{Inc}_{22}$, $_R\text{Dat}_{22}$, $\text{ComL}_{22}$, $\text{ComF}_{22}$, $\text{ComV}_{22}$, $\text{ComD}_{22}$, and $_x\text{PN}_{33}$, generic-circuit second input signal $\text{In}_B$ is equivalent to any of mixing-circuit local-oscillator signals $_L\text{Inc}_{11}$, $_L\text{Dat}_{11}$, $_L\text{ComL}_{11}$, $_L\text{ComF}_{11}$, $_L\text{ComV}_{11}$, $_L\text{ComD}_{11}$, $_L\text{Inc}_{22}$, $_L\text{Dat}_{22}$, $_L\text{Com}_{22}$, $_L\text{ComF}_{22}$, $_L\text{ComV}_{22}$, $_L\text{ComD}_{22}$, and $_L\text{PN}_{33}$, and generic output signal Out is equivalent to any of mixing-circuit output (offset) signals $_O\text{Inc}_{11}$, $_O\text{Dat}_{11}$, $_O\text{ComL}_{11}$, $_O\text{ComF}_{11}$, $_O\text{ComV}_{11}$, $_O\text{ComD}_{11}$, $_O\text{Inc}_{22}$, $_O\text{Dat}_{22}$, $_O\text{ComL}_{22}$, $_O\text{ComF}_{22}$, $_O\text{ComV}_{22}$, $_O\text{ComD}_{22}$, and $\text{PN}_{33}$, respectively.

Generic mixing circuit 34 contains an input pad 36, an output pad 38, a low-frequency bandpass filter or diplexer 40, and a mixer 42. Diplexer 40 absorbs RF signals that may leak through on signal $\text{In}_B$, thereby isolating mixer 42 from time-variations in signal $\text{In}_B$, e.g., kinks in low-frequency propagation media 104 and 204, etc. Diplexer 40 also suppresses 60 Hz and harmonics thereof, and prevents any DC level in signal $\text{In}_B$ from causing a time-varying attenuation of signal Out. It is also possible to make diplexer 40 a very narrow bandpass filter so that cross-talk between paths in low-frequency propagation media 104 and 204 may be eliminated, although crosstalk may also be virtually eliminated by using suitably shielded and/or twisted-pair cables in low-frequency propagation media 104 and 204. Since there is a large separation between the swept RF and local-oscillator frequencies, diplexers may also be employed on $In_A$ and Out ports of generic mixing circuit 34 to filter out the low-frequency local-oscillator feedthrough.

Input and output pads 36 and 38 provide signal isolation, allow adjustment of signal levels, and provide impedance matching for mixer 42. This results in a reduction of the severity of intermodulation products generated by mixers 42.

The following discussion again refers to FIGS. 1 through 5. In order to make accurate measurements of the signal through DUT 26, it is necessary to establish accurate amplitude and phase references in probes 100 (FIG. 3) and 200 (FIG. 4). This is accomplished by producing local-probe link signals $Link_{11}$ and $Link_{22}$ in first and second probes 100 and 200, respectively. Signals $Link_{11}$ and $Link_{22}$ are then reciprocally propagated over a single bidirectional link (Link) signal path 140/240 (i.e., Link1 signal path 140 between first probe 100 and receiver 400, and Link2 signal path 240 between second probe 200 and receiver 400) through Link channel 401 (FIG. 5) to second and first probes 200 and 100 to become opposite-probe link signals $Link_{12}$ and $Link_{2J}$, respectively. In opposite probes 200 and 100, opposite-probe link signals $Link_{12}$ and $Link_{2J}$ are combined into composite incident signals $Inc_{22}$ and $Inc_{11}$, respectively, and passed to receiver 400.

Since link signals $Link_{1J}$ and $Link_{2J}$ (where J=1,2,3) are reciprocally propagated over single Link signal path 140/240, whatever propagation effect is imposed upon one link signal is also imposed upon the other link signal. Link signals $Link_{1J}$ and $Link_{2J}$ are used during signal normalization to measure the transmission coefficient through Link channel 401 (i.e., through Link signal path 140/240), thereby establishing a common tie between probes 100 and 200. Pads 160 and 162 (FIG. 3), and 260 and 262 (FIG. 4), as well as the output pads of mixing circuits 130 (FIG. 3) and 230 (FIG. 4), serve to isolate probes 100 and 200 from the effects of the time-varying return loss associated with Link signal path 140/240.

When DUT 26 is a reciprocal DUT (i.e., has the same transfer function for a forward and a reverse signal), some simplifications to the TES technique may be made. The path through DUT 26 is then also reciprocal, and may be used to establish the reference between probes 100 and 200. That is, the signal path through a reciprocal DUT 26 may also be used as a link channel (not shown). In TES network analyzer 22, the necessary probe-correlation information is carried on the incident and data signals $Inc_{1J}$ and $Dat_{1J}$ (FIG. 3), and $Inc_{2J}$ and $Dat_{2J}$ FIG. 4), and all the circuitry associated with fixed-reference signals $RefF_{1J}$ (FIG. 3) and $RefF_{2J}$ (FIG. 4) may then be removed (not shown).

Receiver 400 (FIG. 5) receives composite signals $Inc_{13}$, $Dat_{13}$, $Dat_{23}$, $Inc_{23}$, and $PN_{33}$ in channels 403, 404, 405, 406, and 407, respectively. Incident and data signals $Inc_{13}$, $Dat_{13}$, $Dat_{23}$, and $Inc_{23}$ are composite (multiple) signals, while phase-noise reference signal $PN_{33}$ is a sole (single) signal. In first probe 100 (FIG. 3), signals $_OInc_{11}$, $_OComF_{11}$, $_OComV_{11}$, and $Link_{2J}$ are combined into composite signal $Inc_{11}$ and propagated over Inc1 signal path 144 in high-frequency propagation medium 102 to become composite signal $Inc_{13}$ in receiver 400 (FIG. 5). Similarly, signals $_ODat_{11}$, and $_OComD_{11}$ are combined into composite signal $Dat_{11}$ and propagated over Dat1 signal path 148 in high-frequency propagation medium 102 to become composite signal $Dat_{13}$ in receiver 400. Likewise, in second probe 200 (FIG. 4), signals $_OInc_{22}$, $_OComF_{22}$, $_OComV_{22}$, and $Link_{12}$ are combined into composite signal $Inc_{22}$ and propagated over Inc2 signal path 244 in high-frequency propagation medium 202 to become composite signal $InC_{23}$ in receiver 400. Similarly, signals $_ODat_{22}$, and $_OComD_{22}$ are combined into composite signal $Dat_{22}$ and propagated over Dat2 signal path 248 in high-frequency propagation medium 202 to become composite signal $Dat_{23}$ in receiver 400.

In receiver 400 (FIG. 5), signals $Inc_{13}$, $Dat_{13}$, $Dat_{23}$, $Inc_{23}$, and $PN_{33}$ are gain ranged by variable-gain amplifiers 413, 414, 415, 416, and 417, respectively, as discussed hereinbefore (PN channel 407 processes signal $PN_{33}$ in exactly the same manner that channels 403, 404, 405, and 406 process composite signals $Inc_{13}$, $Dat_{13}$, $Dat_{23}$, and $Inc_{23}$). Gain-ranging amplifiers 413–417 also prevent the down-conversion local-oscillator feedthrough from reaching DUT 26, as may occur in conventional (i.e., prior-art) network analyzers.

Following gain ranging, gain-ranged signals $Inc_{13}$, $Dat_{13}$, $Dat_{23}$, $InC_{23}$, and $PN_{33}$ pass though wideband filters (diplexers) 423, 424, 425, 426, and 427, respectively, before entering down-conversion mixers 433, 434, 435, 436, and 437. Diplexers 423, 424, 425, 426, and 427 suppress feedthrough of signals $_LInC_{11}$, $_LComF_{11}$, $_LComV_{11}$, or $_LComL_{22}$ (FIG. 3) in composite signal $Inc_{13}$, signals $_LDat_{11}$ or $_LComD_{11}$ (FIG. 3) in composite signal $Dat_{13}$, signals $_LDat_{22}$, or $_LComD_{22}$ (FIG. 4) in composite signal $Dat_{23}$, signals $_LInc_{22}$, $_LComF_{22}$, $_LComV_{22}$, or $_LComL_{11}$ (FIG. 4) in composite signal $In_{23}$, and signal $_LPN_{33}$ (FIG. 2) in signal $PN_{33}$. Diplexers 423, 424, 425, 426, and 427 also provide good impedance matches for down-conversion mixers 433, 434, 435, 436, and 437, respectively.

Down-conversion mixers 433, 434, 435, 436, and 437 frequency multiply filtered signals $Inc_{13}$, $Dat_{13}$, $Dat_{23}$, $Inc_{23}$, and $PN_{33}$ with a swept-frequency, down-conversion source signal $_SIF_{33}$. Signal $_SIF_{33}$ of frequency $f_{IF}$ is generated by an IF signal source (synthesizer) 438 driven by system clock 502 and synchronized with signal source 24 so as to maintain a constant difference in frequency between source signal $_STx_{33}$ and IF source signal $_SIF_{33}$. This difference is IF frequency $f_{IF}$. The result is a down-conversion of signals $Inc_{13}$, $Dat_{13}$, $Dat_{23}$, $In_{23}$, and $PN_{33}$ into an IF incident signal $_IInc_{13}$, an IF data signal $_IDat_{13}$, an IF data signal $_IDat_{23}$, an IF incident signal $_IInc_{23}$, and an IF phase-noise reference signal $_IPN_{33}$, respectively. The frequencies of signals $_IInc_{13}$, $_IDat_{13}$, $_IDat_{23}$, $_IInc_{23}$, and $_IPN_{33}$ are offset from IF frequency $f_S \pm f_{IF}$ to the same degree signals $Inc_{13}$, $Dat_{13}$, $Dat_{23}$, $Inc_{23}$, and $PN_{33}$ are offset from predetermined frequency $f_S$. This produces upper-sideband signals at $$f_S + f_{LPathP} + f_{IF} = 2f_{IF} + f_{BF} + 2\Delta_{LO} - \delta_{LPathP}, \text{ and} \quad (5)$$

$$f_S - f_{LPathP} + f_{IF} = 2f_{IF} + f_{BF} + \delta_{LPathP}, \quad (6)$$

and lower sidebands at $$f_S + f_{LPathP} - f_{IF} = f_{BF} + 2\Delta_{LO} - \delta_{LPathP}, \text{ and} \quad (7)$$

$$f_S - f_{LPathP} - f_{IF} = f_{BF} + \delta_{LPathP}. \quad (8)$$

Those skilled in the art will appreciate that while TES network analyzer 22 employs fundamental mixing for the IF down-conversion, other techniques, such as harmonic mixing or sampling, may also be employed without departing from the spirit of the present invention. Furthermore, in millimeter-wave applications, where cable losses are prohibitively large, it may be desirable to place IF down-conversion mixers 433–436 in probes 100 and 200.

Signals $_IInc_{13}$, $_IDat_{13}$, $_IDat_{23}$, $_IInc_{23}$, and $_IPN_{33}$ are then passed through pads 443, 444, 445, 446, and 447, very-narrow-band crystal filters 453, 454, 455, 456, and 457, and down-conversion mixers 463, 464, 465, 466, and 467.

Pads 443–447 isolate mixers 433–437 from reflections resulting from impedance mismatches associated with crystal filters 453–457.

Very-narrow-band crystal filters 453–457 pass the difference signals from mixing circuits 126, 128, 130, 132, 134, 136, 226, 228, 230, 232, 234, 236, and 358. Since the frequencies of local-oscillator signals $_L\text{InC}_{PJ}$, $_L\text{Dat}_{PJ}$, $_L\text{ComL}_{PJ}$, $_L\text{ComF}_{PJ}$, $_L\text{ComD}_{PJ}$, and $_L\text{PN}_{33}$ are approximately 100 kHz, mixing circuits 126, 128, 130, 132, 134, 136, 226, 228, 230, 232, 234, 236, and 358 produce dual output signals whose frequencies are approximately 100 kHz above and below predetermined frequency $f_S$ (not shown). After down-conversion by mixers 463–467, those frequencies are approximately 100 kHz above and below intermediate frequency $f_S - f_{IF}$ (not shown). Filters 453–457 remove those signals whose frequencies are defined in Equations (5)–(7), leaving only those signals whose frequencies are given in Equation (8).

The outputs of crystal filters 453–457 flow into the inputs of down-conversion mixers 463–467. Mixers 463–467 are driven by fixed-frequency baseband source signal $_S\text{BF}_{33}$ of frequency $f_{BF}$ derived from a baseband signal source (divider) 468 driven by system clock 502. In this manner, IF signals $_I\text{Inc}_{13}$, $_I\text{Dat}_{13}$, $_I\text{Dat}_{23}$, $_I\text{Inc}_{23}$, and $_I\text{PN}_{33}$ are converted into baseband signals $_B\text{Inc}_{13}$, $_B\text{Dat}_{13}$, $_B\text{Dat}_{23}$, $_B\text{Inc}_{23}$, and $_B\text{PN}_{33}$. The sum and difference frequencies for mixers 463–467 exist at $$f_S - f_{LPathP} - f_{IF} + f_{BF} = 2f_{BF} + \delta_{LPathP}, \text{ and} \quad (9)$$

$$f_S - f_{LPathP} - f_{IF} - f_{BF} = \delta_{LPathP}. \quad (10)$$

In addition to baseband signals $_B\text{Inc}_{13}$, $_B\text{Dat}_{13}$, $_B\text{Dat}_{23}$, $_B\text{Inc}_{23}$, and $_B\text{PN}_{33}$, receiver 400 (FIG. 5) also receives a local-oscillator summing signal $_L\text{Sum}_{33}$ from transmitter 300 (FIG. 2). Within local-oscillator module 354 (FIG. 2), local-oscillator outputs 328, 330, 332, 334, 336, 338, 342, 344, 346, 348, 350, and 352, i.e., all the individual local-oscillator signals $_L\text{ComL}_{13}$, $_L\text{ComF}_{13}$, $_L\text{ComV}_{13}$, $_L\text{ComD}_{13}$, $_L\text{Inc}_{13}$, $_L\text{Dat}_{13}$, $_L\text{ComL}_{23}$, $_L\text{ComF}_{23}$, $_L\text{ComV}_{23}$, $_L\text{ComD}_{23}$, $_L\text{Inc}_{23}$, and $_L\text{Dat}_{23}$, respectively, are summed together in a summer 360 to produce summing signal $_L\text{Sum}_{33}$. Summing signal $_L\text{Sum}_{33}$ is processed by receiver 400 in LOSum channel 402.

Local-oscillator module 354 (FIG. 2) generates local-oscillator output signals $_L\text{PNC}_{33}$, $_L\text{ComL}_{13}$, $_L\text{ComF}_{13}$, $_L\text{ComV}_{13}$, $_L\text{ComD}_{13}$, $_L\text{Inc}_{13}$, $_L\text{Dat}_{13}$, $_L\text{PN}_{33}$, $_L\text{ComL}_{23}$, $_L\text{ComF}_{23}$, $_L\text{ComV}_{23}$, $_L\text{ComD}_{23}$, $_L\text{Inc}_{23}$, and $_L\text{Dat}_{23}$ for TES network analyzer 22. Since the frequencies for these output signals are relatively low (on the order of 100 kHz), local-oscillator module 354 may utilize inexpensive dividers or digital-to-analog converters to generate the output signals from system clock 502 under control of processor 500. Summer 360 sums all probe output signals together to produce local-oscillator summing signal $_L\text{Sum}_{33}$. Summer 360 may consist of, for example, 10 kΩ resistors from each of outputs 328, 330, 332, 334, 336, 338, 342, 344, 346, 348, 350, and 352 to a single connection point. The 10 kΩ resistors will not measurably alter the 50Ω impedance of the $_L\text{ComL}_{13}$, $_L\text{ComF}_{13}$, $_L\text{ComV}_{13}$, $_L\text{ComD}_{13}$, $_L\text{Inc}_{13}$, $_L\text{Dat}_{13}$, $_L\text{ComL}_{23}$, $_L\text{ComF}_{23}$, $_L\text{ComV}_{23}$, $_L\text{ComD}_{23}$, $_L\text{Inc}_{23}$, and $_L\text{Dat}_{23}$ signal paths, and will provide a small, but easily measurable, sample of the local-oscillator output signals. Since all of the local-oscillator output signals for probes 100 and 200 are summed together with this circuit, and since we only need relative phases of the local-oscillator output signals, any subsequent phase shifts of these combined signals will have no effect.

Those skilled in the art will appreciate that the above techniques for generating local-oscillator signals $_L\text{PNC}_{33}$, $_L\text{ComL}_{13}$, $_L\text{ComF}_{13}$, $_L\text{ComV}_{13}$, $_L\text{ComD}_{13}$, $_L\text{InC}_{13}$, $_L\text{Dat}_{13}$, $_L\text{PN}_{33}$, $_L\text{ComL}_{23}$, $_L\text{ComF}_{23}$, $_L\text{ComV}_{23}$, $_L\text{ComD}_{23}$, $_L\text{Inc}_{23}$, and $_L\text{Dat}_{23}$, and for summing the probe signals into signal $_L\text{Sum}_{33}$, are exemplary. The use of other techniques does not depart from the spirit of the present invention.

Referring again to FIG. 5, signals $_L\text{Sum}_{33}$, $_B\text{Inc}_{13}$, $_B\text{Dat}_{13}$, $_B\text{Dat}_{23}$, $_B\text{Inc}_{23}$, and $_B\text{PN}_{33}$ pass through amplifiers 472, 473, 474, 475, 476, and 477 and low-pass filters 482, 483, 484, 485, 486, and 487 before being fed into high-resolution analog-to-digital converters (ADCs) 492, 493, 494, 495, 496, and 497.

Amplifiers 472, 473, 474, 475, 476, and 477 may drift slightly with temperature and/or over time. Any such drift may cause a slight shift in phase of signals $_L\text{Sum}_{33}$, $_B\text{Inc}_{13}$, $_B\text{Dat}_{13}$, $_B\text{Dat}_{23}$, $_B\text{Inc}_{23}$, and $_B\text{PN}_{33}$ passing through amplifiers 472, 473, 474, 475, 476, and 477, respectively. However, signal $_L\text{Sum}_{33}$, being a sum of local-oscillator signals $_L\text{ComL}_{13}$, $_L\text{ComF}_{13}$, $_L\text{ComV}_{13}$, $_L\text{ComD}_{13}$, $_L\text{Inc}_{13}$, $_L\text{Dat}_{13}$, $_L\text{ComL}_{23}$, $_L\text{ComF}_{23}$, $_L\text{ComV}_{23}$, $_L\text{ComD}_{23}$, $_L\text{Inc}_{23}$, and $_L\text{Dat}_{23}$, is digitized separately and later used to correct the measured data for any relative phase drift between the local-oscillator sources. Drift in the other signals $_B\text{Inc}_{13}$, $_B\text{Dat}_{13}$, $_B\text{Dat}_{23}$, $_B\text{Inc}_{23}$, and $_B\text{PN}_{33}$ is removed via signal normalization.

Low-pass filters 482–487 are designed to pass the desired signals while providing anti-alias protection for ADCs 492–497. ADCs 492–497 are used to digitally sample the relatively low frequency waveforms of signals $_L\text{Sum}_{33}$, $_B\text{Inc}_{13}$, $_B\text{Dat}_{13}$, $_B\text{Dat}_{23}$, $_B\text{Inc}_{23}$, and $_B\text{PN}_{33}$, convert those waveforms from the analog to the digital domain, and produce digital signals $_D\text{SUM}_{33}$, $_D\text{Inc}_{13}$, $_D\text{Dat}_{13}$, $_D\text{Dat}_{23}$, $_D\text{Inc}_{23}$, and $_L\text{PN}_{33}$. Signals $_D\text{Sum}_{33}$, $_D\text{Inc}_{13}$, $_D\text{Dat}_{13}$, $_D\text{Dat}_{23}$, $_D\text{Inc}_{23}$, and $_D\text{PN}_{33}$, being digital, are logical signals which pass over logical paths in channels 402–407 to processor 500. These logical paths are represented at the bottom of receiver 400 (FIG. 5) and in processor 500, (FIG.7, discussed hereinafter) as dotted lines. Physically, signals $_D\text{SUM}_{33}$, $_D\text{Inc}_{13}$, $_D\text{Dat}_{13}$, $_D\text{Dat}_{23}$, $_D\text{Inc}_{23}$, and $_D\text{PN}_{33}$ are passed to processor 500 over system data and control bus 504.

Those skilled in the art will appreciate that the scenario discussed hereinbefore for receiver 400 is but one of a plurality of such scenarios, and that the use of another scenario does not depart from the spirit of the present invention. For example, since all the individual signals making up the composite signals $\text{Inc}_{13}$, $\text{Dat}_{13}$, $\text{Dat}_{23}$, and $\text{Inc}_{23}$ exist at distinct frequencies, the signals associated with two or more of receiver channels 403–406 may be combined together in a single receiver channel to reduce receiver costs.

The following discussion refers to FIGS. 2 and 5. The basic idea behind the phase-noise subtraction technique mentioned hereinbefore is to determine the level of the phase noise relative to source signal $_S\text{Tx}_{33}$ in dedicated PN channel 407 containing single (sole) signal $\text{PN}_{33}$. This information is then used by processor 500 to extract the phase-noise contamination in channels 403, 404, 405, and 406 from each of the signals within composite signals $\text{Inc}_{13}$, $\text{Dat}_{13}$, $\text{Dat}_{23}$, and $\text{Inc}_{23}$, respectively. It is assumed that the differences between the time delays associated with signal propagation along channels 403–407 are small in comparison to the data acquisition time. Furthermore, it is assumed that all of the signals are converted substantially simultaneously by ADCs 493–497. Under these assumptions, the phase-noise subtraction technique works since signals $\text{Inc}_{13}$, $\text{Dat}_{13}$, $\text{Dat}_{23}$, $\text{Inc}_{23}$, and $\text{PN}_{33}$ are all derived from source signal $_S\text{Tx}_{33}$, i.e., from high-frequency synthesized signal source 24, which is the cause of the phase noise contamination. IF and baseband down-conversion sources 438 and 468 may also contribute appreciable amounts of phase noise to the system. However, this phase noise contamination may be monitored and removed since it is common to signals $Inc_{13}$, $Dat_{13}$, $Dat_{23}$, $Inc_{23}$, and $PN_{33}$, i.e., IF and baseband source signals $_SIF_{33}$ and $_SBF_{33}$ are each applied to channels 403–407. The relatively low-frequency offset local-oscillator sources 328, 330, 332, 334, 336, 338, 340, 342, 344, 346, 348, 350, and 352, which are not common to all the measured signals, contribute negligible levels of phase-noise contamination, and may therefore be ignored.

An initial calibration procedure is used to remove static (systematic) errors associated with receiver channels 403–407 for the phase-noise subtraction technique discussed hereinbefore. Within transmitter 300 (FIG. 2), a mixer 362 and directional couplers 364 and 366 are used to inject moderate sized, simulated "phase-noise" sidebands into system 20. Directional coupler 364 extracts a signal $_XPNC_{33}$ from source signal $_STx_{33}$. Mixer 362 then mixes local-oscillator phase-noise-calibration signal $_LPNC_{33}$ with extracted signal $_XPNC_{33}$ to produce an injection signal $_IPNC_{33}$. A low-frequency bandpass filter 368 is used to remove RF components from local-oscillator signal $_LPNC_{33}$. Injection signal $_IPNC_{33}$ consists substantially of a sum and a difference of predetermined frequency $f_S$ and the frequency of local-oscillator signal $_LPNC_{33}$. That is, injection signal $_IPNC_{33}$ consists of two "sidebands" of predetermined frequency $f_S$. Directional coupler 366 then injects injection signal $_IPNC_{33}$ into source signal $_STx_{33}$ to produce a phase-noise source signal $_SPN_{33}$, hence producing the calibration sidebands in all signals in system 20. Phase-noise source signal $_SPN_{33}$ is substantially source signal $_STx_{33}$ plus the upper and lower sidebands from injection signal $_IPNC_{33}$, which sidebands simulate quantifiable phase noise with which to calibrate PN channel 407 against the sidebands in a signal in one of the other channels. Local-oscillator calibration signal $_LPNC_{33}$ may be varied to produce an optimal set of sidebands for calibration of any signal within system 20. Variable attenuators 302, 318, 320, 322, and 324 may be used to "turn-off" all the other signals within system 20 except the signal being calibrated during each step of the phase-noise subtraction technique calibration procedure.

Those skilled in the art will appreciate that the above phase-noise calibration technique is exemplary, and that the use of another technique does not depart from the spirit of the present invention.

Figure 7:
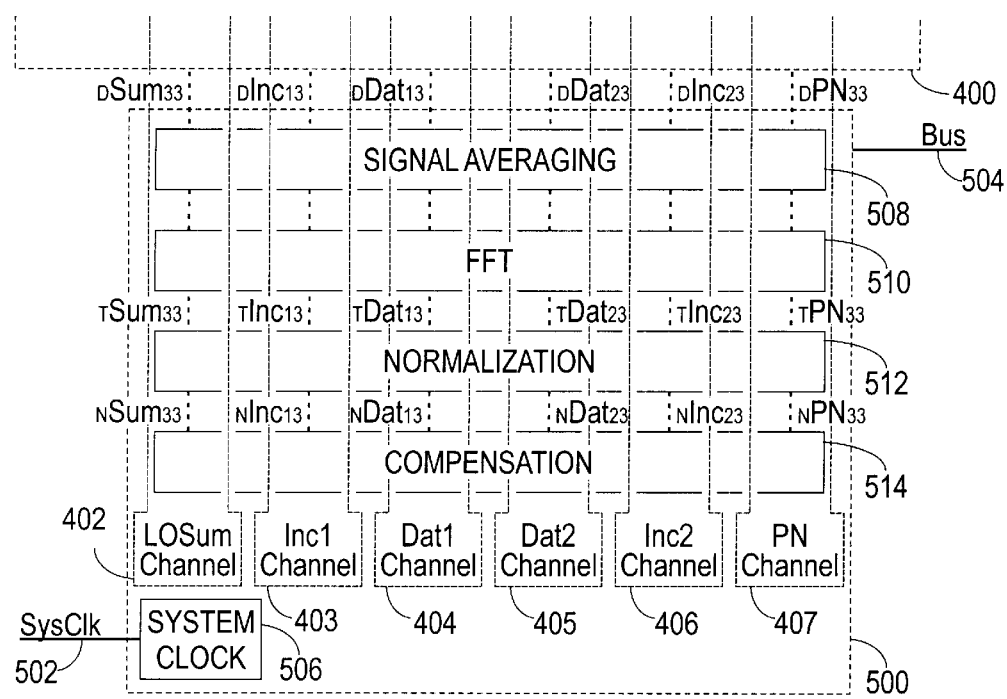
FIG. 7 shows a simplified schematic diagram of a processor of the network analyzer of FIG. 1 in accordance with a preferred embodiment of the present invention.

FIG. 7 shows a simplified schematic diagram of processor 500 of TES network analyzer 22 in accordance with a preferred embodiment of the present invention. The following discussion refers to FIG. 7.

Processor 500 controls the signal routing, collection of the data, analysis of the data, and display of the processed data. System data and control bus 504 serves as the interface between processor 500 and other circuits of analysis unit 28. Additionally, processor 500 may generate system clock 502 in a system clock source 506. System clock 502 is then distributed to other portions of signal measurement system 20.

Those skilled in the art will appreciate that not all connections of system clock 502 and system data and control bus 504 are depicted in the Figures, and that those connections that are depicted are exemplary only. It will be further-appreciated that there is no requirement that system clock source 506 be a component of processor 500, and that the use of other techniques of producing system clock 502 do not depart from the spirit of the present invention.

Processor 500 controls several functions of signal measurement system 20. For example, processor 500 sends commands to swept-frequency signal source 24 and IF signal source 438 that control the type of frequency sweep, the range of the frequency sweep, and the level of source signal $_STx_{33}$, processor 500 sets switches 304 and 306 (FIG. 2), 106 (FIG. 3), and 206 (FIG. 4) to select between forward DUT input signal $_ITx_{11}$ and reverse DUT input signal $_ITx_{22}$ gas the signal to be measured, processor 500 sets variable attenuators 302, 318, 320, 322, and 324 (FIG. 2) to establish the levels of signals $Tx_{33}$, $RefF_{13}$, $RefF_{23}$, $RefV_{13}$, and $RefV_{23}$, respectively, processor 500 controls local-oscillator module 354 (FIG. 2) so as to establish the frequencies of signals $_LPNC_{33}$, $_LComL_{13}$, $_LComF_{13}$, $_LComV_{13}$, $_LComD_{13}$, $_LInc_{13}$, $_LDat_{13}$, $_LPN_{33}$, $_LComL_{23}$, $_LComF_{23}$, $_LComV_{23}$, $_LComD_{23}$, $_LInc_{23}$, and $_LDat_{23}$, processor 500 sets the gain of variable-gain amplifiers 413, 414, 415, and 416 (FIG. 5) so that the signals within each of composite signals $Inc_{13}$, $Dat_{13}$, $Dat_{23}$, $Inc_{23}$ are within ±15 db of each other, and processor 500 also establishes the sample time, sampling rate, and data-collection starting time of ADCs 492–493 (FIG. 5).

Once ADCs 492–497 (FIG. 5) have produced the digitized signals $D_LSum_{33}$, $_DInc_{13}$, $_DDat_{13}$, $_DDat_{23}$, $_DInc_{23}$, and $_DPN_{33}$, then these signals are sent through the system control/data bus 504 to processor 500. For purposes of clarity, FIG. 7 depicts signals. $_DLSum_{33}$, $_DInc_{13}$, $_DDat_{13}$, $_DDat_{23}$, $_DInc_{23}$, and $_DPN_{33}$ as continuing to propagate along channels LOSum 402, Inc1 403, Dat1 404, Dat2 405, Inc2 406, and PN 407. Those skilled in the art will appreciate that this is a convention of the figures only, and that all signal propagate through bus 504 to processor 500, then propagate within processor 500 in a manner well-known for processors.

Once in processor 500, a conventional signal-averaging or decimating routine 508 is used to preprocess the signals. After preprocessing, a Fast Fourier Transform (FFT) routine 510 is used to transform signals $_DLSum_{33}$, $_DInc_{13}$, $_DDat_{13}$, $_DDat_{23}$, $_DInc_{23}$, and $_DPN_{33}$ from the time domain to the frequency domain and distribute the resultant $_TLSum_{33}$, $_TInc_{13}$, $_TDat_{13}$, $_TDat_{23}$, $_TInc_{23}$, and $_TPN_{33}$ signals into a plurality of frequency bins. A normalization routine 512 then extracts the desired, complex, frequency-domain signals $_TLSum_{33}$, $_TInc_{13}$, $_TDat_{13}$, $_TDat_{23}$, $_TInc_{23}$, and $_TPN_{33}$ from their respective frequency bins. A compensation routine 514 then uses normalized signals $_NLSum_{33}$, $_NInc_{13}$, $_NDat_{13}$, $_NDat_{23}$, $_NInc_{23}$, and $_NPN_{33}$ with the hereinbefore described static, dynamic, and phase-noise error suppression techniques to produce the desired error corrected S-parameters for DUT 26.

Once the S-parameters have been computed, processor 500 may display these data to the user (not shown) or otherwise effect desired actions (not shown). For exemplary TES network analyzer 22, the user has control over the type of display (i.e., log magnitude, linear magnitude, real and imaginary parts, or Smith chart representations), the frequency span, the number of frequency points within the frequency span, etc.

Since the digitized, time-domain waveforms are processed using FFT routine 510, all of the sources and samplers must be precisely synchronized. This synchronization is achieved using system clock 502. System clock 502 is used to synchronize signal source (swept-frequency synthesizer) 24 (FIG. 1), frequency-offset local-oscillator outputs (digital-to-analog converters) 326, 328, 330, 332, 334, 336, 338, 340, 342, 344, 346, 348, 350, and 352 (FIG. 2), IF down-conversion signal source 438 (FIG. 5), baseband down-conversion signal source 468, and ADCs (high-resolution analog-to-digital converters) 492, 493, 494, 495, 496, and 497 (FIG. 5).

A better understanding of TES network analyzer 22 and the signal normalization techniques of the TES technique can be gained by studying the signal-flow paths. The time-varying amplitude and phase errors associated with cable flexure and temperature drift are modeled by scattering-matrices (S-matrices) $[S^{Tx1}]$, $[S^{RefF1}]$, $[S^{RefV1}]$, $[S^{Link1}]$, $[S^{Dat1}]$, and $[S^{Inc1}]$ for port-1 high-frequency propagation medium 102 (FIG. 3), and $[S^{TX2}]$, $[S^{Ref2}]$, $[S^{RefV2}]$, $[S^{Link2}]$, $[S^{Dat2}]$, and $[S^{Inc2}]$ for port-2 high-frequency propagation medium 202 (FIG. 4). These matrices may be generalized as $[S^{PathP}]$, where the superscript Path indicates the signal-flow path of the specific transmitter signal $Tx_{1I}$ or $Tx_{2I}$, receiver signal $Dat_{1I}$, $Dat_{2I}$, $Inc_{1I}$, or $Inc_{2I}$, reference signal $RefF_{1I}$, $RefF_{2I}$, $RefV_{1I}$, or $RefV_{2I}$, or link signal $Link_{1I}$ or $Link_{2I}$, where P denotes the port (P=1,2), and the square brackets indicate that we are referring to a matrix. Since these paths either contain a single signal that is later split into data and normalization signals with different frequencies, or they contain two or more simultaneous signals at different frequencies, signal normalization techniques can be used to remove both the static and dynamic errors associated with components in these paths from the measured S-parameters.

When discussing the individual S-parameters associated with DUT 26, the square brackets are dropped and subscripts are added to denote the transmitter and receiver ports (Table 2). Note that the time-varying characteristics of the optional transmission and reception amplifiers 150, 152, 154, 156, and 158 (FIG. 3), and 250, 252, 254, 256, and 258 (FIG. 4), and other signal-conditioning circuitry can also be included in these time-varying S-matrices. Optional Dat1, Inc1, Dat2, and Inc2 amplifiers 156 and 158, and 256 and 258 can be used to isolate probes 100 (FIG. 3) and 200 (FIG. 4) from reflections in Dat1 and Inc1 signal paths 148 and 144, and Dat2 and Inc2 signal paths 248 and 244, respectively. Optional transmission and reception amplifiers 150, 152, 154, 156, 158, 250, 252, 254, 256, and 258 may also be desirable in applications involving measurements of remote or high-power DUTs. In some applications, it may even be desirable to employ fiber optic or telemetry links to connect between transmitter 300 and/or receiver 400 and calibration probes 100 and 200. These effects can also be included in the time-varying S-matrices.

Figure 8:
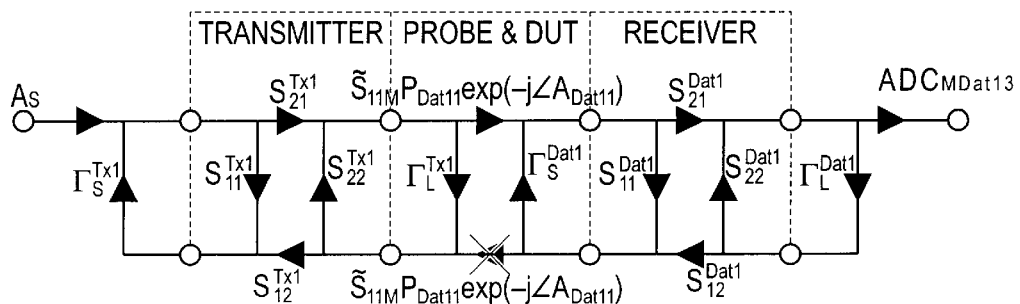
FIG. 8 shows a signal-flow graph of the signal-flow path of a signal of the network analyzer of FIG. 1 in accordance with a preferred embodiment of the present invention.

FIG. 8 shows a signal-flow graph of the signal-flow path of composite signal $Dat_{1I}$ in accordance with a preferred embodiment of the present invention. The following discussion refers to FIGS. 2, 3, 4, and 8.

Composite signals $Inc_{1I}$, $Dat_{1I}$, $Dat_{2I}$, and $Inc_{2I}$ are made up of independent measured signals. These measured signals maintain their independence as combined signals $Inc_{1I}$, $Dat_{1I}$, $Dat_{2I}$, and $Inc_{2I}$ are propagated through and processed by receiver 400 (FIG. 5). For port-1 signals, combined signal $Inc_{1I}$ contains independent measured signals $_MInc_{13}$, $_MComV_{13}$, $_MComF_{13}$, and $_MComL_{23}$ ($_MLink_{23}$) (none shown) derived from signals $_OInc_{11}$, $_OComV_{1I}$, $_OComF_{1I}$, and $_OComL_{21}$ ($Link_{21}$) combined by combiner 142, and combined signal $Dat_{1I}$ contains independent measured signals $_MDat_{13}$ and $_MComD_{13}$ (none shown, save $_MDat_{13}$ is an exemplary signal in FIG. 8), derived from signals $_ODat_{1I}$ and $_OComD_{1I}$ combined by combiner 146 in first probe 100 (FIG. 3). Similarly, for port-2 signals, combined signal $Inc_{2I}$ contains independent measured signals $_MInc_{23}$, $_MComV_{23}$, $_MComF_{23}$, and $_MComL_{13}$ ($_MLink_{13}$) (none shown) derived from signals $_OInc_{22}$, $_OComV_{22}$, $_OComF_{22}$, and $_OComL_{12}$ ($Link_{12}$) combined by combiner 242, and combined signal $Dat_{2I}$ contains independent measured signals $_MDat_{23}$ and $_MComD_{23}$ (none shown) derived from signals $_ODat_{22}$ and $_OComD_{22}$ combined by combiner 246 in second probe 200 (FIG. 4).

Assuming switches 304 and 306 (FIG. 2), 106 (FIG. 3), and 206 (FIG. 4) are set for forward DUT signal measurements, i.e., as shown in FIGS. 2, 3, and 4, then the signal-flow graph in FIG. 8 can be used to better understand signal flow along a signal-flow path of signal $Dat_{1I}$. Other signal-flow paths in TES network analyzer 22 are similar. Thus, once the signal-flow analysis has been carried out for the path of signal $Dat_{1I}$, then these results can be directly extended to the paths of other signals by replacing the variables listed in the $_MDat_{13}$ row in Table 2 with the corresponding variables for another flow path from another row in Table 2.

TABLE 2

| FFT Signal | Transmitter Circuitry | | | Probe Circuitry and DUT | Receiver Circuitry | | |
|---|---|---|---|---|---|---|---|
| $_MDat_{13}$ | $\Gamma_S^{Tx1}$ | $[S^{Tx1}]$ | $\Gamma_L^{Tx1}$ | $\tilde{S}_{11M}P_{ODat11}\exp(-j\angle A_{LDat11})$ | $\Gamma_S^{ODat1}$ | $[S^{ODat1}]$ | $\Gamma_L^{ODat1}$ |
| $_MComD_{12}$ | $\Gamma_S^{RefV1}$ | $[S^{RefV1}]$ | $\Gamma_L^{RefV1}$ | $P_{OComD11}\exp(-j\angle A_{LComD11})$ | $\Gamma_S^{ODat1}$ | $[S^{ODat1}]$ | $\Gamma_L^{ODat1}$ |
| $_MInc_{13}$ | $\Gamma_S^{Tx1}$ | $[S^{Tx1}]$ | $\Gamma_L^{Tx1}$ | $P_{OInc11}\exp(-j\angle A_{LInc11})$ | $\Gamma_S^{OInc1}$ | $[S^{OInc1}]$ | $\Gamma_L^{OInc1}$ |
| $_MComV_{13}$ | $\Gamma_S^{RefV1}$ | $[S^{RefV1}]$ | $\Gamma_L^{RefV1}$ | $P_{OComV11}\exp(-j\angle A_{LComV11})$ | $\Gamma_S^{OInc1}$ | $[S^{OInc1}]$ | $\Gamma_L^{OInc1}$ |
| $_OComF_{13}$ | $\Gamma_S^{RefF1}$ | $[S^{RefF1}]$ | $\Gamma_L^{RefF1}$ | $P_{OComF11}\exp(-j\angle A_{LComF11})$ | $\Gamma_S^{OInc1}$ | $[S^{OInc1}]$ | $\Gamma_L^{OInc1}$ |
| $_MLink_{23}$ | $\Gamma_S^{RefF2}$ | $[S^{RefF2}]$ | $\Gamma_L^{RefF2}$ | $T^{Link}P_{Link22}\exp(-j\angle A_{LComL22})$ | $\Gamma_S^{OInc1}$ | $[S^{OInc1}]$ | $\Gamma_L^{OInc1}$ |
| $_MDat_{23}$ | $\Gamma_S^{Tx1}$ | $[S^{Tx1}]$ | $\Gamma_L^{Tx1}$ | $\tilde{S}_{21M}P_{ODat22}\exp(-j\angle A_{LDat22})$ | $\Gamma_S^{ODat2}$ | $[S^{ODat2}]$ | $\Gamma_L^{ODat2}$ |
| $_MComD_{23}$ | $\Gamma_S^{RefV2}$ | $[S^{RefV2}]$ | $\Gamma_L^{RefV2}$ | $P_{OComD22}\exp(-j\angle A_{LComD22})$ | $\Gamma_S^{ODat2}$ | $[S^{ODat2}]$ | $\Gamma_L^{ODat2}$ |
| $_MInc_{23}$ | NA | NA | NA | NA | NA | NA | NA |
| $_MComV_{23}$ | $\Gamma_S^{RefV2}$ | $[S^{RefV2}]$ | $\Gamma_L^{RefV2}$ | $P_{OComV22}\exp(-j\angle A_{LComV22})$ | $\Gamma_S^{OInc2}$ | $[S^{OInc2}]$ | $\Gamma_L^{OInc2}$ |
| $_MComF_{23}$ | $\Gamma_S^{RefF2}$ | $[S^{RefF2}]$ | $\Gamma_L^{RefF2}$ | $P_{OComF22}\exp(-j\angle A_{LComF22})$ | $\Gamma_S^{OInc2}$ | $[S^{OInc2}]$ | $\Gamma_L^{OInc2}$ |
| $_MLink_{13}$ | $\Gamma_S^{RefF1}$ | $[S^{RefF1}]$ | $\Gamma_L^{RefF1}$ | $T^{Link}P_{LInc11}\exp(-j\angle A_{LComL11})$ | $\Gamma_S^{OInc2}$ | $[S^{OInc2}]$ | $\Gamma_L^{OInc2}$ |

When analyzing the signal-flow path for measured signal $_MDat_{13}$, it is assumed that signal source 24 (FIG. 1) produces signal $_STx_{33}$ having a sinusoidal waveform (i.e., a frequency-domain signal) of frequency $f_S$ and complex amplitude $A_S$. For convenience, we include the effects of directional couplers 364, 366, 312, and 356 (FIG. 2), variable attenuator 302 (FIG. 2), and switches 304 (FIG. 2) and 106 (FIG. 3) in S-matrix $[S^{Tx1}]$, that is modeled by S-parameters $S_{11}^{Tx1}$, $S_{12}^{TX1}$, $S_{21}^{Tx1}$, and $S_{22}^{Tx1}$. Recall that $[S^{Tx1}]$ also models the time-varying characteristics of Tx1 signal path 112 through high-frequency propagation medium 102. The error terms $\Gamma_S^{Tx1}$ and $\Gamma_L^{Tx1}$ model any mismatches at signal source 24 and at $_RDat_{11}$ directional coupler 124 in first probe 100.

The discussion now assumes that all of components in first and second probes 100 and 200 (FIGS. 2 and 3) are ideal, i.e., they exhibit infinite return losses and the theoretical insertion losses (the time-varying effects of switch 106 has already been included in $[S^{Tx1}]$). An S-parameter $\tilde{S}_{11M}$ represents the measured DUT 26 reflection coefficient, and it is assumed that the insertion loss along the path of signal $Dat_{1J}$ through probe 100 (i.e., through directional couplers 122 and 124), the input pad, mixer, and output pad of mixing circuit 128, and through combiner 146) is characterized by a parameter $P_{ODat11}$.

When signal $_R Dat_{11}$ enters data offset mixing circuit 128, it produces sum and difference frequencies, i.e., Equations (3) and (4), respectively. Since the sum frequency resides in the stopband of narrow-band crystal filter 454, only the difference-frequency signal $_O Dat_{11}$ will be included in the following discussion. In addition to the insertion loss of mixing circuit 128, the difference frequency signal $_O Dat_{11}$ will also experience a phase shift $\exp(-j\angle A_{LDat11})$, where $\angle A_{LDat11}$ is the phase of local-oscillator signal $_L Dat_{11}$. This phase shift must be represented explicitly in FIG. 8 since it may vary over time, while the error term $P_{ODat11}$ only accounts for static errors.

In order to simplify receiver Dat1 channel 404 analysis, the effects (return and insertion losses) of Dat1 channel 404 components (i.e., variable-gain amplifier 414, filter 424, IF mixer 434, pad 444, crystal filter 454, baseband mixer 464, amplifier 474, and lowpass filter 484) are included in the time-varying S-matrix $[S^{Dat1}]$. Here the signal undergoes two stages of down-conversion. However, this time we can include the phase shifts associated with IF signal source 438 and baseband signal source 468 in the time-varying S-matrix $[S^{Dat1}]$ since these effects will be removed via signal-normalization techniques. The error terms $\Gamma_S^{ODat1}$ and $\Gamma_L^{ODat1}$ account for the mismatches at the output of probe 100 (FIG. 3) and the input to ADC 494 (FIG. 5), respectively.

Due to the fact that the insertion loss through probe 100 (FIG. 3) is large (i.e., $-20\log_{10}|P_{ODat11}| > 30$ dB for all signal paths in probes 100 and 200), the signal that is reflected back into probe 100 by a mismatch in receiver Dat1 channel 404 will have negligible amplitude when it reaches transmitter 300 (FIG. 2). Thus, as shown in FIG. 8, the signal-flow path associated with the return signal in probe 100 is ignored, i.e., set to zero.

Figure 9:
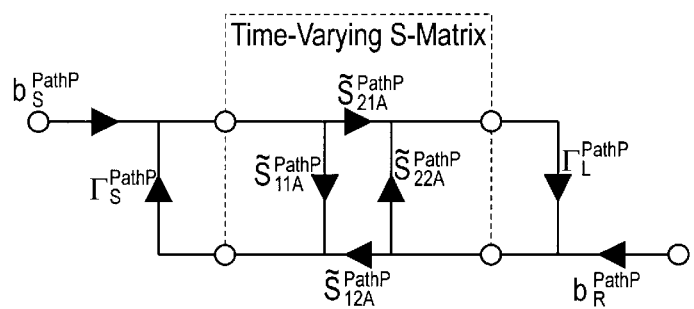
FIG. 9 shows a general signal-flow graph in accordance with a preferred embodiment of the present invention.

FIG. 9 shows a general signal-flow graph in accordance with a preferred embodiment of the present invention. The following discussion refers to FIGS. 2, 3, 5, 8, and 9.

The general signal-flow graph of Equation 11 may be used to investigate the effects of the transmitter and receiver circuits separately. The transmission coefficient $T^{PathP}$ for this signal-flow graph can be written as $$T^{PathP} = \frac{b_2^{PathP}}{b_S^{PathP}} \quad (11)$$

$$= \frac{\tilde{S}_{21}^{PathP}}{1 - \tilde{S}_{11}^{PathP}\Gamma_S^{PathP} - \tilde{S}_{22}^{PathP}\Gamma_L^{PathP} + \left(\tilde{S}_{11}^{PathP}\tilde{S}_{22}^{PathP} - \tilde{S}_{21}^{PathP}\tilde{S}_{12}^{PathP}\right)\Gamma_S^{PathP}\Gamma_L^{PathP}}.$$

Using this result, we find that the measured frequency-domain data signal $_M Dat_{13}$, which is part of composite signal $_B Dat_{13}$ sampled by ADC 494, can be written as $$_M Dat_{11} = A_S T^{Tx1} \tilde{S}_{11M} P_{ODat11} \exp(-\angle A_{LDat11}) T^{Dat1} G_{Dat1} \quad (12)$$

where $G_{Dat1}$ denotes the time-varying gain associated with the ADC 494, and $T^{Tx1}$ and $T^{Dat1}$ represent the time-varying transmission coefficients (Equation (11)) for the transmitter and data-receiver circuitry, respectively.

The result in Equation (12) is listed in the first row of Table 3. As discussed earlier, the signal-flow analyses for the other paths can be carried out in a similar manner, thus yielding the other results in Table 3 for the case of forward DUT signal measurements. The signal $_M Inc_{23}$ is not used for forward DUT signal measurements, but may be employed to monitor the time-varying load match, thereby avoiding the need for switch 206 and 50Ω loads 208 and 210 (FIG. 4).

TABLE 3

| Signal | Frequency-Domain Representation | $f_{PathP}$ |
|---|---|---|
| $_M Dat_{13}$ | $A_S T^{Tx1} \tilde{S}_{11M} P_{ODat11} \exp(-j\angle A_{LDat11}) T^{Dat1} G_{Dat1}$ | 510 Hz |
| $_M ComD_{13}$ | $A_S T^{RefV1} P_{OComD11} \exp(-j\angle A_{LComD11}) T^{Dat1} G_{Dat1}$ | 810 Hz |
| $_M Inc_{13}$ | $A_S T^{Tx1} P_{OInc11} \exp(-j\angle A_{LInc11}) T^{Inc1} G_{Inc1}$ | 700 Hz |
| $_M ComV_{13}$ | $A_S T^{RefV1} P_{OComV11} \exp(-j\angle A_{LComV11}) T^{Inc1} G_{Inc1}$ | 860 Hz |
| $_M ComF_{13}$ | $A_S T^{RefF1} P_{OComF11} \exp(-j\angle A_{LComF11}) T^{Inc1} G_{Inc1}$ | 310 Hz |
| $_M Link_{23}$ | $A_S T^{RefF2} P_{Link22} \exp(-j\angle A_{LComL22}) T^{Link} T^{Inc1} G_{Inc1}$ | 950 Hz |
| $_M Dat_{23}$ | $A_S T^{Tx1} \tilde{S}_{22M} P_{ODat22} \exp(-j\angle A_{LDat22}) T^{Dat2} G_{Dat2}$ | 680 Hz |
| $_M ComD_{23}$ | $A_S T^{RefV2} P_{OComD22} \exp(-j\angle A_{LComD22}) T^{Dat2} G_{Dat2}$ | 690 Hz |
| $_M Inc_{23}$ | NA | 980 Hz |
| $_M ComV_{23}$ | $A_S T^{RefV2} P_{OComV22} \exp(-j\angle A_{LComV22}) T^{Inc2} G_{Inc2}$ | 590 Hz |
| $_M ComF_{23}$ | $A_S T^{RefF2} P_{OComF22} \exp(-j\angle A_{LComF22}) T^{Inc2} G_{Inc2}$ | 250 Hz |
| $_M Link_{13}$ | $A_S T^{RefF2} P_{Link11} \exp(-j\angle A_{LComL11}) T^{Link} T^{Inc2} G_{Inc2}$ | 990 Hz |

Reverse DUT measurements can be made by switching switches 304 and 306 (FIG. 2), 106 (FIG. 3), and 206 (FIG. 4) to the reverse positions (opposite the positions shown in FIGS. 2, 3, and 4). This allows transmission signal $Tx_{33}$ to be directed to second probe 200. Due to the symmetry exhibited between forward and reverse DUT signal measurements, it is straightforward to determine the signal representations for the reverse case. These results are given in Table 4. For reverse signal measurements, signal $_M Inc_{11}$ remains unused.

TABLE 4

| Signal | Frequency-Domain Representation | $f_{PathP}$ |
|---|---|---|
| $_M Dat_{13}$ | $A_S T^{Tx2} \tilde{S}_{12M} P_{ODat11} \exp(-j\angle A_{LDat11}) T^{Dat1} G_{Dat1}$ | 510 Hz |
| $_M ComD_{13}$ | $A_S T^{RefV1} P_{OComD11} \exp(-j\angle A_{LComD11}) T^{Dat1} G_{Dat1}$ | 810 Hz |
| $_M Inc_{13}$ | NA | 700 Hz |
| $_M ComV_{13}$ | $A_S T^{RefV1} P_{OComV11} \exp(-j\angle A_{LComV11}) T^{Inc1} G_{Inc1}$ | 860 Hz |
| $_M ComF_{13}$ | $A_S T^{RefF1} P_{OComF11} \exp(-j\angle A_{LComF11}) T^{Inc1} G_{Inc1}$ | 310 Hz |
| $_M Link_{23}$ | $A_S T^{RefF2} P_{Link22} \exp(-j\angle A_{LComL22}) T^{Link} T^{Inc1} G_{Inc1}$ | 950 Hz |
| $_M Dat_{23}$ | $A_S T^{Tx2} \tilde{S}_{22M} P_{ODat22} \exp(-j\angle A_{LDat22}) T^{Dat2} G_{Dat2}$ | 680 Hz |
| $_M ComD_{23}$ | $A_S T^{RefV2} P_{OComD22} \exp(-j\angle A_{LComD22}) T^{Dat2} G_{Dat2}$ | 690 Hz |
| $_M Inc_{23}$ | $A_S T^{Tx2} P_{OInc22} \exp(-j\angle A_{LInc22}) T^{Inc2} G_{Inc2}$ | 980 Hz |
| $_M ComV_{23}$ | $A_S T^{RefV2} P_{OComV22} \exp(-j\angle A_{LComV22}) T^{Inc2} G_{Inc2}$ | 590 Hz |
| $_M ComF_{23}$ | $A_S T^{RefF2} P_{OComF22} \exp(-j\angle A_{LComF22}) T^{Inc2} G_{Inc2}$ | 250 Hz |
| $_M Link_{13}$ | $A_S T^{RefF2} P_{Link11} \exp(-j\angle A_{LComL11}) T^{Link} T^{Inc2} G_{Inc2}$ | 990 Hz |

Reference to Tables 3 and 4 shows that the phases associated with local-oscillator signals $_L Dat_{11}$, $_L ComD_{11}$, $_L Inc_{11}$, $_L ComV_{11}$, $_L ComF_{11}$, and $_L ComL_{11}$ (FIG. 3), and $_L Dat_{22}$, $_L ComD_{22}$, $_L Inc_{22}$, $_L ComV_{22}$, $_L ComF_{22}$, and $_L ComL_{22}$ (FIG. 4) appear in composite receiving signals $Inc_{1J}$, $Dat_{1J}$, $Dat_{2J}$, $Inc_{22}$, and $Link_{PJ}$ (FIG. 5). Since these phase terms are not common to two or more signals, direct signal normalization techniques cannot be used to remove the associated time-varying errors. In order to address this problem, TES network analyzer 22 uses a separate ADC converter 492 in LOSum channel 102 to measure the relative phases between signals. These phases are then subtracted from the measured data by processor 500 during the signal normalization procedure. The frequency-domain signal representations associated with LOSum channel 102 are given in Table 5.

TABLE 5

| Signal | Frequency-Domain Representation | $f_{LPathP}$ |
|---|---|---|
| $_M Dat_{13}$ | $\|A_{LDat11}\| \exp(-j\angle A_{LDat11}) P_{LDat11} G^{LO}$ | 99,800 Hz |
| $_M ComD_{13}$ | $\|A_{LComD11}\| \exp(-j\angle A_{LComD11}) P_{LComD11} G^{LO}$ | 99,500 Hz |
| $_M Inc_{13}$ | $\|A_{LInc11}\| \exp(-j\angle A_{LInc11}) P_{LInc11} G^{LO}$ | 99,610 Hz |
| $_M ComV_{13}$ | $\|A_{LComV11}\| \exp(-j\angle A_{LComV11}) P_{LComV11} G^{LO}$ | 99,450 Hz |
| $_M ComF_{13}$ | $\|A_{LComF11}\| \exp(-j\angle A_{LComF11}) P_{LComF11} G^{LO}$ | 100,000 Hz |
| $_M Link_{23}$ | $\|A_{LComL11}\| \exp(-j\angle A_{LComL11}) P_{LComL11} G^{LO}$ | 99,360 Hz |
| $_M Dat_{23}$ | $\|A_{LDat22}\| \exp(-j\angle A_{LDat22}) P_{LDat22} G^{LO}$ | 99,630 Hz |
| $_M ComD_{23}$ | $\|A_{LComD22}\| \exp(-j\angle A_{LComD22}) P_{LComD22} G^{LO}$ | 99,620 Hz |
| $_M Inc_{23}$ | $\|A_{LInc22}\| \exp(-j\angle A_{LInc22}) P_{LInc22} G^{LO}$ | 99,330 Hz |
| $_M ComV_{23}$ | $\|A_{LComV22}\| \exp(-j\angle A_{LComV22}) P_{LComV22} G^{LO}$ | 99,720 Hz |
| $_M ComF_{23}$ | $\|A_{LComF22}\| \exp(-j\angle A_{LComF22}) P_{LComF22} G^{LO}$ | 100,060 Hz |
| $_M Link_{13}$ | $\|A_{LComL22}\| \exp(-j\angle A_{LComL22}) P_{LComL22} G^{LO}$ | 99,320 Hz |

Analytical representations of the various signals that are extracted from the appropriate bins in the FFT after transforming the digital signals in TES network analyzer 22 having been obtained, signal normalization techniques may be used to remove both static and dynamic errors associated with the components through which both the data and normalization signals pass. Starting with forward DUT signal measurements, S-parameter $S_{11}$ involves the ratio of measured reflected DUT signal $_M Dat_{13}$ and measured incident DUT signal $_M Inc_{13}$. Reference to Table 3 shows that the ratio $_M Dat_{13}$: $_M Inc_{13}$ yields a result that is proportional to the desired S-parameter, but the result still contains dynamic errors associated with the phases of local-oscillator signals $_L Dat_{1J}$ and $_L Inc_{1J}$, the Dat1 and Inc1 receiver channels 404 and 403, and ADCs 494 and 493, respectively. However, this normalization process does remove any dynamic errors associated with signal source 24 (i.e., As), the port-1 transmitter circuitry (i.e., $T^{Tx1}$), and phase errors associated with IF signal source 438 and baseband signal source 468.

Further signal normalization is required to remove the remaining dynamic errors. If measured common signals $_M ComD_{13}$ and $_M ComV_{13}$ are included in the normalization, and their phases (via $_L Sum_{33}$ signal) are subtracted, then all of the dynamic error terms may be removed, i.e., $$S_{11M} = \frac{_M Dat_{13}}{_M ComD_{13}} \frac{_M ComV_{13}}{_M Inc_{13}} \frac{\exp[j(\angle A_{LDat11} + \angle A_{LComV11})]}{\exp[j(\angle A_{LComD11} + \angle A_{LInc11})]} \quad (13)$$

$$= \tilde{S}_{11M} \frac{P_{MDat13}}{P_{MComD13}} \frac{P_{MComV13}}{P_{MInc13}}.$$

The static-error terms associated with the paths (i.e., $P_{PathP}$) in first probe 100 (FIG. 3) have been absorbed into the definition of $S_{11M}$. As is shown hereinafter, these static errors are removed via static-error suppression techniques, thereby yielding the true S-parameter, $S_{11A}$.

A similar procedure may be employed to find the second forward S-parameter, $S_{21}$. However, since this S-parameter involves the ratio of the transmitted wave $_M Dat_{23}$ and the incident wave $_M Inc_{13}$, the normalization signals on the two sides of DUT 26 must be linked together. This is accomplished via reciprocal link leg $Link_{PJ}$ (i.e., Link channel 401 and Link signal path 140/240) and fixed-common signals $ComF_{PP}$ in TES network analyzer 22. The overall transmission coefficient of reciprocal link leg $Link_{PJ}$ is $T^{Link}$. If the dynamic transmission coefficients $[S^{Link1}]$ (FIG. 3) and $[S^{Link2}]$ (FIG. 4) associated with the reciprocal link leg can be measured, then the result may be used to provide the necessary amplitude and phase references between first and second ports 30 and 32 of DUT 26. It may be shown that transmission coefficient $T^{Link}$ may be accurately measured by taking the ratio of four signals as shown below:

$$T^{Link} = \sqrt{\frac{_M Link_{23} \; _M Link_{13} \; \exp[j(\angle A_{LComL22} + \angle A_{LComL11})]}{_M ComF_{13} \; _M ComF_{23} \; \exp[j(\angle A_{LComF11} + \angle A_{LComF22})]}} \quad (14)$$

$$= \tilde{T}^{Link} \sqrt{\frac{P_{MLink23} \; P_{MLink13}}{P_{MComF13} \; P_{MComF23}}}.$$

Once again, the static errors associated with the paths in first and second probes 100 and 200 are lumped into $T^{Link}$. Note that all of the time-varying errors associated with the individual signals in Equation (14) are removed by the above normalization procedure (see Table 3).

Now that the link has been established between first and second ports 30 and 32, the dynamic errors can be removed from the measured DUT transmission coefficient using $$S_{21M} = \frac{1}{T^{Link}} \frac{_M Link_{23}}{_M Inc_{13}} \frac{_M Dat_{23}}{_M ComD_{23}} \frac{_M ComV_{23}}{_M ComF_{23}} \frac{\exp[j(\angle A_{LComL22} + \angle A_{LDat22} + \angle A_{LComV22})]}{\exp[j(\angle A_{LInc11} + \angle A_{LComD22} + \angle A_{LComF22})]} \quad (15)$$

$$= \tilde{S}_{21M} \frac{P_{MDat23}}{P_{MComD23}} \frac{P_{MComV23}}{P_{MInc13}} \sqrt{\frac{P_{MLink23} \; P_{MComV23}}{P_{MLink13} \; P_{MComF23}}}.$$

Since, all of the signals that are employed in Equations (13), (14), and (15) are measured simultaneously by ADCs 492–497, both S-parameters may be measured simultaneously.

A similar procedure may be used to measure the reverse S-parameters. This time the signal representations in Table 4 are employed. The normalization equations for the reverse S-parameters are given below:

$$S_{22M} = \frac{_M Dat_{23}}{_M ComD_{23}} \frac{_M ComV_{23}}{_M Inc_{23}} \frac{\exp[j(\angle A_{LDat22} + \angle A_{LComV22})]}{\exp[j(\angle A_{LComD22} + \angle A_{LInc22})]} \quad (16)$$

$$= \tilde{S}_{22M} \frac{P_{MDat23}}{P_{MComD23}} \frac{P_{MComV23}}{P_{MInc23}};$$

-continued $$T^{Link} = \sqrt{\frac{{}_M Link_{23} \; {}_M Link_{13} \; \exp[j({}_LA_{LComL22} + {}_LA_{LComL11})]}{{}_M ComF_{13} \; {}_M ComF_{23} \; \exp[j({}_LA_{LComF11} + {}_LA_{LComF22})]}} \quad (17)$$

$$= \tilde{T}^{Link} \sqrt{\frac{P_{MLink23} \; P_{MLink13}}{P_{MComF13} \; P_{MComF23}}} \; ; \text{ and}$$

$$S_{12M} = \frac{1}{T^{Link}} \frac{{}_M Link_{13} \; {}_M Dat_{13} \; {}_M Com V_{13} \; \exp[j({}_LA_{LComL11} + {}_LA_{LDat11} + {}_LA_{LComV11})]}{{}_M Inc_{23} \; {}_M Com D_{13} \; {}_M Com F_{13} \; \exp[j({}_LA_{LLinc22} + {}_LA_{LComD11} + {}_LA_{LComF11})]}. \quad (18)$$

Since signal-normalization techniques suppress all the static and dynamic linear errors associated with the components through which both the data and normalization signals pass, the only errors that remain after signal normalization are those in probes 100 and 200. In the analysis hereinbefore, these components were assumed to be ideal.

Figure 10:
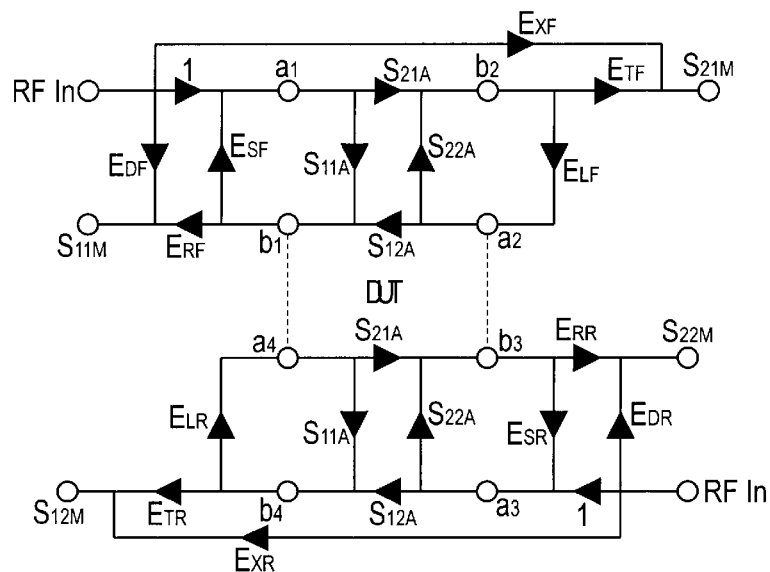
FIG. 10 shows a two-port 12-term error-correction model in accordance with a preferred embodiment of the present invention.

FIG. 10 shows a two-port 12-term error-correction model in accordance with a preferred embodiment of the present invention. The error-correction model of FIG. 10 accounts for directivity errors $E_{DF}$ and $E_{DR}$, reflection tracking errors $E_{RF}$ and $E_{RR}$, transmission tracking errors $E_{TF}$ and $E_{TR}$, source mismatch errors $E_{SF}$ and $E_{SR}$, load mismatch errors $E_{LF}$ and $E_{LR}$, and isolation errors $E_{XF}$ and $E_{XR}$.

Since the errors modeled by these systematic error terms must be repeatable, it is crucial to minimize the drift errors associated with all of the components in probes 100 and 200 (FIGS. 3 and 4). For this reason, the mixing circuits in probes 100 and 200 use double-balanced, ring-diode mixers, known to be very stable devices exhibiting minimal amplitude and phase drift. Furthermore, all other components in probes 100 and 200 are passive devices, and therefore do not contribute to significant signal amplitude and phase drift.

In applications that demand either high-accuracy or high-frequency measurements, where even a small amount of thermal expansion may lead to noticeable phase shift, probes 100 and 200 may be temperature stabilized. Temperature stabilization of probes 100 and 200 would be relatively easy since none of the components therein dissipate large amounts of heat and are all located in a relatively small volume. If temperature-stabilization is employed for probes 100 and 200, then it is not necessary to closely regulate ambient room temperature. Either way, it may be assumed that the circuit components in probes 100 and 200 produce only repeatable systematic errors, and can therefore be modeled by the previously discussed systematic-error terms.

Application of signal-flow analysis techniques to the error-correction model in FIG. 10 yields the expressions for the "actual" S-parameters for DUT 26 listed below as $$S_{11A} = \quad (19)$$

$$\frac{\left(\frac{S_{11M} - E_{DF}}{E_{RF}}\right)\left[1 + \left(\frac{S_{22M} - E_{DR}}{E_{RR}}\right)E_{SR}\right] - \left(\frac{S_{21M} - E_{XF}}{E_{TF}}\right)\left(\frac{S_{12M} - E_{XR}}{E_{TR}}\right)E_{LF}}{\left[1 + \left(\frac{S_{11M} - E_{DF}}{E_{RF}}\right)E_{SF}\right]\left[1 + \left(\frac{S_{22M} - E_{DR}}{E_{RR}}\right)E_{SR}\right] - \left(\frac{S_{21M} - E_{XF}}{E_{TF}}\right)\left(\frac{S_{12M} - E_{XR}}{E_{TR}}\right)E_{LF}E_{LR}},$$

-continued $$S_{21A} = \quad (20)$$

$$\frac{\left[1 + \left(\frac{S_{22M} - E_{DR}}{E_{RR}}\right)(E_{SR} - E_{LF})\right]\left(\frac{S_{21M} - E_{XF}}{E_{TF}}\right)}{\left[1 + \left(\frac{S_{11M} - E_{DF}}{E_{RF}}\right)E_{SF}\right]\left[1 + \left(\frac{S_{22M} - E_{DR}}{E_{RR}}\right)E_{SR}\right] - \left(\frac{S_{21M} - E_{XF}}{E_{TF}}\right)\left(\frac{S_{12M} - E_{XR}}{E_{TR}}\right)E_{LF}E_{LR}},$$

$$S_{12A} = \quad (21)$$

$$\frac{\left[1 + \left(\frac{S_{11M} - E_{DF}}{E_{RF}}\right)(E_{SF} - E_{LR})\right]\left(\frac{S_{12M} - E_{XR}}{E_{TR}}\right)}{\left[1 + \left(\frac{S_{11M} - E_{DF}}{E_{RF}}\right)E_{SF}\right]\left[1 + \left(\frac{S_{22M} - E_{DR}}{E_{RR}}\right)E_{SR}\right] - \left(\frac{S_{21M} - E_{XF}}{E_{TF}}\right)\left(\frac{S_{12M} - E_{XR}}{E_{TR}}\right)E_{LF}E_{LR}},$$

and $$S_{22A} = \quad (22)$$

$$\frac{\left(\frac{S_{22M} - E_{DR}}{E_{RR}}\right)\left[1 + \left(\frac{S_{11M} - E_{DF}}{E_{RF}}\right)E_{SF}\right] - \left(\frac{S_{21M} - E_{XF}}{E_{TF}}\right)\left(\frac{S_{12M} - E_{XR}}{E_{TR}}\right)E_{LR}}{\left[1 + \left(\frac{S_{11M} - E_{DF}}{E_{RF}}\right)E_{SF}\right]\left[1 + \left(\frac{S_{22M} - E_{DR}}{E_{RR}}\right)E_{SR}\right] - \left(\frac{S_{21M} - E_{XF}}{E_{TF}}\right)\left(\frac{S_{12M} - E_{XR}}{E_{TR}}\right)E_{LF}E_{LR}}.$$

If a SOLT calibration technique is employed, then the static error coefficients can be computed using $$E_{DF} = S_{11M}^I, \quad (23)$$

$$E_{DR} = S_{22M}^L, \quad (24)$$

$$E_{RF} = \frac{2[S_{11M}^O - E_{DF}][S_{11M}^S - E_{DF}]}{S_{11M}^S - S_{11M}^O}, \quad (25)$$

$$E_{RR} = \frac{2[S_{22M}^O - E_{DR}][S_{22M}^S - E_{DR}]}{S_{22M}^S - S_{22M}^O}, \quad (26)$$

$$E_{SF} = \frac{2E_{DF} - S_{11M}^O - S_{11M}^S}{S_{11M}^S - S_{11M}^O}, \quad (27)$$

-continued $$E_{SR} = \frac{2E_{DR} - S_{22M}^O - S_{22M}^S}{S_{22M}^S - S_{22M}^O},\tag{28}$$

$$E_{XF} = S_{21M}^I,\tag{29}$$

$$E_{XR} = S_{12M}^I,\tag{30}$$

$$E_{TF} = \frac{E_{RF}(S_{21M}^T - E_{XF})}{E_{SF}(S_{11M}^T - E_{DF}) + E_{RF}},\tag{31}$$

$$E_{TR} = \frac{E_{RR}(S_{12M}^T - E_{XR})}{E_{SR}(S_{22M}^T - E_{DR}) + E_{RR}},\tag{32}$$

$$E_{LF} = \frac{1}{E_{SF}} - \frac{E_{RF}}{[E_{SF}(S_{11M}^T - E_{DF}) + E_{RF}]E_{SF}}, \text{ and}\tag{33}$$

$$E_{LR} = \frac{1}{E_{SR}} - \frac{E_{RR}}{[E_{SR}(S_{22M}^T - E_{DR}) + E_{RR}]E_{SR}}.\tag{34}$$

However, before Equations (19)–(22) may be employed, the error coefficients must be calculated by making a set of measurements on a set of known loads (i.e., precise standards). A sufficient number of precise standards must be used in order to back-out the various error coefficients in the error model. The most common technique involves measurement of a Short circuit, an Open circuit, a matched Load, and a Through (SOLT). If we denote the measured S-parameters for a given DUT by $S_{p1M}{}^d$, where i=1,2 denotes the transmitter port, p=1,2 denotes the receiver port, and d=S,O,L,T,I denotes the type of DUT employed in the calibration, then the expressions Equations (23)–(34) for the systematic-error terms can be calculated from the measured S-parameters. The case d=I indicates that the proper DUTs have been connected for the isolation measurements.

Note that the results that are computed using Equations (13), (15), (16), and (18) are substituted for the measured S-parameters in Equations (19)–(34).

Those skilled in the art will appreciate that while a full two-port error model has been employed in the TES-technique proof-of-principle exemplary embodiment discussed herein, simpler error models (e.g., one-port reflection or 2-port transmission response error models) may also have been employed in the TES technique. The use of other error models does not depart from the spirit of the present invention.

Random errors may consist of thermal noise, shot noise, and electromagnetic interference. The TES incorporates random-error suppression techniques such as stacking or signal averaging, filtering, oversampling, lock-in amplifiers, and synchronous detection. In all of these approaches, substantial random-noise reduction requires long integration times. With the TES technique, system response drift is eliminated. This allows the use of virtually unlimited integration times and therefore unlimited reduction in random noise errors.

Phase noise is a performance-limiting factor in applications where a weak signal must be detected in the presence of a stronger, interfering signal. In TES network analyzer 22, multiple signals reside at different frequencies and varying signal levels, and are simultaneously detected on a single receiver channel. TES network analyzer 22 minimizes the effects of phase noise interference by maintaining the levels of signals $_M\text{Inc}_{13}$, $_M\text{ComV}_{13}$, $_M\text{ComF}_{13}$, and $_M\text{ComL}_{23}$ ($_M\text{Link}_{23}$), signals $_M\text{Dat}_{13}$ and $_M\text{ComD}_{13}$, signals $_M\text{Dat}_{23}$ and $_M\text{ComD}_{13}$, and signals $_M\text{Inc}_{23}$, $_M\text{ComV}_{23}$, $_M\text{ComF}_{23}$, and $_M\text{ComL}_{13}$ ($_M\text{Link}_{13}$) within composite signals $\text{Inc}_{1J}$, $\text{Dat}_{1J}$, $\text{Dat}_{2J}$, and $\text{Inc}_{2J}$, respectively, within ±15 dB of each other. However, phase noise can still present problems in high-frequency applications where the source has a phase-noise level that is greater than −75 dBc at the location of the next frequency bin having a valid signal (i.e., after Fourier transformation). In such cases, a phase-noise error suppression by subtraction technique may be employed.

The basic idea behind the phase-noise error suppression by subtraction technique is to measure the complex amplitude of the phase noise relative to source signal $_S\text{TX}_{33}$ in dedicated PN channel 407 containing a single signal. This information is then used to extract the phase-noise contamination in other channels 403–406 containing multiple signals. It is assumed that the differences between the time delays associated with signal propagation along channels 403–407 are small in comparison to the data acquisition time of ADCs 493–497. Furthermore, it is assumed that all signals are simultaneously measured by ADCs 493–497. With these assumptions, the phase-noise suppression by subtraction technique works since all signals are derived from a common high-frequency signal $\text{Tx}_{33}$ whose source 24 is the cause of the phase-noise contamination. Down-conversion sources 438 and 468 may also contribute appreciable amounts of phase noise to the system. However, phase noise contributed by down-conversion sources 438 and 468 is common to all signals and may be monitored and removed. Signals from local-oscillator module 354, which are not common to all measured signals, contribute negligible levels of phase-noise contamination, and may therefore be ignored.

Referring to FIGS. 2 and 5, the effects of down-conversion and filtering in PN channel 407 may be readily understood. Extracted phase-noise signal $_x\text{PN}_{33}$ is extracted from source signal $_S\text{Tx}_{33}$ by coupler 356. Signal $_x\text{PN}_{33}$ resides at substantially predetermined frequency $f_S$ of source signal $_S\text{Tx}_{33}$. Mixing circuit 358 mixes signal $_x\text{PN}_{33}$ with local-oscillator phase-noise offset signal $_L\text{PN}_{33}$ having a frequency $f_{LO}$. This produces the upper and lower sidebands at frequencies $f_S+f_{LO}$ and $f_S-f_{LO}$ (see Equations (3) and (4)).

It is the lower sideband having a frequency of $f_S-f_{LO}$ that is desired (the upper sideband will be filtered out). It is assumed signal source 24 produces −80 dBc/Hz phase noise 10 kHz from predetermined frequency $f_S$, and −110 dBc/Hz phase noise 100 kHz from $f_S$. Thus, using offset local-oscillator signals with frequencies of approximately 100 kHz assures that the phase noise contamination from the upper sideband will be at least −110 dBc/Hz at the location of the desired lower sideband.

IF down-conversion mixer 437 mixes the upper and lower sideband signals with IF source signal $_S\text{IF}_{33}$ having a frequency of $f_{IF}$. This produces four distinct signals having frequencies of $f_S-f_{IF}-f_{LO}$, $f_S-f_{IF}+f_{LO}$, $f_S+f_{IF}-f_{LO}$, and $f_S+f_{IF}+f_{LO}$ (see Equations (5)–(8)). High-Q crystal bandpass filter 457 has a 2 kHz bandwidth and passes the desired signal of frequency $f_S-f_{IF}-f_{LO}$, while rejecting the other unwanted signals including the phase noise that wraps around DC.

The relative level of the phase noise that is measured in PN channel 407 at a frequency offset $f_\Delta$ from the carrier frequency is defined as $$\Phi_M(f_\Delta) = \frac{Sig \, \Phi_M(f_{carrier} - f_\Delta)}{Sig \, \Phi_M(f_{carrier})}.\tag{35}$$

In the above expression, $\text{Sig}\Phi_M(f)$ denotes the signal that is measured on PN channel 407 at the frequency f. Note that the normalization in Equation (35) removes the amplitude and phase dependencies associated with signal source 24, IF signal source 438, baseband signal source 468, and local-oscillator module 354. One of the other receiver channels 403–406 is chosen that contains multiple simultaneous frequency-offset signals, i.e., K signals. The frequency-domain representation for the J-th frequency-offset signal, measured at its carrier frequency $f_J$, can be represented analytically by $$\text{Sig}J_M(f_J) = \text{Sig}J_A(f_J) + \sum_{\substack{K=1 \\ K \neq J}}^{K} C_J^K \Phi_M(f_K - f_J) \text{Sig}K_A(f_K); \quad (36)$$

where J=1,2, ... ,K, and where $\text{Sig}J_A(f_J)$ denotes the actual (i.e., uncontaminated) value of the J-th signal at the frequency $f_J$, $\text{Sig}K_A(f_K)$ denotes the actual value of the K-th (for K≠J) signal at its carrier frequency $f_K$, and the constants $C_J^K$ model the static errors that result from the nonideal and nonidentical components that are used in this receiver channel and PN channel 407. The above equation can be written in matrix form as $$\begin{bmatrix} \text{Sig}1_M(f_1) \\ \text{Sig}2_M(f_2) \\ \vdots \\ \text{Sig}K_M(f_K) \end{bmatrix} = \begin{bmatrix} 1 & C_1^2\Phi_M(f_2-f_1) & \cdots & C_1^K\Phi_M(f_K-f_1) \\ C_2^1\Phi_M(f_1-f_2) & 1 & \cdots & C_2^K\Phi_M(f_K-f_2) \\ \vdots & \vdots & \ddots & \vdots \\ C_K^1\Phi_M(f_1-f_K) & C_K^2\Phi_M(f_2-f_K) & \cdots & 1 \end{bmatrix} \begin{bmatrix} \text{Sig}1_A(f_1) \\ \text{Sig}2_A(f_2) \\ \vdots \\ \text{Sig}K_A(f_K) \end{bmatrix} \quad (37)$$

The desired actual signal levels can be determined from the measured phase-noise contaminated signals by solving this system of simultaneous equations, i.e., $$\begin{bmatrix} \text{Sig}1_A(f_1) \\ \text{Sig}2_A(f_2) \\ \vdots \\ \text{Sig}K_A(f_K) \end{bmatrix} = \begin{bmatrix} 1 & C_1^2\Phi_M(f_2-f_1) & \cdots & C_1^K\Phi_M(f_K-f_1) \\ C_2^1\Phi_M(f_1-f_2) & 1 & \cdots & C_2^K\Phi_M(f_K-f_2) \\ \vdots & \vdots & \ddots & \vdots \\ C_K^1\Phi_M(f_1-f_K) & C_K^2\Phi_M(f_2-f_K) & \cdots & 1 \end{bmatrix}^{-1} \begin{bmatrix} \text{Sig}1_M(f_1) \\ \text{Sig}2_M(f_2) \\ \vdots \\ \text{Sig}K_M(f_K) \end{bmatrix} \quad (38)$$

Before this matrix equation can be employed, the static calibration constants, $C_J^K$ must be found. These constants are obtained during a static calibration procedure that is performed prior to taking measurements. This phase-noise calibration procedure. is carried out before the data have been collected for the 12-term static calibration procedure. In order to extract the calibration constants, each of the signals 20 are collected separately in the absence of the other interfering signals. If all of the signals, with the exception of the U-th signal, are turned off in the receiver channel, then Equation (36) can be used to show that the ratio of the phase noise at the location of the V-th signal and the carrier signal can be written as $$\text{Rat}_{V/U}^{Uonly} = \begin{bmatrix} \dfrac{\text{Sig}\,V_M(f_V)}{\text{Sig}\,U_M(f_U)} \end{bmatrix}^{Uonly} \quad (39)$$

$$= C_V^U \Phi_M(f_U - f_V).$$

The desired calibration coefficients can then be obtained via $$C_V^U = \frac{\text{Rat}_{V/U}^{Uonly}}{\Phi_M(f_U - f_V)}, \quad (40)$$

where $\Phi_M(f_U - f_V)$ is measured in PN channel 407 (see Equation (35)). Note that signals $\text{Dat}_{PJ}$ and $\text{Inc}_{PJ}$ may be set to zero by opening switches 106 (FIG. 3) and 206 (FIG. 4). Signals $\text{ComD}_{PP}$ and $\text{ComV}_{PP}$ (FIGS. 3 and 4) may be removed using variable attenuators 322 and 324 (FIG. 2). In a similar manner, signals $\text{ComF}_{PP}$ and $\text{Link}_{PJ}$ (FIGS. 3 and 4) may be removed using variable attenuators 318 and 320 (FIG. 2). Unfortunately, when one of these attenuators is set to a large value, both signals $\text{ComF}_{PP}$ and $\text{Link}_{PJ}$ are removed. In order to only turn off one of these signals during the calibration process, the appropriate local-oscillator source may be turned off, thereby turning the corresponding mixing circuit into an attenuator. As long as the calibration procedure is carried out relatively quickly, this lack of applied local-oscillator signal will not result in measurable temperature or signal drift in the mixing circuit.

In order to accurately measure the calibration coefficients via Equation (40), it is necessary to accurately measure both $\text{Rat}_{V/U}^{Uonly}$ and $\Phi_M(f_U - f_V)$. Since the phase-noise sidebands are typically small relative to the size of the carrier, it is difficult to measure these signals accurately. In order to improve the accuracy of these measurements, mixer 362 can be used to simulate higher level phase noise side-bands during the calibration procedure. The local-oscillator signal frequency for mixer 362 is set to $f_{LOCal} = f_U - f_V$ during the calibration procedure.

The TES technique involves a multilevel calibration technique that consists of static, dynamic, phase-noise, and random error suppression techniques. After the time-domain signals are measured by ADCs 492–497, processor 500 (FIG. 7) uses FFT routine 510 to find the complex amplitudes for frequency-domain signals $_M\text{Dat}_{13}$, $_M\text{ComD}_{13}$, $_M\text{Inc}_{13}$, $_M\text{ComV}_{13}$, $_M\text{ComF}_{13}$, $_M\text{ComL}_{23}$ ($_M\text{Link}_{23}$), $_M\text{Dat}_{23}$, $_M\text{ComD}_{23}$, $_M\text{Inc}_{23}$, $_M\text{ComV}_{23}$, $_M\text{ComF}_{23}$, and $_M\text{ComL}_{23}$ ($_M\text{Link}_{13}$), as listed in Table 3. In order to remove the phase-noise contamination from these signals, the phase-noise suppression by subtraction technique (see Equation (38)) is applied to signals $_M\text{Inc}_{13}$, $_M\text{ComV}_{13}$, $_M\text{ComF}_{13}$, and $_M\text{ComL}_{23}$ ($_M\text{Link}_{23}$), signals $_M\text{Dat}_{13}$ and $_M\text{ComD}_{13}$, signals $_M\text{Dat}_{23}$ and $_M\text{ComD}_{13}$, and signals $_M\text{Inc}_{23}$, $_M\text{ComV}_{23}$, $_M\text{ComF}_{23}$, and $_M\text{ComL}_{13}$ ($_M\text{Link}_{13}$) within composite signals $\text{Inc}_{1J}$, $\text{Dat}_{1J}$, $\text{Dat}_{2J}$, and $\text{Inc}_{2J}$, respectively, in receiver channels 403, 404, 405, and 406. The signal and its associated phase-noise sidebands appearing in PN channel 407 are used to compute the relative phase noise (see Equation (35)) that is required in Equation (38). Once computed using Equation (38), then the phase-noise-corrected, actual signals are inserted into the TES signal normalization equations (13)–(18), which remove the dynamic errors and some of the static errors, thereby yielding the measured S-parameters. The remaining static errors associated with the components in probes 100 and 200 are suppressed by substituting the calculated, measured S-parameters into equations (19)–(22), thus producing the actual S-parameters for DUT 26.

Figure 11:
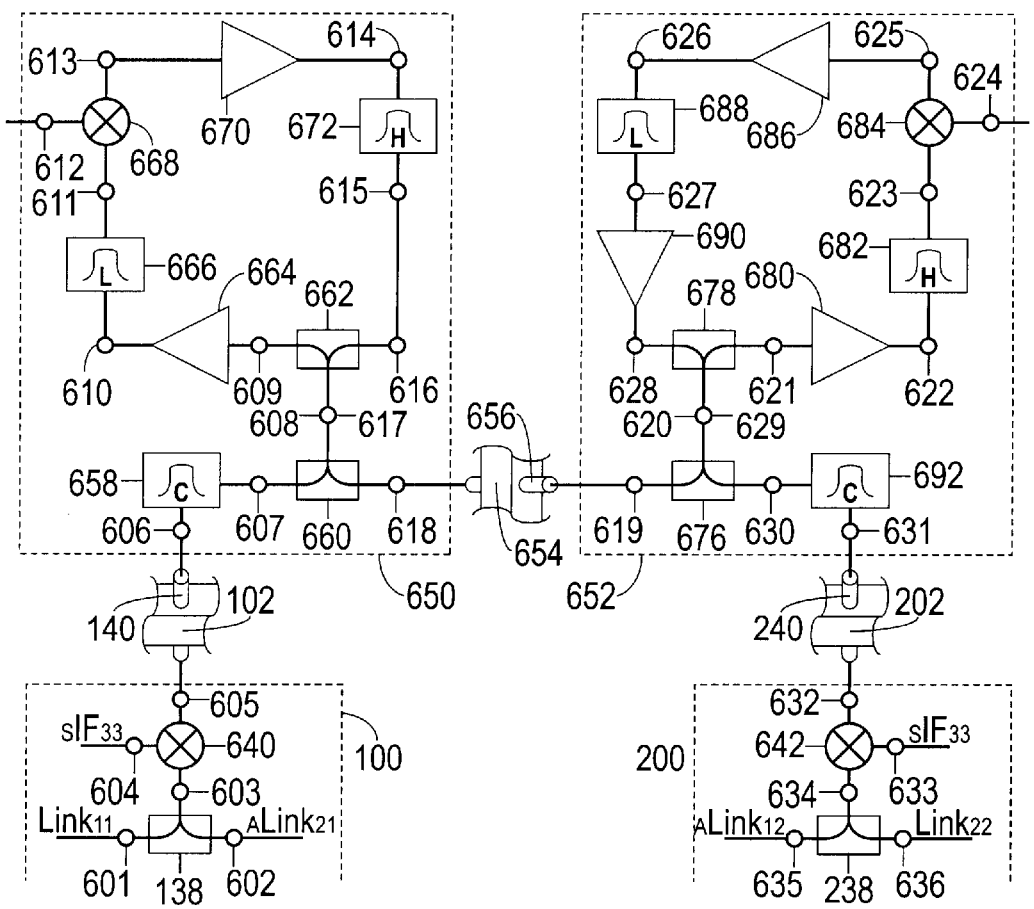
FIG. 11 shows a simplified schematic diagram of a reciprocal amplification circuit for a Link channel of the network analyzer of FIG. 1 in accordance with an alternative preferred embodiment of the present invention.
Figure 12:
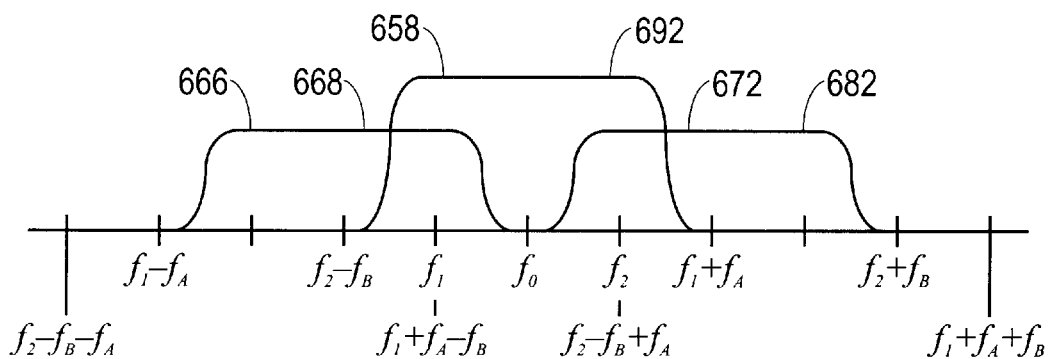
FIG. 12 shows a chart depicting relative frequencies for signals in the reciprocal amplification circuit of FIG. 11 in accordance with an alternative preferred embodiment of the present invention.

FIG. 11 shows a simplified schematic diagram of a reciprocal amplification circuit 600 for Link signal path 140/240 of TES network analyzer 22, and FIG. 12 shows a chart depicting relative frequencies for signals in reciprocal amplification circuit 600 in accordance with an alternative preferred embodiment of the present invention. The following discussion refers to FIGS. 11 and 12.

As is discussed hereinbefore, signal normalization techniques can be used to suppress static and dynamic errors associated with the components in first probe 100 (FIG. 3), second probe 200 (FIG. 4), transmitter 300 (FIG. 2), and receiver 400 (FIG. 5) through which both the data and normalization signals flow. In TES network analyzer 26, a reciprocal link leg (Link signal path 140/240 in FIGS. 3, 4, and 5) was employed to achieve accurate phase and magnitude references between ports 100 and 200. Two signals $Link_{1J}$ and $Link_{2J}$ (where J=1,2,3), which exist at different frequencies, simultaneously flow in opposite directions through the reciprocal link leg. The amplitude and phase references between probes 100 and 200 (i.e., the transmission coefficient $T_{Link}$ on the link leg) are measured by combining link signals $Link_{1J}$ and $Link_{2J}$ with fixed-reference signals, as shown in Equation (14).

The pads for signals $Link_{11}$, $Link_{21}$, and $Link_{P1}i$, i.e. the output pad of mixing circuit 130, pad 162, and pad 160, respectively, serve to isolate first probe 100 from time-variations in the reflection properties associated with Link1 signal path 140 (FIG. 3). Similarly, the pads for signals $Link_{22}$, $Link_{12}$, and $Link_{P2}$, i.e. the output pad of mixing circuit 230, pad 262, and pad 260, respectively, serve to isolate second probe 200 from time-variations in the reflection properties associated with Link2 signal path 240 (FIG. 4). Because of this, the $Link_{PJ}$ (where P=1,2 and J=P,3) signal levels at the outputs of four-way combiners 142 and 242 is −62 dBm. When choosing the levels for the signals that are combined in the Inc1 and Inc2 receiver channels 403 and 406, this relatively low level for link signals $Link_{PJ}$ places a limit on how large the other signal levels in channels 403 and 406 may be. This may cause a problem at high frequencies where link signals $Link_{PJ}$ would suffer much greater cable losses. In this instance, it would be desirable to amplify link signals $Link_{PJ}$.

The signal normalization procedure depends on having a reciprocal link leg, i.e., bidirectional Link signal path 140/240. Therefore, conventional amplifiers, being unidirectional, cannot be placed directly in Link signal path 140/240. Reciprocal-amplification circuit 600 of FIG. 11 may be employed. Note that this circuit will receive link signals $Link_{1J}$ and $Link_{2J}$ from probes 100 and 200, amplify them, and send them to probes 200 and 100, respectively, even though they are simultaneously propagating over Link signal path 140/240 in opposite directions. The presence of both signals $Link_{1J}$ and $Link_{2J}$ at both probes 100 and 200 will not pose difficulties since each signal $Link_{1J}$ and $Link_{2J}$ is used only in the probe 100 or 200 in which it was not generated, i.e., $Link_{1J}$, being generated in first probe 100 (as signal $Link_{11}$), is only used in second probe 200 (as signal $Link_{12}$.) Referring to FIG. 11, reciprocal amplification circuit 600 is interposed within Link signal path 140/240 in receiver 400, dividing Link signal path 140/240 into a port-1 part (Link1 signal path 140) and a port-2 part (Link2 signal path 240).

To understand the operation of reciprocal-amplification circuit 600, it is necessary to follow the progress of signals $Link_{1J}$ and $Link_{2J}$ through the circuit. To facilitate this, "measurement" points 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 633, 634, 635, and 636 have been placed in circuit 600, with points 606 and 631 serving as i/o ports for circuit 600. Also, an abbreviated nomenclature will be used to simplify this discussion.

Signals $Link_{11}$ and $Link_{22}$ have different frequencies. In the discussion of reciprocal-amplification circuit 600, these frequencies shall be referred to as $f_{L1}$ and $f_{L2}$, respectively, where $f_{L1} \neq f_{L2}$. Frequencies $f_{L1}$ and $f_{L2}$ are each derived from and source signal $_sTx_{33}$ (FIGS. 2, 3, and 4) and are proximate source signal $_sTx_{33}$ in frequency, i.e., frequencies $f_{L1}$ and $f_{L2}$ are nearly equal to predetermined frequency $f_S$. Since, in the exemplary embodiment, source signal $_sTx_{33}$ is a swept signal ranging in frequency from approximately 45 MHz to approximately 20 GHz, $f_{L1}$ and $f_{L2}$, too, range from approximately 45 MHz to 20 GHz.

Reciprocal-amplification circuit 600 uses filters to inhibit oscillation. Because of this, circuit 600 operates at fixed frequencies only. Therefore, frequencies $f_{L1}$ and $f_{L2}$ must be converted to known fixed frequencies for processing by circuit 600. This is accomplished via bidirectional hybrid mixers 640 and 642. For signals flowing towards circuit 600, mixers 640 and 642 function as down-conversion mixers. Conversely, for signals flowing away from circuit 600, mixer 640 and 642 function as up-conversion mixers.

Mixers 640 and 642 perform down-conversions and up-conversions by mixing frequencies $f_{L1}$ and $f_{L2}$ with a swept intermediate frequency source. In the exemplary embodiment, this swept frequency source is IF source signal $_sIF_{33}$, since, as described hereinbefore, signal $_sIF_{33}$ is a swept signal synchronized with source signal $_sTx_{33}$, hence with link signals $Link_{11}$ and $Link_{22}$. As discussed in more detail below, the result of mixing frequencies $f_{L1}$ and $f_{L2}$ with IF source signal $_sIF_{33}$ is the frequencies $f_1$ and $f_2$, respectively.

Those skilled in the art will appreciate that the use of IF source signal $_sIF_{33}$ is not a requirement of the present invention, and that the use of other signals for down-conversion and up conversion does not depart from the spirit of the present invention.

Substantially midway between fixed frequencies $f_1$ and $f_2$ is a third frequency, $f_0$. The difference between $f_1$ and $f_0$ constitute a frequency interval. The scale of the chart in FIG. 12 is calibrated in such intervals. All frequencies in this discussion shall be presumed to be substantially equal to integral frequencies on this scale. That is, all frequencies shall be presumed to fall proximate the interval markers of FIG. 12.

The following discussion traces signal $Link_{1J}$ through reciprocal-amplification circuit 600 in conjunction with Table 6. Table 6 depicts the frequencies of signal $Link_{1J}$ at each of points 601, and 603–635 throughout reciprocal amplification circuit 600 (points 602 and 636 are not used for signal $Link_1j$).

TABLE 6

| Points | Frequencies of Link$_{1J}$ |
|---|---|
| 601 603 | $f_{L1}$ |
| 604 | $f_{1F}$ |
| 605 606 | $f_{L1}$, $f_{1F} - f_{L1}$, $f_{1F}$, $f_{1F} + f_{L1}$ |
| 607 608 609 610 611 | $f_1$, i.e., $f_{1F} - f_{L1}$ |
| 612 | $f_A$ |
| 613 614 | $f_A$, $f_1 - f_A$, $f_1$, $f_1 + f_A$ |
| 615 616 617 618 619 | $f_1 + f_A$ |
| 620 621 622 623 | |
| 624 | $f_B$ |
| 625 626 | $f_B$, $f_1 + f_A - f_B$, $f_1 + f_A$, $f_1 + f_A + f_B$ |
| 627 628 629 630 631 | $f_1 + f_A - f_B$ |
| 632 | |
| 633 | $f_{1F}$ |
| 634 635 | $f_1 + f_A - f_B$, $f_{1F} - f_1 + f_A - f_B$, $f_{1F}$, $f_{1F} + f_1 + f_A - f_B$ |
| Result | $f_{1F} + f_1 f_A - f_B \approx f_{L1}$ |

Signal Link$_{1J}$ originates in first probe 100 with frequency $f_{L1}$, plus higher- and lower-frequency components.

Signal Link$_{1J}$ propagates from point 601, through combiner/splitter 138 in first probe 100, through point 603, and into bidirectional hybrid mixer 640. Mixer 640 mixes signal Link$_{1J}$ at frequency $f_{L1}$ from point 603 with signal $_SIF_{33}$ at frequency $f_{1F}$ from point 604 to produce signal Link$_{1J}$ at frequencies $f_{L1}$, $f_{IF}-f_{L1}$, $f_{IF}$, and $f_{IF}+f_{L1}$ (plus higher-order components, which may be ignored) at point 605.

From point 605, signal Link$_{1J}$ propagates over Link1 signal path 140 through high-frequency propagation medium 102 and into a low-high subcircuit 650 at point 606. Reciprocal-amplification circuit 600 is divided into subcircuits 650 and 652. Subcircuits 650 and 652 are identified as low-high subcircuit 650 (i.e., the subcircuit loop contains a low-center filter before a high-center filter) and high-low subcircuit 652 (i.e., the subcircuit loop contains a high-center filter before a low-center filter). Subcircuits 650 and 652 are coupled together by a propagation medium 654 having a LinkP signal path 656.

From point 606, signal Link$_{1J}$ propagates through bandpass filter 658 to point 607. Bandpass filter 658 has a passband slightly greater than two intervals and centered on frequency $f_0$. That is, bandpass filter 658 is configured to pass frequency $f_0$, to pass frequency $f_1$ located one interval below frequency $f_0$, to pass frequency $f_2$ located one interval above frequency $f_0$, and to attenuate all other frequencies located two or more intervals either below or above frequency $f_0$. Since $f_1=f_{1H}-f_{L1}$, bandpass filter 658 passes signal Link$_{1J}$ at frequency $f_1$ while attenuating the other components.

From point 607, signal Link$_{1J}$ propagates through combiner/splitter 660, through point 608, through combiner/splitter 662, through point 609, and into amplifier 664. Amplifier 664 serves not only to amplify signal Link$_{1J}$, but also as a unidirectional isolator, i.e., to prohibit reverse propagation of signals from point 610 back to point 609.

From amplifier 664, signal Link$_{1J}$ propagates through point 610 and into low-center bandpass filter 666. Bandpass filter 666 has a passband slightly greater than two intervals and centered on a frequency two intervals below frequency $f_0$, (i.e., low-center relative to $f_0$). That is, bandpass filter 650 is configured to pass frequencies located at three, two, and one intervals below frequency $f_0$, and to attenuate frequencies located four or more intervals below frequency $f_0$, or at or above frequency $f_0$. Since frequency $f_1$ is one interval below frequency $f_0$, bandpass filter 650 passes signal Link$_{1J}$.

From bandpass filter 666, signal Link$_{1J}$ propagates through point 611 and into mixer 668. Mixer 668 mixes signal Link$_{1J}$ at frequency $f_1$ from point 611 with a signal (not shown) at frequency $f_A$ from point 612 to produce signal Link$_{1J}$ at frequencies $f_A$, $f_1-f_A$, $f_1$, and $f_1+f_A$ (plus higher-order components, which may be ignored) at point 613. Frequency $f_A$ is substantially equal to three intervals. Therefore, since frequency $f_1$ is substantially one interval below $f_0$, frequency $f_1-f_A$ is substantially four intervals below $f_0$ and frequency $f_1+f_A$ is substantially two intervals above $f_0$.

From point 613, signal Link$_{1J}$ propagates into an amplifier 670. Like amplifier 664, amplifier 670 serves not only to amplify signal Link$_{1J}$, but also as a unidirectional isolator, i.e., to prohibit reverse propagation of signals from point 614 back to point 613.

From amplifier 670, signal Link$_{1J}$ propagates through point 614 and into high-center bandpass filter 672. Bandpass filter 672 has a passband slightly greater than two intervals and centered on a frequency two intervals above frequency $f_0$ (i.e., high-center relative to $f_0$). That is, bandpass filter 672 is configured to pass frequencies located at one, two, and three intervals above frequency $f_0$, and to attenuate frequencies located four or more intervals above frequency $f_0$, or at or below frequency $f_0$. Since frequency $f_1+f_A$ is two intervals above frequency $f_0$ while frequencies $f_A$, $f_1-f_A$, and $f_1$ are all below frequency $f_0$, frequency $f_1+f_A$ is passed and frequencies $f_A$, $f_1-f_A$, and $f_1$ are all attenuated.

From filter 672, signal Link$_{1J}$ propagates through point 615 and into amplifier 674. Like amplifiers 664 and 670, amplifier 674 serves not only to amplify signal Link$_{1J}$, but also as a unidirectional isolator, i.e., to prohibit reverse propagation of signals from point 616 back to point 615.

From amplifier 674, signal Link$_{1J}$ propagates through point 616 and into combiner/splitter 662. The circuit from combiner/splitter 662, through amplifier 664, through filter 666, through mixer 668, through amplifier 670, through filter 672, through amplifier 674, and back to combiner/splitter 662 forms a loop. Filters 666 and 672, in conjunction with mixer 668, inhibit this loop from oscillating.

From combiner/splitter 662, signal Link$_{1J}$ propagates through point 617 (coincident with point 608), through combiner splitter 660, through point 618, through propagation medium 654 via LinkP signal path 656, into high-low subcircuit 652, through point 619, through a combiner/splitter 676, through point 620, through a combiner/splitter 678, through point 621, and into an amplifier 680. From amplifier 680, signal Link$_{1J}$ propagates through point 622 and into a bandpass filter 682. Like bandpass filter 672 discussed hereinbefore, bandpass filter 682 has a passband slightly greater than two intervals and centered on a frequency two intervals above frequency $f_0$. Since frequency $f_1+f_A$ is two intervals above frequency $f_0$, frequency $f_1+f_A$ is passed.

From bandpass filter 682, signal Link$_{1J}$ propagates through point 623 and into a mixer 684. Within mixer 684, signal Link$_{1J}$ at frequency $f_1+f_A$ from point 623 is mixed with a signal (not shown) at frequency $f_B$ from point 622 to produce signal Link$_{1J}$ at frequencies $f_B$, $f_1+f_A-f_B$, $f_1+f_A$, and $f_1+f_A+f_B$ (plus higher-order components, which may be ignored) at point 625. Frequency $f_B$ is substantially equal to three intervals (though not identical with frequency $f_A$). Therefore, since frequency $f_1+f_A$ is substantially two intervals above $f_0$, frequency $f_1+f_A-f_B$ is substantially two intervals below $f_0$ and frequency $f_1+f_A+f_B$ is substantially five intervals above $f_0$.

From point 625, signal Link$_{1J}$ propagates into an amplifier 686. From amplifier 686, signal Link$_{1J}$ propagates through point 624 and into a low-center bandpass filter 688. Like bandpass filter 666, bandpass filter 688 has a passband slightly greater than two intervals and centered on a frequency two intervals below frequency $f_0$. Since frequency $f_1+f_A-f_B$ is one interval below frequency $f_0$, while frequency $f_B$ is more than four intervals below $f_0$ and frequencies $f_1+f_A$ and $f_1+f_A+f_B$ are above frequency $f_0$, frequency $f_1+f_A-f_B$ is passed and frequencies $f_B$, $f_1+f_A$, and $f_1+f_A+f_B$ are attenuated.

From bandpass filter 688, signal $Link_{1J}$ propagates through point 625 and into an amplifier 690. Amplifiers 680, 686, and 690 also serve as unidirectional isolators. From amplifier 690, signal $Link_{1J}$ propagates through point 628 and into combiner/splitter 678. The circuit from combiner/splitter 678, through amplifier 680, through filter 682, through mixer 684, through amplifier 686, through filter 688, through amplifier 690, and back to combiner/splitter 678 also forms a loop inhibited from oscillation by filters 682 and 688 in conjunction with mixer 684.

From combiner-splitter 678, signal $Link_{1J}$ propagates through point 629 (coincident with point 620), through combiner/splitter 676, through point 630, and into bandpass filter 692. Like bandpass filter 658, bandpass filter 692 has a passband slightly greater than two intervals and centered on frequency $f_0$. Since frequency $f_1+f_A-f_B$ is one interval below frequency $f_0$, frequency $f_1+f_A-f_B$ is passed.

From bandpass filter 692, signal $Link_{1J}$ propagates through point 631, over Link2 signal path 240 through high-frequency propagation medium 202 to second probe 200, through point 632, and into bidirectional hybrid mixer 642. Mixer 642 mixes signal $Link_{1J}$ at frequency $f_1+f_A-f_B$ from point 632 with signal $_sIF_{33}$ at frequency $f_{IF}$ from point 633 to produce signal $Link_{1J}$ at frequencies $f_1+f_A-f_B$, $f_{IF}-f_1+f_A-f_B$, $f_{IF}$, and $f_{IF}+f_1+f_A-f_B$ (plus higher-order components, which may be ignored) at point 634. Frequencies $f_1+f_A-f_B$, $f_{IF}-f_1+f_A-f_B$, and $f_{IF}$ are filtered by receiver 400 (FIG. 5).

From point 634, signal $Link_{1J}$ propagates through combiner/splitter 238 and to point 631. Since frequency $f_{IF}+f_1+f_A-f_B$ is substantially equal to frequency $f_{L1}$, signal $Link_{1J}$ has successfully been amplified in its passage from first probe 100 to second probe 200.

Signal Link2j propagates from second probe 200, through reciprocal-amplification circuit 600, and into first probe 100 in an analogous manner. The following abbreviated discussion traces signal $Link_{2J}$ through reciprocal-amplification circuit 600 in conjunction with Table 7. Table 7 depicts the frequencies of signal $Link_{2J}$ at each of points 602–634 and 636 throughout reciprocal amplification circuit 600 (points 601 and 635 are not used for signal $Link_{2J}$).

TABLE 7

| Points | Frequencies |
| --- | --- |
| 636 634 | $f_{L2}$ |
| 633 | $f_{1F}$ |
| 632 631 | $f_{1F} - f_{L2}$, $f_{1F}$, $f_{L2}$, $f_{1F} + f_{L2}$ |
| 630 620 621 622 623 | $f_2$, i.e., $f_{1F} - f_{L2}$ |
| 624 | $f_B$ |
| 625 626 | $f_B$, $f_2 - f_B$, $f_2$, $f_2 + f_B$ |
| 627 628 629 619 618 | $f_2 - f_B$ |
| 608 609 610 611 | |
| 612 | $f_A$ |
| 613 614 | $f_A$, $f_2 - f_B - f_A$, $f_2 - f_B$, $f_2 - f_B + f_A$ |
| 615 616 617 607 606 | $f_2 - f_B + f_A$ |
| 605 | |
| 604 | $f_{1F}$ |

TABLE 7-continued

| Points | Frequencies |
| --- | --- |
| 603 602 | $f_2 - f_B + f_A$, $f_{1F} - f_2 - f_B + f_A$, $f_{1F}$, $f_{1F} + f_2 - f_B + f_A$ |
| Result | $f_{1F} + f_2 - f_B + f_A \approx f_{L2}$ |

Signal $Link_{2J}$ originates in second probe 200 with frequency $f_{L2}$. Signal $Link_{2J}$ propagates from point 636, through combiner/splitter 238, through point 634, and into bidirectional hybrid mixer 642. Mixer 642 mixes signal $Link_{2J}$ with signal $_sIF_{33}$ at frequency $f_{IF}$ from point 633 to produce signal $Link_{2J}$ at frequencies $f_{L2}$, $f_{IF}-f_{L2}$, $f_{IF}$, and $f_{IF}+f_{L2}$ at point 632. From point 632, signal $Link_{2J}$ propagates over Link2 signal path 240 through high-frequency propagation medium 202 and into high-low subcircuit 652 at point 631.

From point 631, signal $Link_{2J}$ propagates through bandpass filter 692 to point 630. Bandpass filter 692 has a passband slightly greater than two intervals and centered on frequency $f_0$. Since $f_2=f_{IF}-f_{L2}$, bandpass filter 692 passes signal $Link_{2J}$ at frequency $f_2$ while attenuating the other components.

From point 630, signal $Link_{2J}$ propagates through combiner/splitter 676, through point 620, through combiner/splitter 678, through point 621, and into amplifier 680. From amplifier 680, signal $Link_{2J}$ propagates through point 622 and into high-center bandpass filter 682. Bandpass filter 682 has a passband slightly greater than two intervals and centered on a frequency two intervals above frequency $f_0$. Since frequency $f_2$ is one interval above frequency $f_0$, bandpass filter 682 passes signal $Link_{2J}$.

From bandpass filter 682, signal $Link_{2J}$ propagates through point 623 and into mixer 684. Mixer 684 mixes signal $Link_{2J}$ at frequency $f_2$ with a signal (not shown) at frequency $f_B$ from point 624 to produce signal $Link_{2J}$ at frequencies $f_B$, $f_2-f_B$, $f_2$, and $f_2+f_B$ at point 625. Since frequency $f_2$ is substantially one interval above $f_0$, frequency $f_2-f_B$ is substantially two intervals below $f_0$ and frequency $f_2+f_B$ is substantially four intervals above $f_0$.

From point 625, signal $Link_{2J}$ propagates into amplifier 686. From amplifier 686, signal $Link_{2J}$ propagates through point 626 and into low-center bandpass filter 688. Since frequency $f_2-f_B$ is two intervals below frequency $f_0$, frequency $f_2-f_B$ is passed while other components are attenuated.

From filter 688, signal $Link_{2J}$ propagates through point 627 and into amplifier 690. From amplifier 690, signal $Link_{2J}$ propagates through point 628, through combiner/splitter 678, through point 629, through combiner splitter 676, through point 619, through propagation medium 654 via LinkP signal path 656, into low-high subcircuit 650, through point 618, through combiner/splitter 660, through point 608, through combiner/splitter 662, through point 609, and into amplifier 664. From amplifier 664, signal $Link_{2J}$ propagates through point 610 and into low-center bandpass filter 666. Since frequency $f_2-f_B$ is two intervals below frequency $f_0$, frequency $f_2-f_B$ is passed.

From bandpass filter 666, signal $Link_{2J}$ propagates through point 611 and into mixer 668. Within mixer 668, signal $Link_{2J}$ at frequency $f_2-f_B$ is mixed with a signal (not shown) at frequency $f_A$ from point 612 to produce signal $Link_{2J}$ at frequencies $f_A$, $f_2-f_B-f_A$, $f_2-f_B$, and $f_2-f_B+f_A$ at point 613. Since frequency $f_2-f_B$ is substantially two intervals below $f_0$, frequency $f_2-f_B-f_A$ is substantially five intervals below $f_0$ and frequency $f_2-f_B+f_A$ is substantially one interval above $f_0$.

From point 613, signal Link$_{2J}$ propagates through amplifier 670, through point 614, and into high-center bandpass filter 672. Since frequency $f_2-f_B+f_A$ is one interval above frequency $f_0$, frequency $f_2-f_B+f_A$ is passed and other components are attenuated.

From bandpass filter 672, signal Link$_{2J}$ propagates through point 615, through amplifier 674, through point 616, through combiner/splitter 662, through point 617, through combiner/splitter 660, through point 607, and into bandpass filter 658. Since frequency $f_2-f_B+f_A$ is one interval above frequency $f_0$, frequency $f_2-f_B+f_A$ is passed.

From bandpass filter 658, signal Link$_{2J}$ propagates through point 606, over Link1 signal path 140 through high-frequency propagation medium 102 to first probe 100, through point 605, and into bidirectional hybrid mixer 640. Mixer 640 mixes signal Link$_{2J}$ at frequency $f_2-f_B+f_A$ with signal $_SIF_{33}$ at frequency $f_{IF}$ from point 604 to produce signal Link$_{2J}$ at frequencies $f_2-f_B+f_A$, $f_{IF}-f_2-f_B+f_A$, $f_{IF}$, and $f_{IF}+f_2-f_B+f_A$ at point 603. Frequencies $f_2-f_B+f_A$, $f_{IF}-f_2-f_B+f_A$, and $f_{IF}$ are filtered by receiver 400 (FIG. 5).

From point 603, signal Link$_{2J}$ propagates through combiner/splitter 138 and to point 602. Since frequency $f_{IF}+f_2-f_B+f_A$ is substantially equal to frequency $f_{L2}$, signal Link$_{2J}$ has successfully been amplified in its passage from second probe 200 to first probe 100.

It should be noted that reciprocal amplification circuit 600 will desirably provide sufficient amplification to overcome losses in the Link signal path between probes 100,and 200. those skilled in the art will appreciate that propagation medium 654 may be any required propagation medium, e.g., an RF transmission link, earth-conductance link, etc. The use of other media and/or other schema than those presented herein does not depart from the spirit of the present invention.

Figure 13:
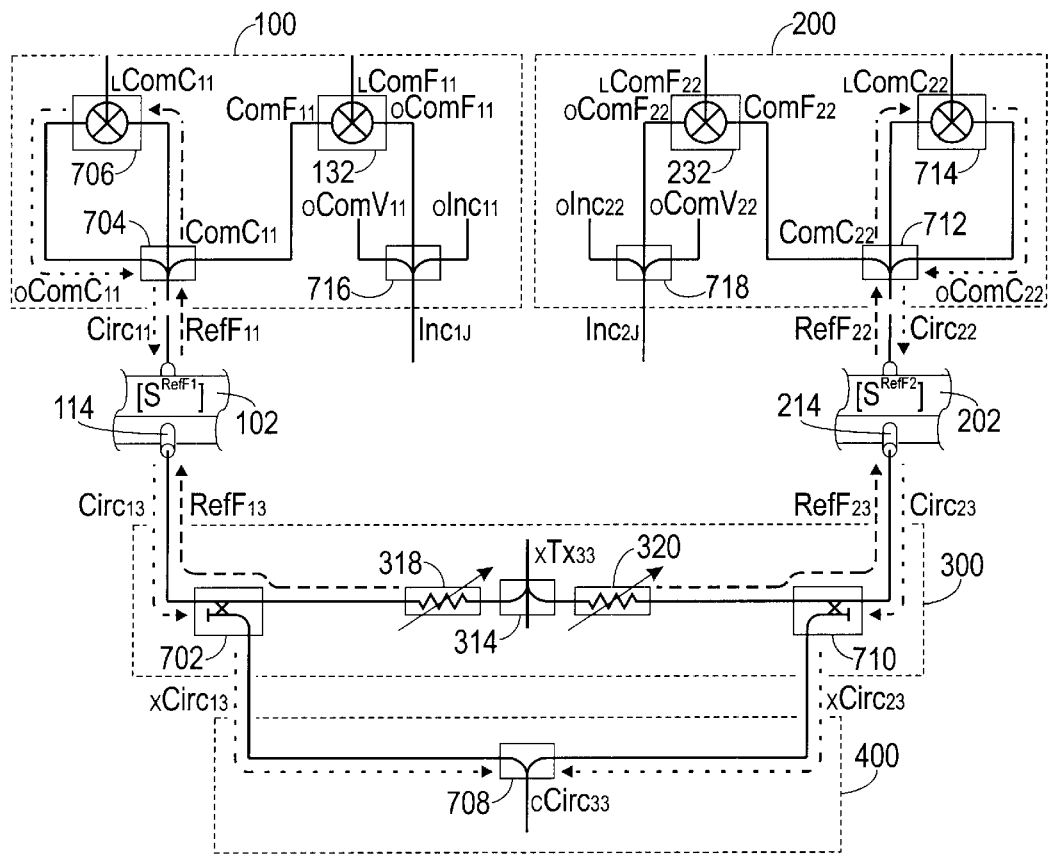
FIG. 13 shows a simplified schematic diagram of a circular mixer circuit for the network analyzer of FIG. 1 in accordance with an alternative preferred embodiment of the present invention.

FIG. 13 shows a simplified schematic diagram of a circular mixer circuit 700 for TES network analyzer 22 in accordance with an alternative preferred embodiment of the present invention. The following discussion refers to FIG. 13.

The reciprocal link leg (i.e., Link signal path 140/240 through Link channel 401 (FIGS. 3, 4, and 5)) provides the necessary amplitude and phase references between probes 100 and 200 (FIGS. 3 and 4) in TES network analyzer 22 of FIGS. 1–5 and 7. However, other embodiments also allow amplitude and phase references to be established between probes 100 and 200.

One such embodiment is the use of circular mixer circuit 700. In this approach, an accurate phase reference between probes 100 and 200 is established by measuring the phase at each port relative to the phase in analysis unit 28. This is accomplished by measuring the time-varying transmission coefficients for RefF1 and RefF2 signal paths 114 and 214, i.e., by measuring $T^{RefF1}$ and $T^{RefF2}$ instead of $T_{Link}$.

As was the case when measuring transmission coefficient $T_{Link}$ for Link signal path 140/240, transmission coefficients $T^{RefF1}$ and $T^{RefF2}$ associated with RefF1 and RefF2 signal paths 114 and 214, respectively, may be measured by simultaneously passing two signals, of different frequencies, in opposite directions through each of RefF1 and RefF2 signal paths 114 and 214. To do this, RefF1 and RefF2 signal paths 114 and 214 will contain reciprocal components. Therefore, Refr1 and RefF2 signal paths 114 and 214 may not include unidirectional components, i.e., amplifiers and isolators. If necessary, duplicate reciprocal-amplification circuits 600, discussed hereinbefore, may be used in RefF1 and RefF2 signal paths 114 and 214.

In circular mixer circuit 700 of FIG. 13, fixed-reference signal RefF$_{13}$ is generated in analysis unit 28 (i.e., in transmitter 300), passes through directional coupler 702, and propagates through high-frequency propagation medium 102 over RefF1 signal path 114 into first probe 100, where it becomes signal RefF$_{11}$. Signal RefF$_{11}$ is split by combiner/splitter 704 into fixed-common signal ComF$_{11}$ and a circular-common signal ComC$_{11}$. Mixing circuit 706 then mixes signal ComC$_{11}$ with a local-oscillator offset signal $_L$ComC$_{11}$ (generated by local-oscillator module 354 (not shown)) to produce an offset circular-common signal $_O$ComC$_{11}$ (see Equations (3) and (4)). Signal $_O$ComC$_{11}$ passes through combiner/splitter 704 to become a circular signal Circ$_{11}$. Signal Circ$_{11}$ propagates through high-frequency propagation medium 102 over RefF1 signal path 114 into analysis unit 28, where it becomes a signal Circ$_{13}$. Directional coupler 702 extracts signal Circ$_{13}$ from RefF1 signal path 114 as an extracted circular signal $_X$Circ$_{13}$ Signal $_X$Circ$_{13}$ passes through combiner 708, where it is combined with a signal $_X$Circ$_{23}$ from probe 200 to become a composite circular signal $_C$Circ$_{33}$ in receiver 400.

Similarly, fixed-reference signal RefF$_{23}$ is generated in analysis unit 28 (i.e., in transmitter 300), passes through directional coupler 710, and propagates through high-frequency propagation medium 202 over RefF2 signal path 214 into second probe 200, where it becomes signal RefF$_{22}$. Signal RefF$_{22}$ is split by combiner/splitter 712 into fixed-common signal ComF$_{22}$ and a circular-common signal ComC$_{22}$. Mixing circuit 714 then mixes signal ComC$_{22}$ with a local-oscillator offset signal $_L$ComC$_{22}$ (generated by local-oscillator module 354 (not shown)) to produce an offset circular-common signal $_O$ComC$_{22}$ (see Equations (3) and (4)). Signal $_O$ComC$_{22}$ passes through combiner/splitter 712 to become a circular signal Circ$_{22}$. Signal Circ$_{22}$ propagates through high-frequency propagation medium 202 over RefF2 signal path 214 into analysis unit 28, where it becomes a signal Circ$_{23}$. Directional coupler 710 extracts signal Circ$_{23}$ from RefF2 signal path 214 as an extracted circular signal $_X$CirC$_{23}$. Signal $_X$Circ$_{23}$ passes through combiner 708, where it is combined with signal $_X$Circ$_{13}$ from probe 100 to become composite circular signal $_C$CirC$_{33}$ in receiver 400.

Since Link signal path 140/240 no longer exists, four-way incident-signal couplers 142 and 242 (FIGS. 3 and 4) have been replaced with three-way couplers 716 and 718, respectively.

It may be seen from the above discussion that RefF1 and RefF2 signal paths 114 and 214 are bidirectional signal paths, with signals RefF$_{1J}$ and RefF$_{2J}$ propagating from analysis unit 28 to probes 100 and 200, while signals Circ$_{1J}$ and Circ$_{2J}$ substantially simultaneously propagate from probes 100 and 200 to analysis unit 28, respectively.

Each signal therefore passes through the S-matrix [$S^{RefF1}$] or [$S^{RefF2}$]. Following the procedures that were used to create Tables 3 and 4, we find that signals Circ$_{1J}$ and Circ$_{2J}$ may be written as $$_MCOMC_{13}=A_S(T^{RefF1})^2 P_{MCom13}\exp(-j\angle A_{LComC11})G^{Circ}, \text{ and} \quad (41)$$

$$_MCOMC_{23}=A_S(T^{RefF2})^2 P_{MComC23}\exp(-j\angle A_{LComc22})G^{Circ}. \quad (42)$$

Taking the square root of the ratio of these two signals gives, $$\frac{T^{RefF2}}{T^{RefF1}} = \sqrt{\frac{_M ComC_{23}}{_M ComC_{13}} \frac{P_{MComC13}}{P_{MComC23}} \frac{\exp(\angle A_{LComC22})}{\exp(\angle A_{LComC11})}}. \quad (43)$$

Signal normalization techniques can now be used to compute the forward and reverse, measured transmission coefficients of DUT 26 using $$S_{21M} = \frac{T^{RefF2} \ _M ComF_{13} \ _M Dat_{23} \ _M ComV_{23} \ \exp[j \ (\angle A_{LComF11} + \angle A_{LDat22} + \angle A_{LComV22} \ )]}{T^{RefF1} \ _M Inc_{13} \ _M ComD_{23} \ _M ComF_{23} \ \exp[j \ (\angle A_{LInc11} + \angle A_{LComD22} + \angle A_{LComF22} \ )]} \quad (44)$$

$$= \tilde{S}_{21M} \frac{P_{MComF13}}{P_{MInc13}} \frac{P_{MDat23}}{P_{MComD23}} \frac{P_{MComV23}}{P_{MComF23}}, \text{ and}$$

$$S_{12M} = \frac{T^{RefF1} \ _M ComF_{23} \ _M Dat_{13} \ _M ComV_{13} \ \exp[j \ (\angle A_{LComF22} + \angle A_{LDat11} + \angle A_{LComV11} \ )]}{T^{RefF2} \ _M Inc_{23} \ _M ComD_{13} \ _M ComF_{13} \ \exp[j \ (\angle A_{LInc22} + \angle A_{LComD11} + \angle A_{LComF11} \ )]} \quad (45)$$

$$= \tilde{S}_{12M} \frac{P_{MComF23}}{P_{MInc23}} \frac{P_{MDat13}}{P_{MComD13}} \frac{P_{MComV13}}{P_{MComF13}}.$$

The reflection coefficients of DUT 26 can still be computed using Equations (13) and (16).

It is interesting to compare Equations (43), (44), and (45) with Equations (14), (15), and (18). These represent various options for establishing the amplitude and phase references between probes 100 and 200. All such options, however, depend on having a reciprocal signal flow path. It has been demonstrated herein that Link signal path 140/240 and RefF1 and RefF2 signal paths 114 and 214 may be used for this purpose. Those skilled in the art will appreciate that it is also possible to employ either RefV1 and RefV2 signal path 118 and 218 or Tx1 and Tx2 signal paths 112 and 212 for this purpose. The use of other signal paths to effect amplitude and phase references between probes 100 and 200 does not depart from the spirit of the present invention.

Figure 14:
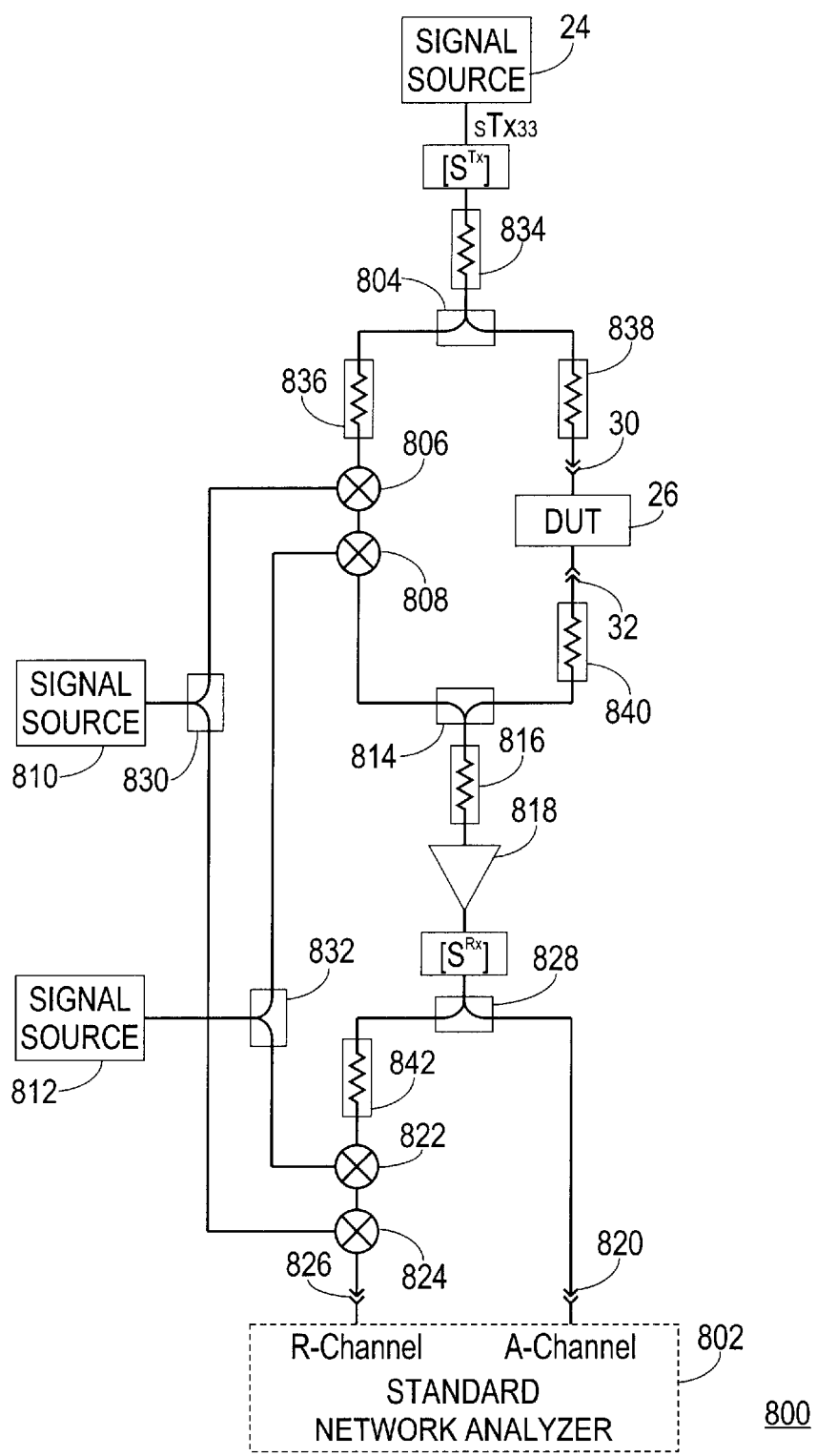
FIG. 14 shows a simplified schematic diagram of a mix/demix circuit in accordance with an alternative embodiment of the present invention.

FIG. 14 shows a simplified schematic diagram of a mix/demix circuit in accordance with an alternative embodiment of the present invention. The following discussion refers to FIG. 14.

As shown in mix/demix circuit 800 of FIG. 14, the TES technique can be adapted for use with a standard (i.e., prior-art) network analyzer 802. Note that circuit 800 only allows for the measurement of the transmission coefficient in a single direction through DUT 26. Circuit 800 also assumes that accurate amplitude and phase references exist on ports 30 and 32 of DUT 26, i.e.., no link leg is required. Only time-varying transmitter errors [$S^{Tx}$] and receiver errors [$S^{Rx}$] are simulated. Those skilled in the art will appreciate that circuit 800 is exemplary only, and that it would be straightforward to expand circuit 800 to a full two-port network-analyzer measurement system. Such expansion of circuit 800 does not depart from the spirit of the present invention.

Signal source 24 produces source signal $_STx_{33}$ at predetermined frequency $f_S$. Signal $_STx_{33}$ is transmitted through time-varying S-matrix [$S^{Tx}$]. S-matrix [$S^{Tx}$] models the time-varying errors associated with the transmitter circuitry. A splitter 804 splits signal $_STx_{33}$ into two paths. One of these paths flows through DUT 26 and the other flows through two frequency-offset mixers 806 and 808. The output signal from mixer 808 appears at the four sum and difference frequencies $$f_S \pm f_{L1} \pm f_{L2}, \quad (46)$$

where $f_{L1}$ and $f_{L2}$ denote the frequencies for two frequency-offset local-oscillator sources 810 and 812. Since these signals are at different frequencies than signal $_STx_{33}$ that flows through DUT 26, combiner 814 can combine the signals in the two paths. The combined signals then flow through a pad 816 and an amplifier 818 before reaching time-varying S-matrix [$S^{Rx}$] that models the time-varying receiver errors. Pad 816 and amplifier 818 are included to isolate mixers 806 and 808 and DUT 26 from time-varying S-matrix [$S^{Rx}$].

After passing through S-matrix [$S^{Rx}$] (i.e., a receiver cable), the signals must be detected. In TES network analyzer 22, the time-domain data and normalization signals are both detected simultaneously by analog-to-digital converters 493–496 (FIG. 5). FFT routine 510 in processor 500 (FIG. 7) is then employed to transform the time-domain signals into the frequency domain, where the individual data and normalization signals are extracted from the appropriate frequency bins. However, a receiver (not shown) of standard network analyzer 802 is configured to only detect a single CW wave. If a narrow enough resolution bandwidth (i.e., RBW<<min($f_{L1},f_{L2}$)) is selected for the IF filter in standard network analyzer 802, then the signal that is detected in an A-channel 820 of network analyzer 802 will provide information about the transmission characteristics of DUT 26. Likewise, after passing through two more mixers 822 and 824, an R-channel 826 will provide information about the incident signal. The desired transmission coefficient can then be obtained via signal normalization, i.e., $$S_{21} = \frac{Dat_A}{Dat_R}. \quad (47)$$

There are a number of issues that should be noted. First, the signal normalization removes time-varying errors associated with source-drift, transmitter circuitry drift, and the receiver circuitry drift up to a splitter 828. However, any *drift errors associated with the receiver circuitry of network analyzer 802 are not removed, since the data and normalization signals are detected in separate receiver channels. It should also be noted that mixers 806, 808, 822, and 824 are used to reduce RF feedthrough to a level that doesn't cause detectable errors in the measured signals.

The signals from local-oscillator sources 810 and 812 are directed to mixer-pairs 806/824 and 808/822, respectively, by splitters 830 and 832, and 808 and 822, respectively. Pads 816, 834, 836, 838, 840, and 842 are used to provide isolation and impedance matching as required.

This technique, which is referred to as a mix/demix technique, may be extended to full two-port. DUT measurements. However, it would require numerous receiver channels in order to simultaneously measure all S-Parameters. There are many applications where mix/demix circuit 800 may be cost-effectively used with standard network analyzer 802. For example, when the goal is to measure a single quantity, such as a direct measurement from one transducer to another, there are sufficient receiver channels in a standard network analyzer for the complete measurement. If the transducers are remote from the network analyzer, virtually all of the error due to time-varying effects may be in the link between the transducers and network analyzer 802. In this case the time-varying errors in the separate data-acquisition channels may be negligible. The mix/demix implementation of the TES technique normalization can then be a very powerful and cost-effective approach.

Figure 15:
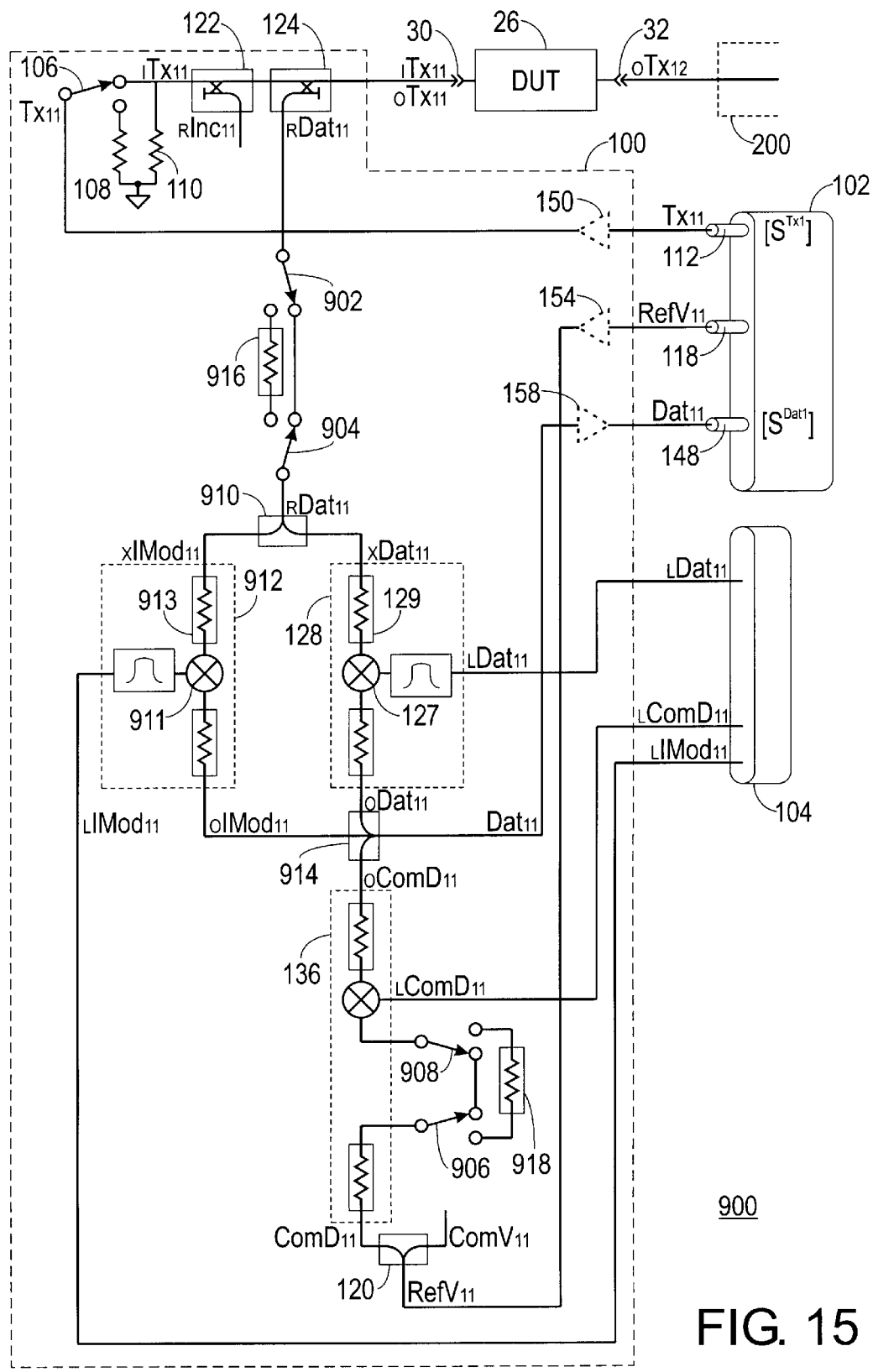
FIG. 15 shows a simplified schematic diagram of an intermodulation distortion checking and removal circuit in accordance with a preferred embodiment of the present invention.

FIG. 15 shows a simplified schematic diagram of an intermodulation distortion checking and removal circuit in accordance with a preferred embodiment of the present invention. The following discussion refers to FIG. 15.

As discussed hereinbefore, care must be taken to avoid intermodulation distortion (IMD) since multiple signals existing at different frequencies simultaneously pass through various nonlinear elements, e.g., mixers and amplifiers. An IMD program may be used to minimize the effects of IMD by properly choosing the frequencies of the local-oscillator signals (see Table 1) for the frequency-offset mixers during the design of TES network analyzer 22. Unfortunately, IMD programs only account for the effects of the ideal fundamental frequencies and the associated harmonics. They do not account for the effects of spurious signals that are either generated in signal measurement system 20 or caused by electromagnetic interference from strong external signals. Furthermore, it is only possible to design system 20 to avoid IMD for intermodulation products that are less than some finite order and it is difficult to predict the actual IMD level. Finally, if DUT 26 is nonlinear, IMD during signal measurement may lead to errors.

Since IMD effects are unpredictable and may be influenced by the measurement setup and external environmental factors (e.g., power-line noise and electromagnetic interference), a test that indicates the level of IMD in a given measurement is highly desirable. This may be accomplished by changing the level of the signal input into the nonlinear components. The measured results for the two levels may then be compared to indicate the level of IMD and nonlinearity. For example, if the signal levels input into an amplifier are changed by 3 dB, then the desired output signal levels, which should be linearly related to the input signal levels, should also change by 3 dB. A deviation from ideal linear behavior indicates that there is either IMD (e.g., second-order and third-order intermodulation products should change by approximately 6 dB and 9 dB, respectively) or signal compression. IMD test and reduction circuit 900 (FIG. 15) may be used to test for IMD and nonlinearities. In order to simplify FIG. 15, only those components of first probe 100 (see FIG. 3) specifically a part of circuit 900 are shown). Those skilled in the art will appreciate that while first probe 100 is exemplified, a substantially identical circuit may be incorporated into second probe 200. The use of circuit 900 in either or both probes 100 and/or 200 does not depart from the spirit of the present invention.

When switches 902, 904, 906, and 908, are set to "through" positions (i.e., the positions shown), raw data signal $_R\text{Dat}_{11}$, is divided in a hybrid splitter 910 into signals $_X\text{Dat}_{11}$ and $_X\text{IMod}_{11}$. Signals $_X\text{Dat}_{11}$ and $_X\text{IMod}_{11}$ flow into mixing circuits 128 and 912, where they are mixed with frequency-offset local-oscillator signals $_L\text{Dat}_{11}$ and $_L\text{IMod}_{11}$, respectively to produce offset signals $_O\text{Dat}_{11}$ and $_O\text{IMod}_{11}$. Local-oscillator signals $_L\text{Dat}_{11}$ and $_L\text{IMod}_{11}$ exist at different frequencies, so offset signals $_O\text{Dat}_{11}$ and $_O\text{IMod}_{11}$ are offset from transmission signal $\text{Tx}_{11}$ (i.e., source signal $_S\text{Tx}_{33}$ (FIG. 2) by different amounts. Offsetting signals $_O\text{Dat}_{11}$ and $_O\text{IMod}_{11}$ by different amount allows them to be recombined by combiner 914 into composite data signal $\text{Dat}_{11}$.

If pads 129 and 913 (input pads 36 (FIG. 6) of mixing circuits 128 and 912) have different values, e.g., were mixing circuit 128 to attenuate signal $_X\text{Dat}_{11}$ 3 dB less than mixing circuit 912 attenuates signal $_X\text{IMod}_{11}$, then the levels of signals $_X\text{dat}_{11}$ and $_X\text{IMod}_{11}$, the signal levels that pass through the nonlinear components, i.e., mixers 127 and 911 (mixers 42 (FIG. 6) of mixing circuits 128 and 912), optional amplifier 156, and the components of Dat1 channel 404 of receiver 400 (FIG. 5) also differ by 3 dB. These two signals, being simultaneously measured, may be used to efficiently test for IMD and nonlinearities. If pad 913 were switched in, instead of being fixed in circuit 900, then potential switch repeatability errors would necessitate system calibration after each measurement. Also, the use of a switch would necessitate doubling the number of measurements, leading to lower productivity and a significant increase in measurement cost.

It is also possible to check for IMD and nonlinearities by changing the power level of transmission signal $\text{Tx}_{11}$. However, this would change the power level seen by DUT 26 and would require twice as much measurement time.

In the alternative exemplary embodiment of FIG. 15, IMD testing is shown applied to the data legs, as this is the most-likely location to suffer IMD effects. Those skilled in the art will appreciate that the schema of circuit 900 may also be used in the incident legs if desirable. The use of this schema in other than the data legs does not depart from the spirit of the present invention.

On the rare occasion when such IMD and nonlinearities are detected, a method is presented for removing those errors. This is accomplished by placing switches 902, 904, 906, and 908 in "attenuated" positions (opposite the positions shown). This places attenuators 916 and 918 into the paths of data and common signals $_R\text{Dat}_{11}$ and $\text{ComD}_{11}$. Attenuators 916 and 918 are placed into both signal paths to allow the measured data, intermodulation, and data-common signals $_M\text{Dat}_{13}$, $_M\text{IMod}_{13}$, and $_M\text{ComD}_{13}$ within composite data signal $\text{Dat}_{11}$ to be maintained within ±15 dB of one another as described hereinbefore.

Placing switches 902, 904, 906, and 908 in the "attenuated" positions lowers the levels of signals $_R\text{Dat}_{11}$, and $\text{ComD}_{11}$, and reduces the effects of IMD and nonlinearities. Circuit 900 shows single pads 916 and 918 of up to 20 dB placed into the path of each of signals $_R\text{Dat}_{11}$ and $\text{ComD}_{11}$, respectively. Those skilled in the art, however, will appreciate that switches 902, 904, 906, and 908 and attenuators 916 and 918 may be replaced by step switches with multiple attenuators, or by variable attenuators, if more flexibility in attenuation is desired, without departing from the spirit of the present invention.

The effects associated with switching between the "through" and "attenuated" positions are not removed by normalization, since multiple signals do not flow through these components. Thus, a new static calibration may be required after switching.

In summary, the present invention teaches a real-time error-suppression method and apparatus therefor. The combination of static, dynamic, phase-noise, and random error suppression incorporated into a Thorough Error Suppression (TES) technique leads to a significant improvement in signal measurement accuracy. The TES technique also makes it possible to use much-lower-cost components in the construction of measuring systems. Examples of these savings are lower cost and simpler components in the receiver, the use of conventional over high-cost specialized cables connecting all devices and ports, and conventional off-the-shelf signal-conditioning circuitry. This leads to a significant economic benefit by calibrating less expensive components, rather than building very expensive, precisely matched components.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A signal measurement method incorporating real-time. error suppression, said method comprising:

establishing a frequency band, all frequencies of which are within ten percent of a center frequency thereof;

acquiring a first signal at a first frequency within said frequency band;

obtaining a second signal at a second frequency within said frequency band, said second frequency being offset from said first frequency;

combining said first and second signals to produce a third signal;

propagating said third signal over a signal path capable of inducing errors into said third signal to produce a fourth signal;

separating said fourth signal into a fifth signal and a sixth signal;

comparing said sixth signal against said second signal to determine a correction factor; and applying said correction factor to said fifth signal to extract a replica of said first signal therefrom.

2. A signal measurement method as claimed in claim 1 wherein frequencies of said frequency band are within five percent of a center frequency thereof.

3. A signal measurement method as claimed in claim 2 wherein frequencies of said frequency band are within two percent of a center frequency thereof.

4. A signal measurement method as claimed in claim 1 wherein said fourth signal is an analog signal, and wherein:

said method additionally comprises, prior to said separating activity, converting said analog fourth signal to a digital seventh signal; and said separating, comparing, and applying activities are executed digitally within a digital processor in response to said digital seventh signal.

5. A signal measurement method as claimed in claim 1 wherein said signal path is a first signal path and said correction factor is a first correction factor, said method additionally comprising:

acquiring a seventh signal at a third frequency within said frequency band, said third frequency being offset from said first and second frequencies;

obtaining an eighth signal at a. fourth frequency within said frequency band, said fourth frequency being offset from said first, second, and third frequencies;

combining said seventh and eighth signals to produce a ninth signal; propagating said ninth signal over a second signal path capable of inducing errors into said ninth signal to produce a tenth signal;

separating said tenth signal into an eleventh signal and a twelfth signal;

comparing said twelfth signal against said eighth signal to determine a second correction factor; and applying said second correction factor to said eleventh signal to extract a replica of said seventh signal therefrom.

6. A signal measurement method as claimed in claim 1 wherein:

said method additionally comprises providing a seventh signal having a third frequency within said frequency band, said third frequency being offset from said first and second frequencies;

said acquiring activity comprises extracting an eighth signal at substantially said third frequency from said seventh signal;

said method additionally comprises providing a ninth signal having a fourth frequency, said fourth frequency being substantially a difference between said first and third frequencies; and said acquiring activity additionally comprises mixing said eighth and ninth signals to produce said first signal.

7. A signal measurement method as claimed in claim 1 wherein:

said method additionally comprises providing a seventh signal at a third frequency within said frequency band, said third frequency being offset from said first and second frequencies;

said method additionally comprises providing an eighth signal at a fourth frequency within said frequency band, said fourth frequency being offset from said first, second, and third frequencies;

said method additionally comprises providing a ninth signal at a fifth frequency, said fifth frequency being offset from said first frequency substantially by said third frequency;

said method additionally comprises providing a tenth signal at a sixth frequency, said sixth frequency being offset from said second frequency substantially by said fourth frequency;

said acquiring activity comprises extracting an eleventh signal from said seventh signal, said eleventh signal being at substantially said third frequency;

said acquiring activity additionally comprises mixing said eleventh and ninth signals to produce said first signal;

said obtaining activity comprises extracting a twelfth signal from said eighth signal, said twelfth signal being at substantially said fourth frequency; and said obtaining activity additionally comprises mixing said twelfth and tenth signals to produce said second signal.

8. A signal measurement method as claimed in claim 7 wherein said fourth signal is an analog signal, said method additionally comprising:

generating said ninth signal in a first local oscillator;

generating said tenth signal in a second local oscillator;

summing said ninth and tenth signals to produce a thirteenth signal, wherein said thirteenth signal is an analog signal;

converting, prior to said separating step, said analog fourth and thirteenth signals to a digital fourteenth signal and a digital fifteenth signal, respectively; and submitting said fourteenth and fifteenth signals to a digital processor, wherein said fifteenth signal enables said separating activity to separate said fourteenth signal into said fifth and sixth signals.

9. A signal measurement method as claimed in claim 1 wherein said signal path is a first signal path, said method additionally comprising:

providing a seventh signal at a third frequency;

deriving said first signal from said seventh signal;

deriving said second signal from said seventh signal;

deriving an eighth signal from said seventh signal;

deriving a ninth signal from said seventh signal;

combining said eighth and ninth signals to produce a tenth signal;

propagating said tenth signal over a second signal path capable of inducing errors into said tenth signal to produce an eleventh signal;

normalizing said fourth and eleventh signals relative to each other to produce a twelfth signal and a thirteenth signal, respectively; and compensating said twelfth and thirteenth signals for errors relative to said seventh signal.

10. A signal measurement method claimed in claim 9 wherein said fourth and eleventh signals are analog signals, and wherein:

said method additionally comprises, prior to said normalizing activity, converting said analog fourth and eleventh signals to a digital twelfth signal and a digital thirteenth signal, respectively; and said normalizing and compensating activities are executed digitally within a digital processor in response to said digital twelfth and thirteenth signals.

11. A signal measurement method as claimed in claim 1 additionally comprising:

providing a seventh signal at a first amplitude;

injecting an eighth signal at a second amplitude into a first port of a device-under-test, said eighth signal being derived from said seventh signal;

extracting a ninth signal from a second port of said device-under-test, wherein said ninth signal is responsive to said eighth signal and a transfer function of said device-under-test;

deriving said first signal at a third amplitude from said eighth signal;

deriving a tenth signal at a fourth amplitude from said ninth signal; and adjusting said third and fourth amplitudes to be within a predetermined amplitude ratio of each other.

12. A signal measurement method as claimed in claim 11 additionally comprising adjusting said first amplitude so that said second amplitude is at a predetermined amplitude at said first port of said device-under-test.

13. A signal measurement method as claimed in claim 1 additionally comprising:

providing a seventh signal;

deriving said first signal from said seventh signal;

deriving an eighth signal from said seventh signal;

analyzing said eighth signal to determine the presence of phase noise within said seventh signal; and compensating, when said analyzing activity determines said phase noise is present within said seventh signal, said phase noise within said third signal in response to said phase noise within said seventh signal.

14. A signal measurement method as claimed in claim 1 additionally comprising:

coupling a first probe to a first port of a device-under-test;

coupling a second probe to a second port of said device-under-test;

propagating a seventh signal from said first probe into said first port of said device-under-test;

propagating an eighth signal from said second port of said device-under-test into said second probe, said eighth signal being responsive to said seventh signal and a transfer function of said device-under-test;

deriving, within said first probe, said first signal from said seventh signal;

deriving, within said first probe, a ninth signal from said seventh signal;

deriving, within said second probe, a tenth signal from said eighth signal;

deriving, within said second probe, an eleventh signal from said eighth signal;

reciprocally propagating said ninth and eleventh signals from said first and second probes to said second and first probes, respectively, over a common signal path;

combining, within said first probe, said first and eleventh signals to produce said third signal;

combining, within said second probe, said tenth and ninth signals to produce a twelfth signal;

propagating said tenth signal over a second signal path capable of inducing errors into said tenth signal to produce an eleventh signal; and normalizing said fourth and eleventh signals relative to each other to produce a twelfth signal and a thirteenth signal, respectively.

15. A signal measurement method as claimed in claim 14 wherein:

said method additionally comprises interposing a reciprocal amplification circuit into said common signal path between said first and second probes;

said reciprocally propagating activity comprises:

propagating said ninth signal from said first probe to a first i/o port of said reciprocal amplification circuit;

amplifying said ninth signal within said reciprocal amplification circuit to produce a fourteenth signal;

propagating said fourteenth signal from a second i/o port of said reciprocal amplification circuit to said second probe;

propagating said eleventh signal from said second probe to said second i/o port of said reciprocal amplification circuit;

amplifying said eleventh signal within said reciprocal amplification circuit to produce a fifteenth signal;

propagating said fifteenth signal from said first i/o port of said reciprocal amplification circuit to said first probe; and said first-and-eleventh and tenth-and-ninth signal combining activities also combine said first and fifteenth signals and said tenth and fourteenth signals, respectively.

16. A signal measurement method as claimed in claim 1 wherein said signal path is a first signal path, and wherein:

said method additionally comprises providing a seventh signal at a third frequency and having a predetermined phase;

said method additionally comprises propagating said seventh signal over a second signal path, wherein said second signal path is a bidirectional signal path;

said method additionally comprises deriving an eighth signal from said seventh signal;

said first-and-second signal combining activity combines said first, second, and eighth signals to produce said third signal;

said method additionally comprises producing a ninth signal at a fourth frequency from said seventh signal;

said method additionally comprises propagating said ninth signal over said second signal path;

said method additionally comprises determining a phase of said ninth signal relative to said predetermined phase; and said method additionally comprises analyzing said second-signal phase to establish a phase reference for said third signal.

17. A signal measurement method as claimed in claim 1 wherein said signal path is a first signal path, said method additionally comprising:
   providing a seventh signal at a third frequency and having a predetermined phase;
   propagating said seventh signal in a first direction over a second signal path, said second signal path being a bidirectional signal path;
   producing an eighth signal at a fourth frequency from said seventh signal;
   propagating said eighth signal in a second direction over said second signal path, said second direction being opposite said first direction;
   determining a phase of said eighth signal relative to said predetermined phase; and
   analyzing said eighth-signal phase to establish a phase of said first signal.

18. A signal measurement system incorporating real-time error suppression, said system comprising:
   a signal source configured to generate a first signal at a first frequency, said first frequency being a frequency within a frequency band, all frequencies of which are within ten percent of a center frequency thereof;
   a first mixer coupled to said signal source and configured to offset said first signal to produce a second signal at a second frequency within said frequency band;
   a second mixer coupled to said signal source and configured to offset said first signal to produce a third signal at a third frequency within said frequency band;
   a combiner coupled to said first and second mixers and configured to combine said second and third signals to produce a fourth signal;
   a propagation medium coupled to said combiner and configured to propagate said fourth signal over a signal path to produce a fifth signal;
   a processor coupled to said propagation medium and configured to extract a replica of said second signal from said fifth signal.

19. A signal measurement system as claimed in claim 18 wherein said fifth signal is an analog signal, and wherein:
   said system additionally comprises an analog-to-digital converter coupled to said propagation medium and configured to convert said fifth signal into a sixth signal, said sixth signal being a digital signal; and
   said processor is coupled to said analog-to-digital converter and configured to separate said sixth signal into a seventh signal and an eighth signal, compare said eighth signal against said third signal to determine a correction factor, and apply said correction factor to said seventh signal to extract said replica of said second signal therefrom.

20. A signal measurement system as claimed in claim 18 wherein said combiner is a first combiner, said propagation medium is a first propagation medium, and said signal path is a first signal path, and wherein:
   said system additionally comprises a third mixer coupled to said signal source and configured to offset said first signal to produce a sixth signal at a fourth frequency within said frequency band;
   said system additionally comprises a fourth mixer coupled to said signal source and configured to offset said first signal to produce a seventh signal at a fifth frequency within said frequency band;
   said system additionally comprises a second combiner coupled to said third and fourth mixers and configured to combine said sixth and seventh signals to produce an eighth signal;
   said system additionally comprises a second propagation medium coupled to said second combiner and configured to propagate said eighth signal over a second signal path to produce a ninth signal;
   said processor is additionally configured to extract said sixth signal from said ninth signal.

21. A signal measurement system as claimed in claim 18 wherein:
   said system additionally comprises a coupler coupled to said signal source, coupled to said first mixer, and configured to extract a sixth signal at substantially said first frequency from said first signal;
   said system additionally comprises an oscillator coupled to said first mixer and configured to generate a seventh signal at a fourth frequency; and
   said first mixer is configured to mix said sixth and seventh signals to produce said second signal, wherein said second frequency is one of a sum and a difference of said first frequency and said fourth frequency.

22. A signal measurement system as claimed in claim 21 wherein said oscillator is a first oscillator, and wherein:
   said system additionally comprises a splitter coupled to said signal source, coupled to said second mixer, and configured to extract an eighth signal at substantially said first frequency from said first signal;
   said system additionally comprises a second oscillator coupled to said second mixer and configured to generate a ninth signal at a fifth frequency; and
   said second mixer is configured to mix said eighth and ninth signals to produce said third signal, wherein said third frequency is one of a sum and a difference of said first frequency and said fifth frequency.

23. A signal measurement system as claimed in claim 22 additionally comprising:
   a summer coupled to said first and second oscillators and configured to sum said seventh and ninth signals to produce a tenth signal, said tenth signal being an analog signal;
   an analog-to-digital converter coupled to said summer and configured to convert said tenth signal to an eleventh signal, said eleventh signal being a digital signal; and
   said processor is additionally configured to utilize said eleventh signal to extract said replica of said second signal from said fifth signal.

24. A signal measurement system as claimed in claim 18 wherein said combiner is a first combiner and said signal path is a first signal path, wherein:
   said system additionally comprises a third mixer coupled to said signal source and configured to offset said first signal to produce a sixth signal at a fourth frequency within said frequency band;
   said system additionally comprises a fourth mixer coupled to said signal source and configured to offset said first signal to produce a seventh signal at a fifth frequency within said frequency band;
   said system additionally comprises a second combiner coupled to said third and fourth mixers and configured to combine said sixth and seventh signals to produce an eighth signal;

said propagation medium is additionally configured to propagate said eighth signal over a second signal path to produce a ninth signal; and said processor is additionally configured to normalize said fifth and ninth signals relative to each other, and to compensate said fifth and ninth signals for errors relative to said first signal.

25. A signal measurement system as claimed in claim 24 wherein:

said fifth and ninth signals are analog signals;

said system additionally comprises a first analog-to-digital converter coupled to said propagation medium and configured to convert said fifth signal into a tenth signal, said tenth signal being a digital signal;

said system additionally comprises a second analog-to-digital converter coupled to said propagation medium and configured to convert said ninth signal into an eleventh signal, said eleventh signal being a digital signal; and said processor is configured to normalize said tenth and eleventh signals relative to each other, and to compensate said tenth and eleventh signals for errors relative to said first signal.

26. A signal measurement system as claimed in claim 18 wherein:

said signal source generates said first signal at a first amplitude;

said system additionally comprises a device-under-test having a first port and a second port;

said system additionally comprises an input circuit coupled to said signal source, coupled to said device-under-test, configured to derive a sixth signal from said first signal, and configured to inject said sixth signal at a second amplitude into said first port;

said system additionally comprises an output circuit coupled to said device-under-test and configured to extract a seventh signal from said second port, wherein said seventh signal is responsive to said sixth signal and a transfer function of said device-under test;

said first mixer is coupled to said input circuit and configured to offset said sixth signal to produce said second signal at a third amplitude;

said system additionally comprises a third mixer coupled to said output circuit and configured to offset said seventh signal to produce an eighth signal at a fourth amplitude;

said system additionally comprises a first amplifier coupled to said first mixer configured to amplify said second signal and having a first gain controlled by said processor;

said system additionally comprises a second amplifier coupled to said third mixer and configured to amplify said eighth signal and having a second gain controlled by said processor; and said processor is additionally configured to control said first and second gains so that said third and fourth amplitudes are within a predetermined amplitude ratio of each other.

27. A signal measurement system as claimed in claim 26 additionally comprising a source-control circuit coupled to said signal source and configured to establish said first amplitude for said first signal, wherein said second amplitude is a predetermined amplitude, and wherein said processor is additionally configured to adjust said first amplitude so that said ninth signal is at said predetermined amplitude at said first port of said device-under-test.

28. A signal measurement system as claimed in claim 18 wherein:

said system additionally comprises a third mixer coupled to said signal source and configured to offset said first signal to produce a sixth signal; and said processor is additionally configured to analyze said sixth signal to detect the presence of phase noise within said first signal, and to compensate said fifth signal in response to said phase noise within said first signal.

29. A signal measurement system as claimed in claim 18 wherein said propagation medium is a first propagation medium and said signal path is a first signal path, and wherein:

said system additionally comprises a first probe for coupling to a first port of a device-under-test;

said system additionally comprises a second probe for coupling to a second port of said device-under-test;

said system additionally comprises a third mixer coupled to said signal source and configured to offset said first signal to produce a sixth signal;

said system additionally comprises a fourth mixer coupled to said signal source through said device-under-test and configured to offset said first signal to produce a seventh signal;

said system additionally comprises a fifth mixer coupled to said signal source through said device-under-test and configured to offset said first signal to produce an eighth signal; and said system additionally comprises a second propagation medium coupled between said first and second probes and configured to propagate said sixth and eighth signals from said first and second probes to said second and first probes, respectively, over a second signal path.

30. A signal measurement system as claimed in claim 29 wherein said combiner is a first combiner, and wherein:

said first combiner is configured to combine said second, third, and sixth signals to produce said fourth signal; and said system additionally comprises a second combiner coupled to said fourth mixer and configured to combine said seventh and eighth signals to produce a ninth signal.

31. A signal measurement system as claimed in claim 29 additionally comprising a reciprocal amplification circuit interposed into said second signal path between said first and second probes.

32. A signal measurement method incorporating real-time error suppression through signal normalization, said method comprising:

a) providing a first signal at a first frequency;

b) deriving a second signal at a second frequency from said first signal;

c) deriving a third signal at a third frequency from said first signal;

d) combining said second and third signals to produce a fourth signal;

e) deriving a fifth signal at a fourth frequency from said first signal;

f) deriving a sixth signal at a fifth frequency from said first signal;

g) combining said fifth and sixth signals to produce a seventh signal;

h) propagating said fourth and seventh signals through a first signal path and a second signal path, respectively, in a propagation medium;

i) normalizing said fourth and seventh signals relative to each other to produce an eighth signal and a ninth signal, respectively; and j) compensating said eighth and ninth signals for errors relative to said first signal.

33. A method as claimed in claim 32 wherein said first signal has a predetermined phase, said method additionally comprising:

providing an analysis unit;

coupling a probe to said analysis unit;

deriving, within said analysis unit, a tenth signal from said first signal;

propagating said tenth signal from said analysis unit to said probe via a third signal path, wherein said third signal path is a bidirectional signal path;

deriving, within said probe, an eleventh signal from said tenth signal;

propagating said eleventh signal from said probe to said analysis unit via said third signal path; and determining, within said analysis unit, a phase of said eleventh signal relative to said predetermined phase.

34. A method as claimed in claim 32 additionally comprising:

deriving a tenth signal from said first signal;

analyzing said tenth signal to determine the presence of phase noise within said first signal; and canceling, when said analyzing activity determines said phase noise is present within said first signal, said phase noise within one of said fourth and seventh signals in response to said phase noise within said first signal.

35. A method as claimed in claim 32 additionally comprising:

coupling a device-under-test between a first probe and a second probe;

propagating said first signal from said first probe to said second probe through said device-under-test;

deriving, within said first probe, a tenth signal from said first signal;

deriving, within said second probe, an eleventh signal from said first signal;

deriving, within said second probe, a twelfth signal from said first signal;

reciprocally propagating said tenth and twelfth signals from said first and second probes to said second and first probes, respectively, over a common signal path;

combining, within said first probe, said second and twelfth signals; and combining, within said second probe, said eleventh and tenth signals.

36. A method for signal measurement through a device-under-test, said method comprising:

a) providing a first signal at a first amplitude;

b) injecting a second signal at a second amplitude into a first port of said device-under-test, said second signal being derived from said first signal;

c) extracting a third signal from a second port of said device-under-test, wherein said third signal is responsive to said second signal and a transfer function of said device-under-test;

d) deriving a fourth signal at a third amplitude from said second signal;

e) deriving a fifth signal at a fourth amplitude from said second signal;

f) deriving a sixth signal at a fifth amplitude from said third signal;

g) deriving a seventh signal at a sixth amplitude from said third signal; and h) adjusting each of said third, fourth, fifth, and sixth amplitudes to be within a predetermined amplitude ratio of each other.

37. A method as claimed in claim 36 additionally comprising:

providing an analysis unit;

coupling a probe to said analysis unit;

providing, within said analysis unit, an eighth signal having a predetermined phase;

propagating said eighth signal from said analysis unit to said probe via a bidirectional signal path;

producing, within said probe, a ninth signal from said eighth signal;

propagating said ninth signal from said probe to said analysis unit via said bidirectional signal path;

determining a phase of said ninth signal relative to said predetermined phase; and analyzing said ninth-signal phase to establish a phase reference for said fourth signal.

38. A method as claimed in claim 36 additionally comprising adjusting said first amplitude so that said second amplitude is a predetermined amplitude at said first port of said device-under-test.

39. A method as claimed in claim 36 additionally comprising:

coupling a first probe to said first port of a device-under-test;

coupling a second probe to said second port of said device-under-test;

deriving an eighth signal from said third signal in said second probe;

deriving a ninth signal from said first signal in said first probe;

deriving a tenth signal from said first signal in said second probe;

reciprocally propagating said ninth and tenth signals from said first and second probes to said second and first probes, respectively, over a common signal path;

incorporating said tenth signal into said fourth signal; and incorporating said ninth signal into said eighth signal.

40. An apparatus incorporating real-time error suppression with improved accuracy in the measurement of a test signal through a device-under-test, said apparatus comprising:

an analysis unit;

a first probe coupled to said analysis unit and to a first port of said device-under-test;

a second probe coupled to said analysis unit and to a second port of said device-under-test; and a trans-probe channel coupled between said first and second probes, wherein said trans-probe channel is configured to propagate a first link signal from said first probe to said second probe and propagate a second link signal from said second probe to said first probe.

41. An apparatus as claimed in claim 40 wherein said first link signal is seventh signal, wherein said second link signal is a seventh signal, and wherein:

said analysis unit comprises a signal source coupled to said first and second probes and configured to generate a first signal;

said first probe comprises:
  an input circuit coupled to said signal source, and configured to extract a second signal from said first signal and to propagate said second signal from said first probe into said first port;
  a first mixer coupled to said input circuit and configured to produce a fourth signal from said second signal;
  a second mixer coupled to said signal source and configured to produce said fifth signal from said first signal; and
  a first combiner coupled to said first mixer and configured to combine said fourth signal and said seventh signal to produce an eighth signal;
said second probe comprises:
  an output circuit configured to obtain a third signal from said second port, said third signal being responsive to said second signal and a transfer function of said device-under-test;
  a third mixer coupled to said output circuit and configured to produce a sixth signal from said third signal;
  a fourth mixer coupled to said signal source and configured to produce said seventh signal from said first signal; and
  a second combiner coupled to said third mixer and configured to combine said sixth signal and said fifth signal to produce a ninth signal; and
said trans-probe channel is configured to reciprocally propagate said fifth and seventh signals from said first and second probes to said second and first probes, respectively, over a common signal path.

42. An apparatus as claimed in claim 41 wherein:
said first signal is at a first frequency;
said second signal is at substantially said first frequency;
said third signal is at substantially said first frequency;
said fourth signal is at a second frequency;
said fifth signal is at a third frequency;
said sixth signal is at a fourth frequency;
said seventh signal is at a fifth frequency; and
said first, second, third, fourth, and fifth frequencies are different frequencies within a frequency band, each frequency of which is within ten percent of a center frequency thereof.

43. An apparatus as claimed in claim 41 wherein:
said first probe additionally comprises:
  a coupler coupled to said input circuit and configured to extract a tenth signal from said second signal;
  an oscillator configured to provide an eleventh signal; and
  a fifth mixer coupled to said coupler and said oscillator and configured to mix said tenth and eleventh signals to generate said fourth signal; and
said second probe additionally comprises:
  a coupler coupled to said output circuit and configured to extract a twelfth signal from said third signal;
  an oscillator configured to provide a thirteenth signal; and
  said third mixer couples to said coupler and said oscillator and is configured to mix said twelfth and thirteenth signals to generate said sixth signal.

44. An apparatus as claimed in claim 41 wherein said trans-probe channel is a first channel and said common signal path is a first signal path, wherein:
  a second channel is coupled between said analysis unit and said first probe and configured to propagate said first signal from said analysis unit to said first probe. over a second signal path within said second channel; and
  a third channel is coupled between said analysis unit and said second probe and configured to propagate said first signal from said analysis unit to said second probe over a third signal path within said third channel.

45. An apparatus as claimed in claim 40 wherein said trans-probe channel comprises:
  a common signal path between said first probe and said second probe; and
  a reciprocal amplification circuit interposed within said common signal path, configured to amplify said first link signal as said first link signal is propagated from said first probe to said second probe over said common signal path, and configured to amplify said second link signal as said second link signal is propagated from said second probe to said first probe over said common signal path.

46. An apparatus as claimed in claim 45 wherein said reciprocal amplification circuit comprises:
  a first signal-routing device coupled between said first and second probes and interposed within said common signal path so as to divide said common signal path into a first portion and a second portion thereof;
  a second signal-routing device coupled to said first signal-routing device; and
  an amplifier coupled to said second signal routing device.

* * * * *

UNITED STATES PATENT AND TRADEMARK OFFICE
CERTIFICATE OF CORRECTION

PATENT NO. : 6,606,583 B1
DATED : August 12, 2003
INVENTOR(S) : Sternberg et al.

It is certified that error appears in the above-identified patent and that said Letters Patent is hereby corrected as shown below:

Column 10,
Line 39, delete "IncJJ" and insert -- Inc11 --.

Column 11,
Line 34, delete "Ljnc11" and insert -- LInc11 --.

Column 12,
Line 65, delete "500" and insert -- 50• --.
Line 66, delete "FIG.. 2" and insert -- FIG. 2 --.

Column 13,
Line 18, delete "SRef13" and insert -- SRefV13 --.
Line 67, delete "Oinc11, ODat11, OCom11" and insert -- OInc11, ODat11, OComL11 --.

Column 14,
Line 17, delete "Lnc13, LDat13, LComL13, LCOMF13," and insert
-- LInc13, LDat13, LComL13, LComF13, --.
Lines 29 and 34, delete "though" and insert -- through --.
Line 42, delete "Tx,11," and insert -- Tx11 --.
Line 43, delete "RefV11," and insert -- Refv11 --.

Column 15,
Line 18, delete "InC13" and insert -- Inc13 --.
Line 29, delete "InC22" and insert -- Inc22 --.

Column 16,
Line 25, delete "InC23" and insert -- Inc23 --.

Column 17,
Line 6, delete "LCOMF11" and insert -- LComF11 --.
Line 67, delete "fo•fa" and insert -- fo•fa --.

Column 19,
Line 27, delete "LInC1J" and insert -- LInc1J --.
Lines 55-56, delete "[SRefF], [SRefV], [SLink1], [SDat1], [SInc1] (FIG. 3)2, and [TX2]" and insert -- [SRefF1], [SReV1}, [SLink1], [SDat1], [SInc1] (Fig. 3), and [STx2] --.

Column 20,
Line 46, delete "LCom22" and insert -- LComL22 --.

UNITED STATES PATENT AND TRADEMARK OFFICE
CERTIFICATE OF CORRECTION

PATENT NO. : 6,606,583 B1
DATED : August 12, 2003
INVENTOR(S) : Sternberg et al.

It is certified that error appears in the above-identified patent and that said Letters Patent is hereby corrected as shown below:

Column 21,
Line 67, delete "InC23" and insert -- Inc23 --.

Column 22,
Line 16, delete "InC23" and insert -- Inc23 --.
Line 16, delete "though" and insert -- through --.
Line 20, delete "LInC11" and insert -- LInc11 --.
Lines 25 and 37, delete "In23" and insert -- Inc23 --.

Column 23,
Line 4, delete "LInCPJ" and insert -- LIncPJ --.
Line 67, delete "LInC13" and insert -- LInc13 --.

Column 24,
Lines 30 and 37, delete "DSUM33" and insert -- DSum33 --.

Column 29,
Line 61, delete "MDat11=ASTTX1S11MPODat11exp(-<ALDat11)TDat1GDat1" and insert -- MDat11=ASTTx1S11MPODat11exp(-j<ALDat11)TDat1GDat1• --.

Column 30,
Line 16, delete "MDat23 ASTx1S22MPODat22exp(-j<ALDat22)TDat2GDat2" and insert -- MDat23 ASTx1S21MPODat22exp(-j<ALDat22)TDat2GDat2 --.

Signed and Sealed this

Fourteenth Day of February, 2006

JON W. DUDAS
*Director of the United States Patent and Trademark Office*